(12) United States Patent
Park et al.

(10) Patent No.: US 8,445,379 B2
(45) Date of Patent: May 21, 2013

(54) METHOD OF MANUFACTURING SEMICONDUCTOR DEVICE

(75) Inventors: Jong-chul Park, Hwaseong-si (KR);
Sang-sup Jeong, Suwon-si (KR);
Bok-yeon Won, Gunpo-si (KR)

(73) Assignee: Samsung Electronics Co., Ltd.,
Samsung-ro, Yeongtong-gu, Suwon-si, Gyeonggi-do (KR)

( * ) Notice: Subject to any disclaimer, the term of this patent is extended or adjusted under 35 U.S.C. 154(b) by 41 days.

(21) Appl. No.: 13/271,535

(22) Filed: Oct. 12, 2011

(65) Prior Publication Data

US 2012/0135601 A1    May 31, 2012

(30) Foreign Application Priority Data

Nov. 25, 2010 (KR) .................. 10-2010-0118102

(51) Int. Cl.
*H01L 21/44* (2006.01)
(52) U.S. Cl.
USPC .................................. 438/671; 257/E21.035
(58) Field of Classification Search
USPC ........... 438/671, 717, 736, 946; 257/E21.035
See application file for complete search history.

(56) References Cited

U.S. PATENT DOCUMENTS 7,776,750 B2 *  8/2010  Kim .............................. 438/703

FOREIGN PATENT DOCUMENTS

| JP | 2009-049420 | 3/2009 |
|---|---|---|
| KR | 10-0215847 | 8/1999 |
| KR | 10-2009-0049524 A | 5/2009 |
| KR | 10-2010-0045400 A | 5/2010 |

* cited by examiner

*Primary Examiner* — Quoc Hoang
(74) *Attorney, Agent, or Firm* — Muir Patent Consulting, PLLC

(57) ABSTRACT

A method of manufacturing a semiconductor device including a plurality of hole patterns is disclosed. The method includes: forming a plurality of first line patterns and a plurality of first space patterns extending in a first direction; forming a plurality of second line patterns and a plurality of second space patterns extending in a second direction, on the plurality of first line patterns and the plurality of first space patterns; forming a plurality of first hole patterns where the plurality of first space patterns and the plurality of second space patterns cross each other; and forming a plurality of second hole patterns where the plurality of first line patterns and the plurality of second line patterns cross each other.

20 Claims, 51 Drawing Sheets

METHOD OF MANUFACTURING SEMICONDUCTOR DEVICE

CROSS-REFERENCE TO RELATED APPLICATIONS

This application claims the benefit of priority to Korean Patent Application No. 10-2010-0118102, filed on Nov. 25, 2010, in the Korean Intellectual Property Office, the disclosure of which is incorporated herein in its entirety by reference.

BACKGROUND

The disclosed embodiments relate to a method of manufacturing a semiconductor device, and more particularly, to a method of manufacturing a semiconductor device having a plurality of hole patterns.

As a degree of integration of a semiconductor device increases, the design rule of components of the semiconductor device is decreased. Accordingly, there are several issues involved during a method of manufacturing a minute semiconductor device.

SUMMARY

The disclosed embodiments provide a method of manufacturing a semiconductor device, which effectively forms a semiconductor device having a plurality of hole patterns.

According to one embodiment, there is provided a method of manufacturing a semiconductor device, the method comprising: forming a plurality of first line patterns and a plurality of first space patterns extending in a first direction; forming a plurality of second line patterns and a plurality of second space patterns extending in a second direction, on the plurality of first line patterns and the plurality of first space patterns; forming a plurality of first hole patterns where the plurality of first space patterns and the plurality of second space patterns cross each other; and forming a plurality of second hole patterns where the plurality of first line patterns and the plurality of second line patterns cross each other.

The first and second directions may be not parallel to each other.

The first and second directions may be perpendicular to each other.

The plurality of first line patterns and the plurality of first space patterns may be alternately disposed and each line pattern of the plurality of first line patterns may be immediately adjacent to a space pattern of the plurality of first space patterns, and the plurality of first line patterns and the plurality of first space patterns may be connected as continuous steps, wherein the plurality of first line patterns may be higher than the plurality of first space patterns.

The plurality of second line patterns and the plurality of second space patterns may be alternately disposed and each line pattern of the plurality of first line patterns may be immediately adjacent to a space pattern of the plurality of first space patterns, and the plurality of second line patterns and the plurality of second space patterns may be connected as continuous steps, wherein the plurality of second line patterns may be higher than the plurality of second space patterns.

The forming of the plurality of first line patterns and the plurality of first space patterns may comprise: sequentially stacking a first material layer, a second material layer having a different etching rate from the first material layer, a third material layer having a different etching rate from the second material layer, a fourth material layer having a different etching rate from the third material layer, and a fifth material layer having a different etching rate from the fourth material layer; forming a pattern of the fifth material layer by removing portions corresponding to the plurality of first space patterns from the fifth material layer; and forming a pattern of the fourth material layer by removing part of thickness of the fourth material layer that is exposed by the pattern of the fifth material layer.

The forming of the plurality of second line patterns and the plurality of second space patterns may comprises: forming a sixth material layer that fills all of the plurality of first space patterns, covers all of the plurality of first line patterns, and has a different etching rate from the fifth material layer; forming a seventh material layer having a different etching rate from the sixth material layer on the sixth material layer; forming a pattern of the seventh material layer by removing portions corresponding to the plurality of second space patterns from the seventh material layer; and forming a pattern of the sixth material layer by removing the sixth material layer that is exposed by the pattern of the seventh material layer.

The forming of the pattern of the sixth material layer may comprise forming a second pattern of the fourth material layer by removing portions exposed by the pattern of the fifth material layer from the pattern of the fourth material layer.

The forming of the plurality of first hole patterns may comprise: forming a second pattern of the fifth material layer by removing portions corresponding to the plurality of second space patterns from the pattern of the fifth material layer; forming a pattern of the third material layer by removing the third material layer that is exposed by the second pattern of the fourth material layer; and forming a third pattern of the fourth material layer by removing the second pattern of the fourth material layer exposed by the second pattern of the fifth material layer.

The forming of the plurality of second hole patterns may comprise: filling a pattern of an eighth material layer in portions corresponding to the plurality of first and second space patterns; removing the second pattern of the fifth material layer; removing the third pattern of the fourth material layer; and forming a second pattern of the third material layer by removing the pattern of the third material layer exposed by the pattern of the eighth material layer.

The forming of the plurality of second hole patterns may comprise: forming a third pattern of the third material layer by removing part of a thickness of the pattern of the third material layer exposed by the third pattern of the fourth material layer; removing the third pattern of the fourth material layer; covering the second material layer and the third pattern of the third material layer with a ninth material layer, and forming a pattern of the ninth material layer by planarizing the ninth material layer until an upper surface of the third pattern of the third material layer is exposed; and forming a fourth pattern of the third material layer by removing the third pattern of the third material layer exposed by the pattern of the ninth material layer.

The second material layer may comprise polysilicon, a third material layer may comprise silicon oxide ($SiO_2$), the fourth material layer may comprise an amorphous carbon layer (ACL), and the fifth material layer may comprise silicon oxynitride (SiON).

Each line pattern of the plurality of first line patterns may be spaced a distance of D from the next adjacent line pattern, each line pattern of the plurality of second line patterns may be spaced a distance of D from the next adjacent line pattern, and a center of each hole may be spaced a distance less than D away from a center of the closest adjacent hole.

In another embodiment, a method of manufacturing a semiconductor device is disclosed. The method includes sequentially forming a first hard mask layer, a second hard mask layer, and a sacrificial layer; forming a plurality of first space patterns that extend in a first direction on the sacrificial layer, and is are repeatedly disposed separately spaced apart from each other; forming a plurality of second space patterns that extend in a second direction on the plurality of first space patterns, and is are repeatedly disposed separately spaced apart from each other, wherein the second direction is not parallel to the first direction; forming a plurality of first hole patterns penetrating through the second hard mask layer and the first hard mask layer, correspondingly to portions where the plurality of first space patterns and the plurality of second space patterns cross each other; and forming a plurality of second hole patterns penetrating through the second hard mask layer and the first hard mask layer, correspondingly to portions where none of the plurality of first space patterns and the plurality of second space patterns are disposed.

In another embodiment, a method of manufacturing a semiconductor device is disclosed. The method comprises forming a plurality of material layers; forming a first space pattern in a first layer of the material layers, the first space pattern including a plurality of consecutive spaces, each space extending in first direction; forming a second space pattern in a second layer of the material layers, the second space pattern including a plurality of consecutive spaces, each space extending in second direction different from the first direction; forming a first plurality of holes in at least a third layer of the plurality of material layers at locations where spaces of the first space pattern cross spaces of the second space pattern; and forming a second plurality of holes in at least the third layer at locations where areas between spaces of the first space pattern cross areas between spaces of the second space pattern.

The method may include using a first mask pattern to form the first space pattern and to form a first line pattern, wherein lines of the first line pattern occupy areas between spaces of the first space pattern; and using a second mask pattern to form the second space pattern and to form a second line pattern, wherein lines of the second line pattern occupy areas between spaces of the second space pattern.

The method may further comprising filling the first plurality of holes and second plurality of holes with a conductive material.

Each hole of the first plurality of holes may be in closer proximity to a hole of the second plurality of holes than it is to a space adjacent to the space to which its location coincides.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1A:
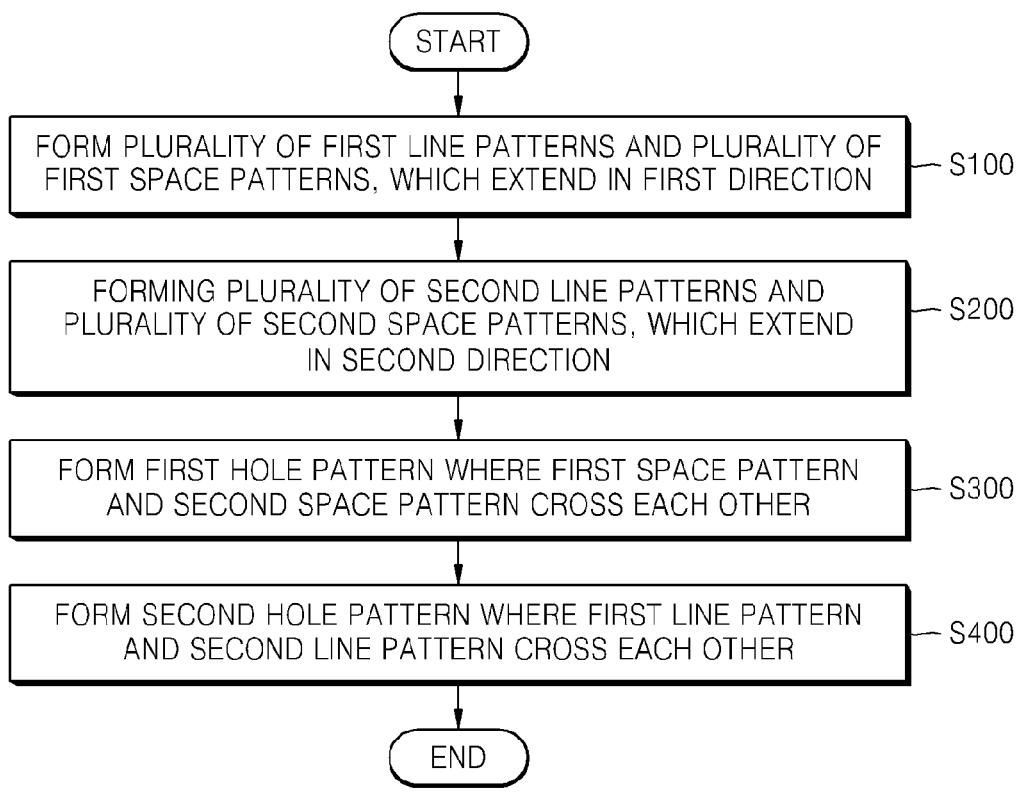
FIG. 1A is a flowchart illustrating a method of manufacturing a semiconductor device, according to one exemplary embodiment.

Hereinafter, the exemplary embodiments will be described in detail with reference to the attached drawings.

The embodiments may, however, have many different forms and should not be construed as being limited to those set forth herein. In the drawings, the sizes and thicknesses of layers and regions are exaggerated for clarity.

It will be understood that when an element, such as a layer, a region, or a substrate, is referred to as being "on", "adjacent to", "connected to", or "coupled to" another element, it may be directly on, adjacent to, connected to, or coupled to the other element or intervening elements may be present. In contrast, when an element is referred to as being "directly on", "directly connected to" or "directly coupled to" another element, or "contacting" another element, there are no intervening elements present. Like reference numerals refer to like elements throughout. As used herein, the term "and/or" includes any and all combinations of one or more of the associated listed items.

The terms "first," "second," and the like are used to describe various members, elements, regions, layers and/or parts, but these members, elements, regions, layers and/or parts are not limited by these terms. Unless indicated otherwise, these terms are used only to distinguish one member, element, region, layer, or part from another member, element, region, layer, or part. Accordingly, a first member, element, region, layer, or part may denote a second member, element, region, layer, or part without deviating from the scope of the inventive concept.

Also, relative terms such as "top" or "upper" and "bottom" or "lower" may be used herein to describe a relationship between elements as illustrated in drawings. The relative terms may include other directions in additional to a direction shown in the drawings. For example, when a device is turned over in the drawings, elements that are described to exist on upper surfaces of other elements now exist on lower surfaces of the other elements. Accordingly, the term "upper" used as the example may include "lower" and "upper" directions based on a certain direction of the drawings. If a device faces another direction (90° rotation), the relative terms may be interpreted accordingly.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

The terms used herein are to describe embodiments of the disclosure, and not to limit the scope of the inventive concept. As used herein, unless clearly defined otherwise, a singular form may include a plural form. Also, the terms "comprise" and/or "comprising" specify existence of mentioned shapes, numbers, steps, operations, members, elements and/or groups, but do not exclude existence or addition of one or more other shapes, numbers, steps, operations, members, elements and/or groups.

Figure 2A:
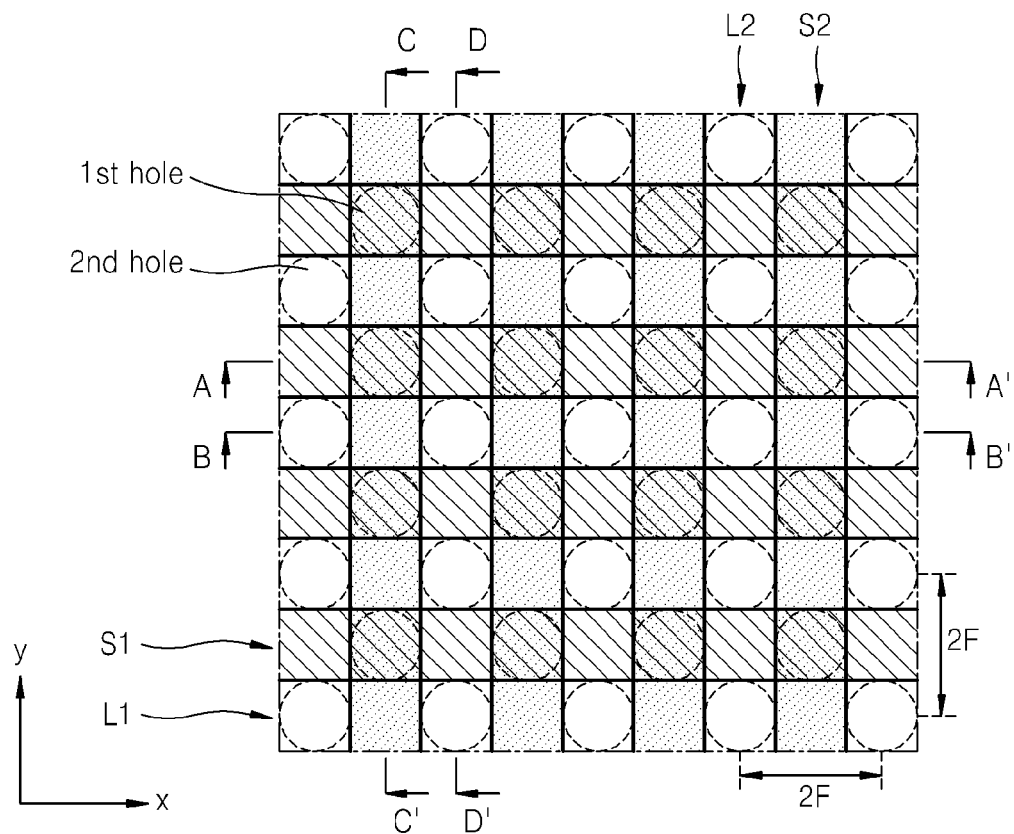
FIG. 2A is a plan view of a semiconductor device manufactured according to a method of manufacturing a semiconductor device, according to one exemplary embodiment.

FIG. 1A is a flowchart illustrating a method of manufacturing a semiconductor device, according to one exemplary embodiment, and FIG. 2A is a plan view of a semiconductor device manufactured according to the method.

Referring to FIGS. 1A and 2A, the method includes forming a plurality of first line patterns L1 and a plurality of first space patterns S1, which extend in a first direction (operation S100), forming a plurality of second line patterns L2 and a plurality of second space patterns S2, which extend in a second direction (operation S200), forming a first hole pattern $1^{ST}$ HOLE where the first space pattern S1 and the second space pattern S2 cross each other (operation S300), and forming a second hole pattern $2^{ND}$ HOLE where the first line pattern L1 and the second line pattern L2 cross each other (operation S400). As used herein, a "line pattern" may refer to a single line or a plurality of lines formed in one or more layers, and though depicted as including straight lines, the line patterns are not limited as such. Similarly, a "space pattern" may refer to a single space or a plurality of spaces formed in one or more layers, and though depicted as including straight space patterns, the space patterns are not limited as such. In addition, a "hole pattern" may refer to a single hole, or a plurality of holes that together form a pattern of holes.

The first and second directions are not parallel to each other, and for example, may be perpendicular to each other. However, an angle of the first and second directions is not limited to a right angle, and the first and second directions may form a predetermined angle and be unparallel to each other.

The first line patterns L1 and the first space patterns S1 are alternately disposed while contacting each other (e.g., each line pattern of the plurality of first line patterns may be immediately adjacent to a space pattern of the plurality of first space patterns), and are connected as continuous steps, wherein the first line pattern L1 is higher than the first space pattern S1.

Also, the second line patterns L2 and second space patterns S2 are alternately disposed while contacting each other (e.g., each line pattern of the plurality of second line patterns may be immediately adjacent to a space pattern of the plurality of second space patterns), and are connected as continuous steps, wherein the second line pattern L2 is higher than the second space pattern S2. The line patterns may include, for example, a metal or other conductive material, which may be disposed at a vertical level different from (e.g., higher than) the top surface of the space patterns.

Operations S100, S200, S300, and S400 are described in detail.

First, operation S100 is described.

Figure 1B:
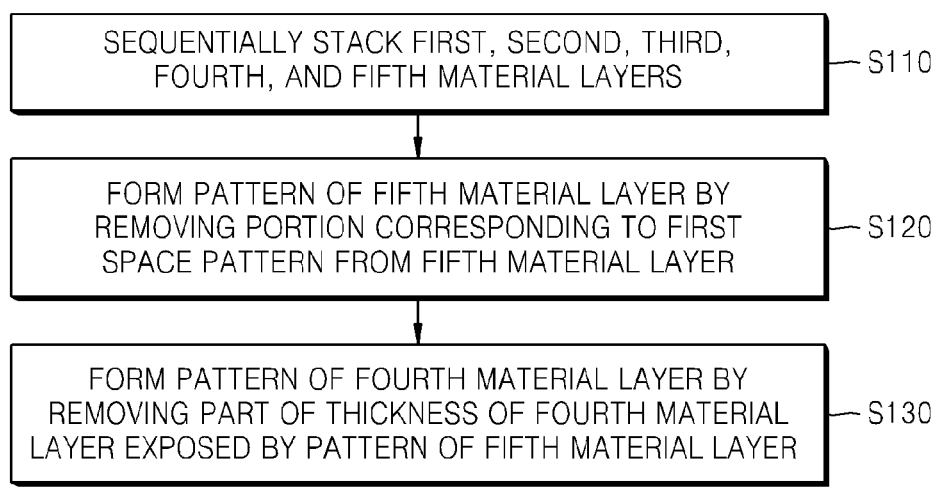
FIG. 1B is a flowchart illustrating exemplary processes of forming of a first line pattern and a first space pattern of the method of FIG. 1A.
Figure 2B:
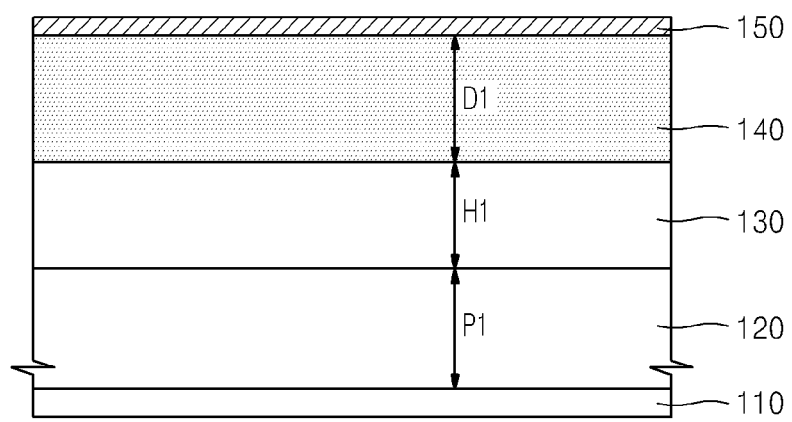
FIG. 2B is a cross-sectional view of an initial stacked structure on which a method of manufacturing a semiconductor device is to be performed, according to one exemplary embodiment.

FIG. 1B is a flowchart illustrating processes of operation S100 of FIG. 1A, and FIG. 2B is a cross-sectional view of an initial stacked structure 100 on which the method is to be performed. Also, FIG. 3 is a plan view for describing operation S100, and FIGS. 3A, 3B, and 3C are cross-sectional views respectively taken along lines A-A', B-B', and C-C'.

Figure 3:
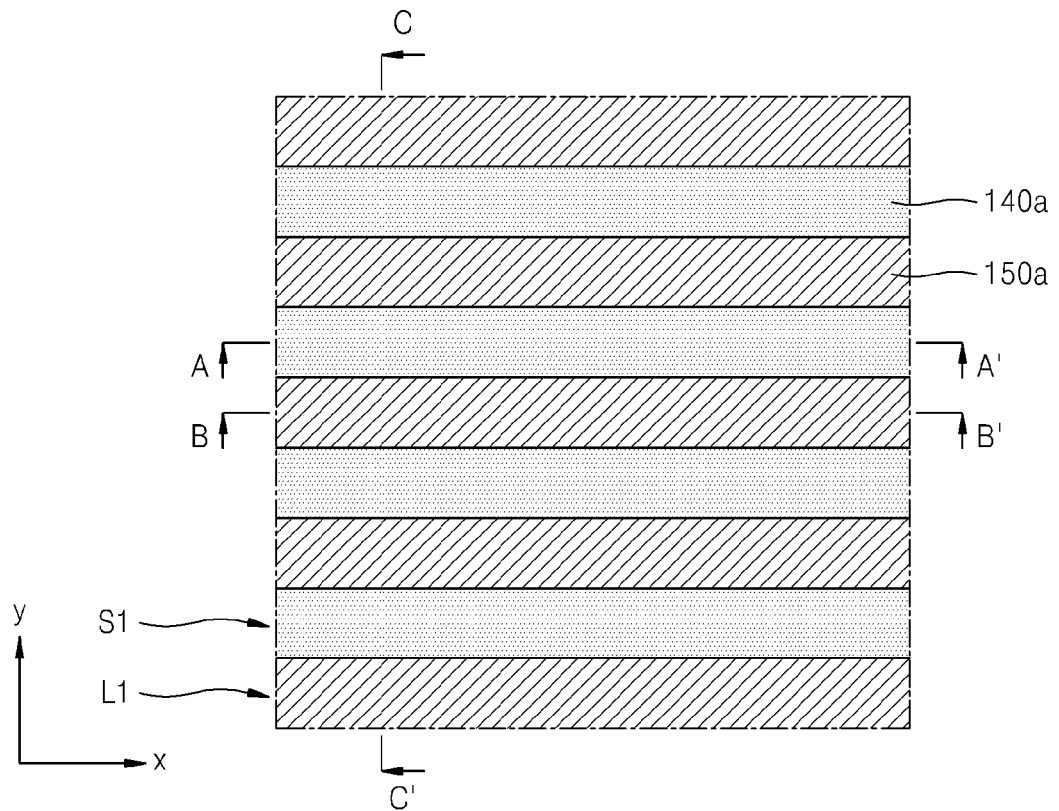
FIG. 3 is a plan view for describing forming of a plurality of first line patterns and a plurality of first space patterns, according to one exemplary embodiment.
Figure 3A:
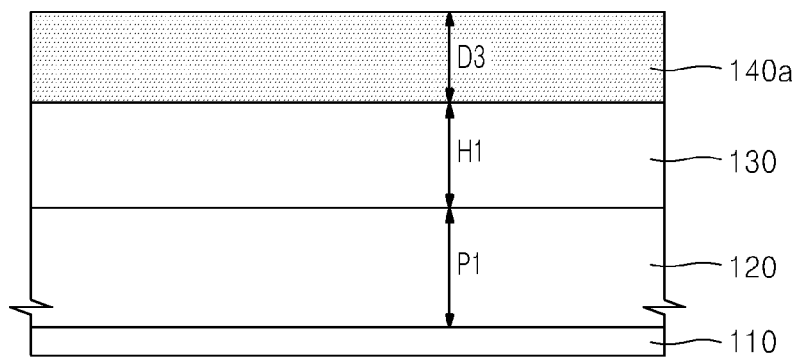
FIGS. 3A, 4A, 5A, 6A, 7A, 8A, 9A, 10A, 11A, 12A, 13A, 14A, and 15A are exemplary cross-sectional views taken along a line A-A' respectively of FIGS. 3, 4, 5, 6, 7, 8, 9, 10, 11, 12, 13, 14, and 15.
Figure 3B:
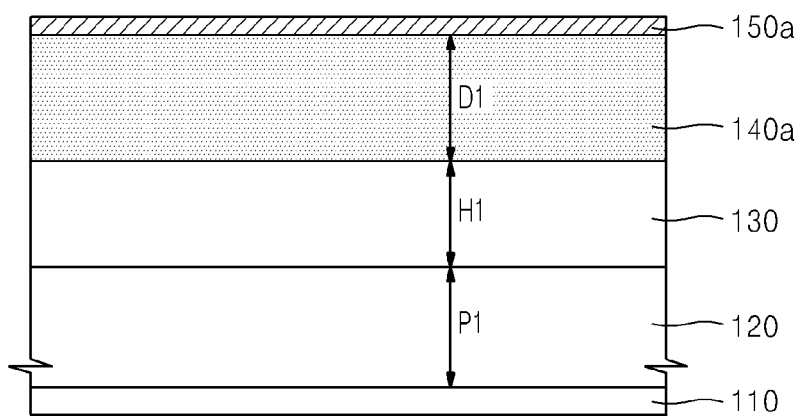
FIGS. 3B, 4B, 5B, 6B, 7B, 8B, 9B, 10B, 11B, 12B, 13B, 14B, and 15B are exemplary cross-sectional views taken along a line B-B' respectively of FIGS. 3, 4, 5, 6, 7, 8, 9, 10, 11, 12, 13, 14, and 15.
Figure 3C:
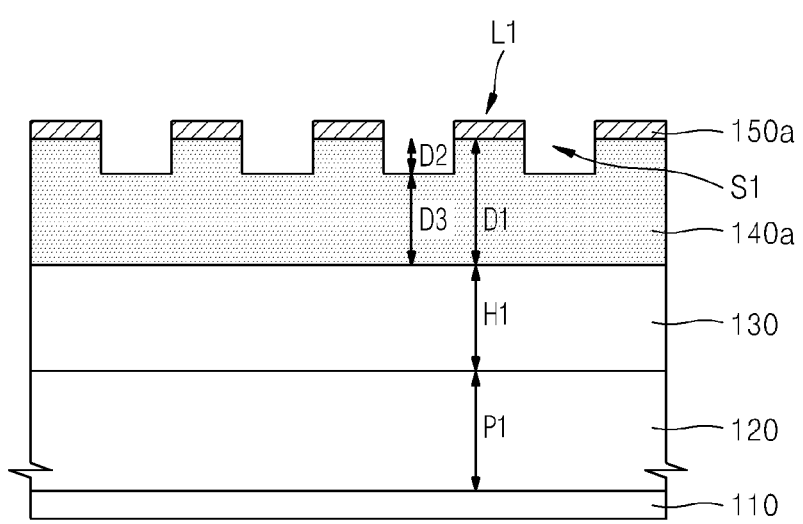
FIGS. 3C, 4C, 5C, 6C, 7C, 8C, 9C, 10C, 11C, 12C, 13C, 14C, and 15C are cross-sectional views taken along a line C-C' respectively of FIGS. 3, 4, 5, 6, 7, 8, 9, 10, 11, 12, 13, 14, and 15.

Referring to FIGS. 1B, 2B, 3, 3A, 3B, and 3C, operation S100, involving the forming of the first line patterns L1 and the first space patterns S1, which extend in the first direction, for example, an X-direction in FIG. 3, includes sequentially stacking a first material layer 110, a second material layer 120 having a different etching rate from the first material layer 110 on the first material layer 110, a third material layer 130 having a different etching rate from the second material layer 120 on the second material layer 120, a fourth material layer 140 having a different etching rate from the third material layer 130 on the third material layer 130, and a fifth material layer 150 having a different etching rate from the fourth material layer 140 on the fourth material layer 140 (operation S110), forming a pattern 150a on the fifth material layer 150 by removing portions corresponding to the first space pattern S1 from the fifth material layer 150 (operation S120), and forming a pattern 140a on the fourth material layer 140 by removing a part D2 of a thickness D1 of the fourth material layer 140 that is exposed by the pattern 150a on the fifth material layer 150 (operation S130).

The initial stacked structure 100 of FIG. 2B is formed via operation S110.

For example, the second material layer 120 may include polysilicon or silicon nitride, the third material layer 130 may include silicon oxide (SiO2), the fourth material layer 140 may include an amorphous carbon layer (ACL), and the fifth material layer 150 may include silicon oxynitride (SiON). The first material layer 110 may be a predetermined lower layer, and for example, may be any one of an active region of a semiconductor substrate, a conductive pad, a transistor structure, a word line, a bit line, a lower electrode of a capacitor, an upper electrode of a capacitor, an interlayer wiring layer, an insulation layer pattern, and a rewiring pattern. The first material layer 110 is not limited to a single layer, and may include various structures therein or thereon.

Thicknesses of the second material layer 120, the third material layer 130, and the fourth material layer 140 may be respectively, for example, P1, H1, and D1.

An expression "a B material layer having a different etching rate from an A material layer" used herein contains a meaning that a difference between a speed of etching the A material layer and a speed of etching the B material layer is relatively large under the same etching process conditions, so that significantly different thicknesses of material for the two layers are etched during an etching process.

A structure shown in FIG. 3 is formed from the structure shown in FIG. 2B, via operations S120 and S130.

In one embodiment, in order to remove a portion corresponding to the first space pattern S1 from the fifth material layer 150, a mask pattern (not shown), for example, a photoresist pattern, is formed on a portion corresponding to the first line pattern L1 on the fifth material layer 150, and the pattern 150a is formed by etching the fifth material layer 150 by using the mask pattern as an etch mask. Here, the fifth material layer 150 corresponding to the first space pattern S1 is exposed by the mask pattern and thus may be removed, whereas the fifth material layer 150 corresponding to the first line pattern L1 is covered by the mask pattern, and thus may remain.

Next, the pattern 140a is formed by etching the fourth material layer 140, by using the mask pattern and/or the pattern 150a as an etch mask. Here, since the etching rates of the fourth and fifth material layers 140 and 150 are different, the pattern 150a may be used as the etch mask while etching the fourth material layer 140.

Thicknesses of the pattern 140a are different in portions corresponding to the first line pattern L1 and the first space pattern S1. For example, the thickness of the pattern 140a in the portion corresponding to the first line pattern L1 (portion directly below the pattern 150a) may be D1, and the thickness of the pattern 140a in the portion corresponding to the first space pattern S1 may be D3 (=D1−D2).

Next, operation S200 is described.

Figure 1C:
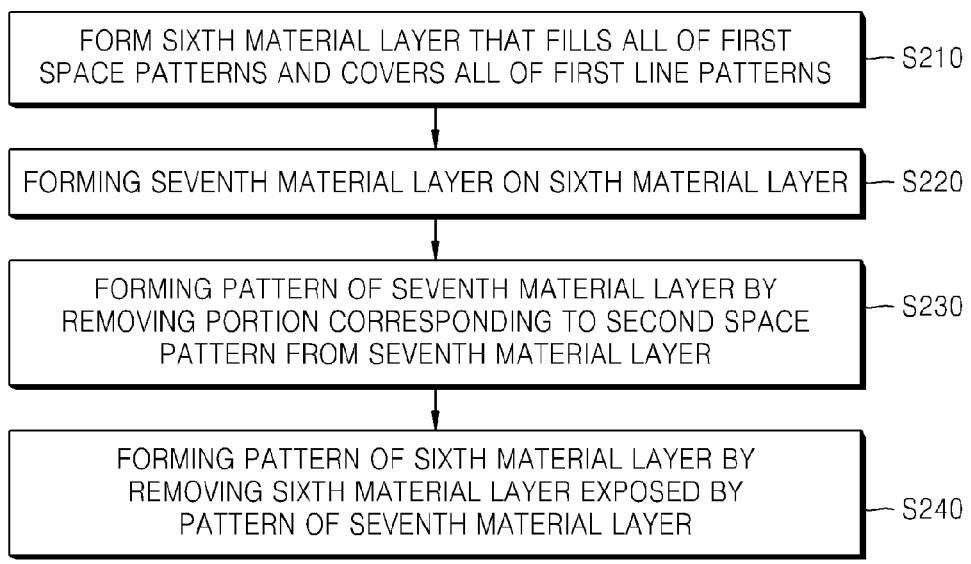
FIG. 1C is a flowchart illustrating exemplary processes of forming of a second line pattern and a second space pattern of the method of FIG. 1A.
Figure 4:
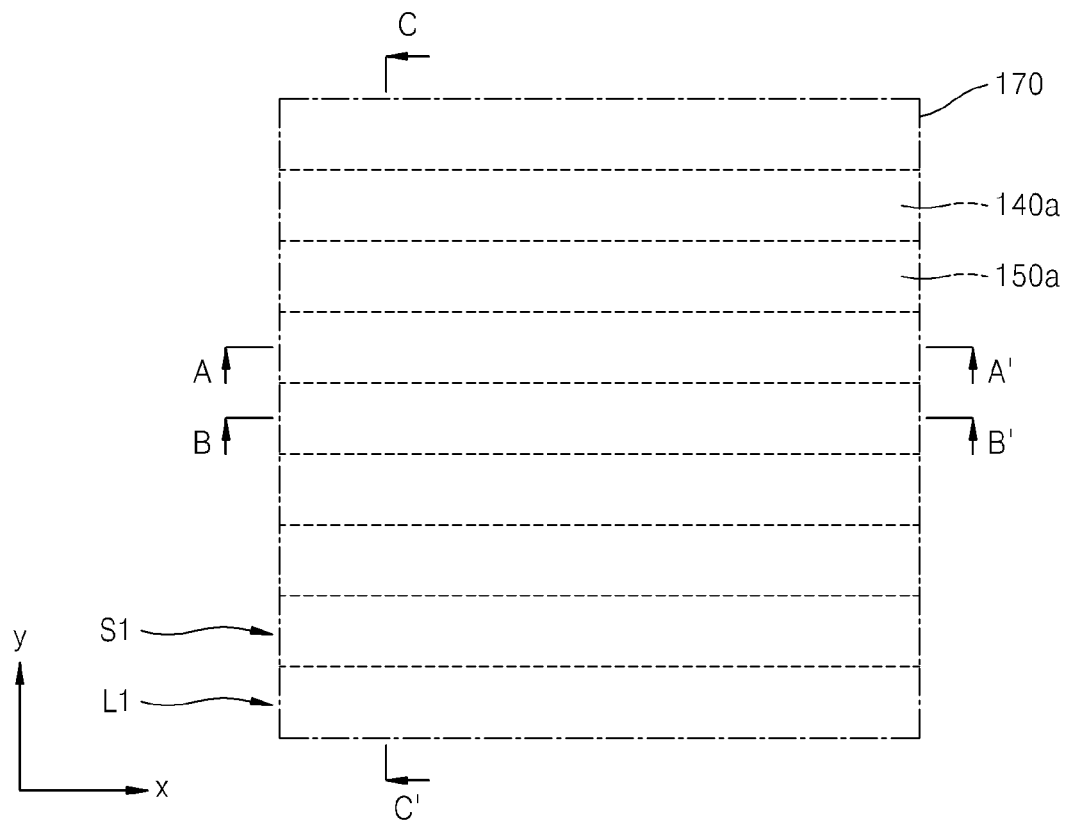
FIGS. 4 and 5 are plan views for describing forming of a plurality of second line patterns and a plurality of second space patterns, according to one exemplary embodiment.
Figure 4A:
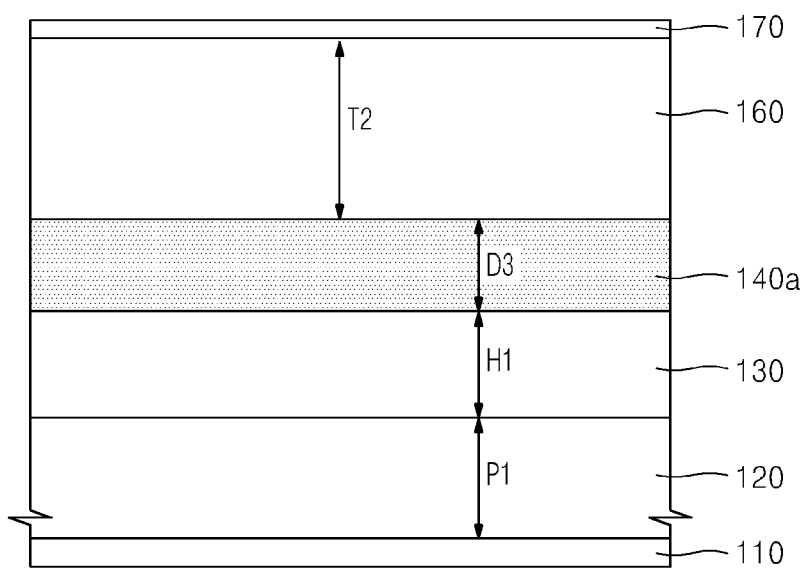
Figure 4B:
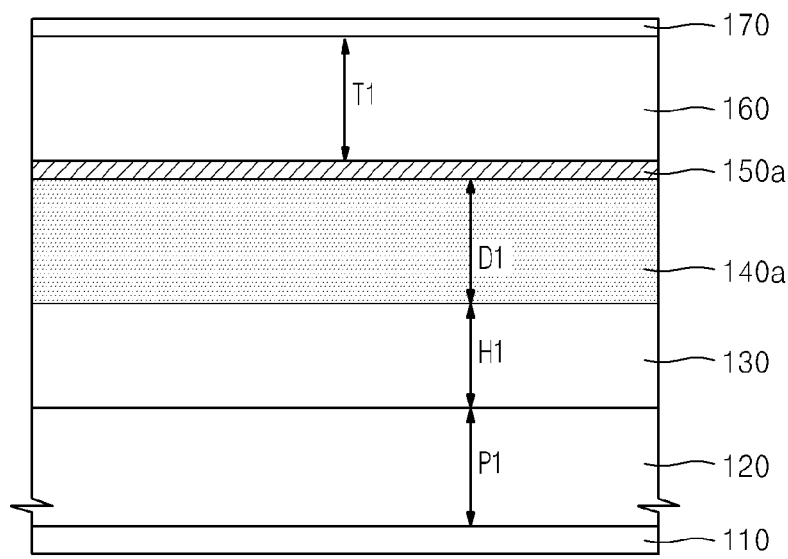
Figure 4C:
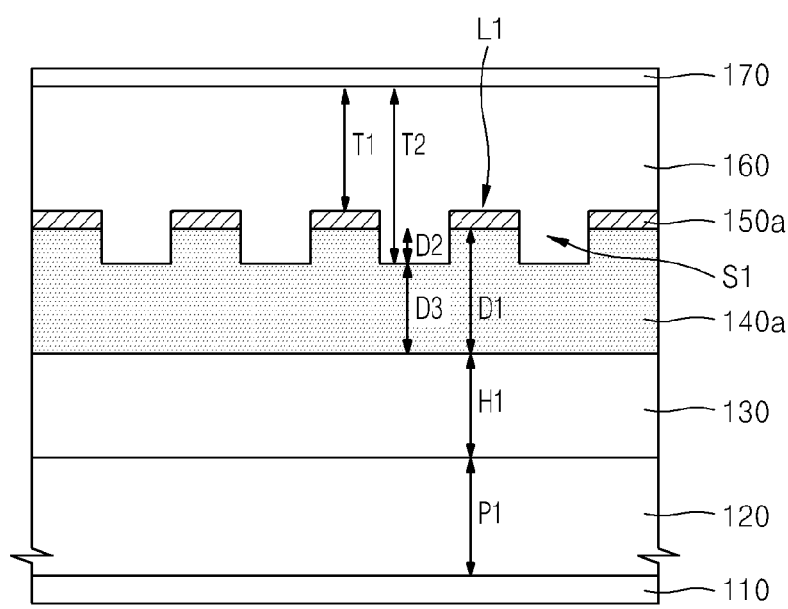
Figure 5:
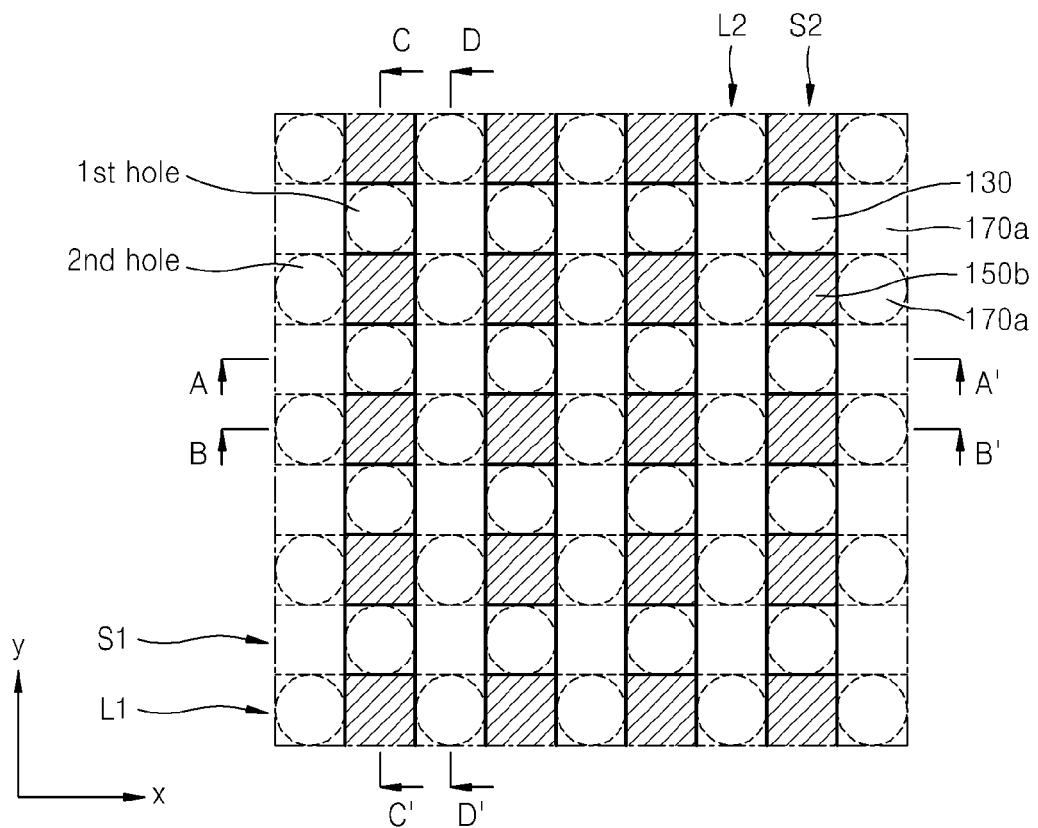
Figure 5A:
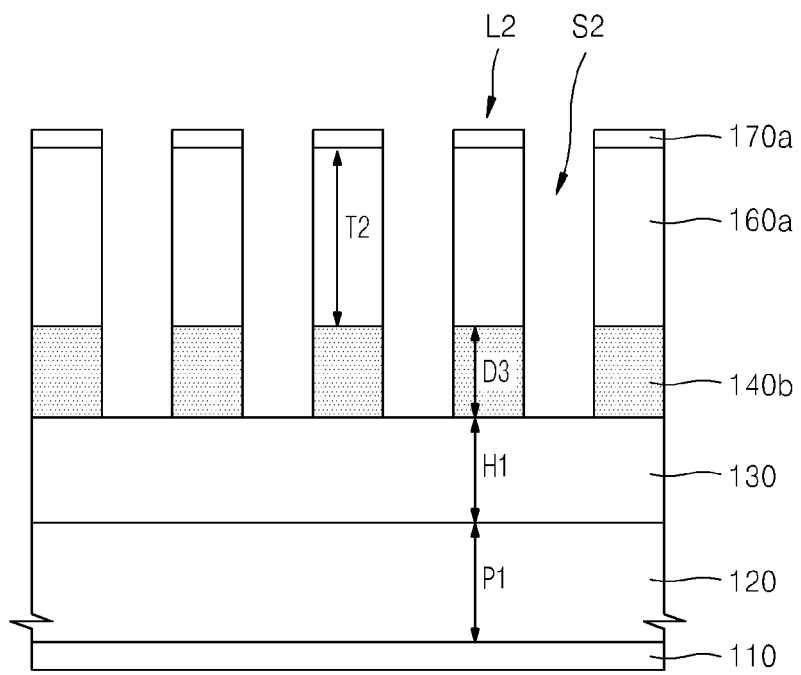
Figure 5B:
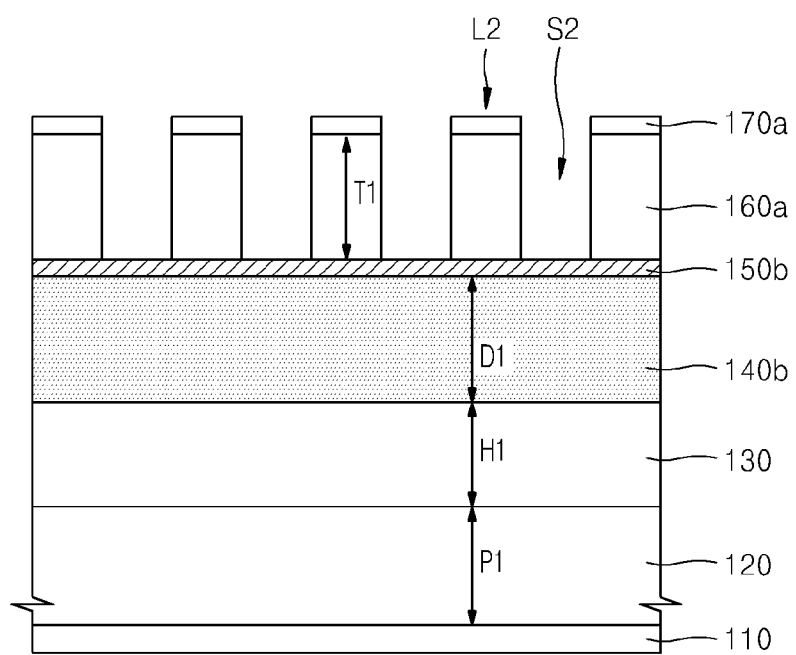

FIG. 1C is a flowchart illustrating processes of operation S200 of the method of FIG. 1A, and FIGS. 4 and 5 are plan views for describing operation S200, according to one exemplary embodiment. Also, FIGS. 4A, 4B, and 4C are cross-sectional views respectively taken along lines A-A', B-B', and C-C' of FIG. 4, and FIGS. 5A, 5B, 5C, and 5D are cross-sectional views respectively taken along lines A-A', B-B', C-C', and D-D' of FIG. 5.

Referring to FIGS. 1C, 4, 5, 4A through 4C, and 5A through 5D, operation S200, involving the forming of the plurality of second line patterns L2 and the plurality of second space patterns S2, which extend in the second direction, for example, Y-direction in FIG. 5, includes forming a sixth material layer 160, which fills all of the first space patterns S1, covers all of the first line patterns L1, and has a different etching rate from the fifth material layer 150 (operation S210), forming a seventh material layer 170 having a different etching rate from the sixth material layer 160 on the sixth material layer 160 (operation S220), forming a pattern 170a on the seventh material layer 170 by removing a portion corresponding to the second space pattern S2 from the seventh material layer 170 (operation S230), and forming a pattern 160a on the sixth material layer 160 by removing part of the sixth material layer 160 exposed by the pattern 170a (operation S240).

A structure shown in FIG. 4 is formed from the structure shown in FIG. 3, via operations S210 and S220.

For example, the sixth material layer 160 may include a spin-on hard mask (SOH) material, and the seventh material layer 170 may include SiON.

A thickness of a portion corresponding to the first space pattern S1 in the sixth material layer 160 may be T2, and a thickness of a portion corresponding to the first line pattern L1 in the sixth material layer 160 may be T1. Since a surface of the pattern 140a is uneven, the sixth material layer 160 may flow so as to fill the unevenness of the surface of the pattern 140a. Accordingly, the sixth material layer 160 may include SOH material that has a reflow characteristic, rather than, for example, ACL material that is formed via deposition. Next, the seventh material layer 170 having the different etching rate from the sixth material layer 160 may be formed on the entire surface of the sixth material layer 160.

A structure shown in FIG. 5 is formed from the structure shown in FIG. 4, via operations S230 and S240.

Dashed circles in FIG. 5 show locations of the first hole pattern $1^{ST}$ HOLE and second hole pattern $2^{ND}$ HOLE, which are to be formed on a semiconductor device that is finally formed according to the method of one exemplary embodiment.

A mask pattern (not shown), for example, a photoresist pattern, may be formed on a portion corresponding to the second line pattern L2 on the seventh material layer 170, and then the pattern 170a may be formed by removing the seventh material layer 170 exposed by the mask pattern by using the mask pattern as an etch mask. Accordingly, the pattern 170a may be formed only on the portion corresponding to the second line pattern L2.

Next, the pattern 160a is formed on the sixth material layer 160 by etching the sixth material layer 160 by using the mask pattern and/or the pattern 170a as an etch mask. Since an upper surface of the pattern 150a of the exposed fifth material layer 150 may be somewhat etched while forming the pattern 160a, a pattern of the fifth material layer 150 is indicated with a reference numeral 150b in FIG. 5.

Also, a second pattern 140b may be formed on the fourth material layer 140 by removing the pattern 140a exposed by the pattern 150b while forming the pattern 160a of the sixth material layer 160. In other words, since the etching rates of the fifth material layer 150 and the sixth material layer 160 are different from each other, the pattern 150b may operate as an etch mask with respect to a predetermined pattern of the fourth material layer 140 while the pattern 160a is formed by etching the sixth material layer 160.

For example, while forming the pattern 160a on the sixth material layer 160 including SOH material, the second pattern 140b of the fourth material layer 140 including ACL material may be formed by removing the pattern 140a exposed by the pattern 150b of the fifth material layer 150 including SiON.

Figure 5C:
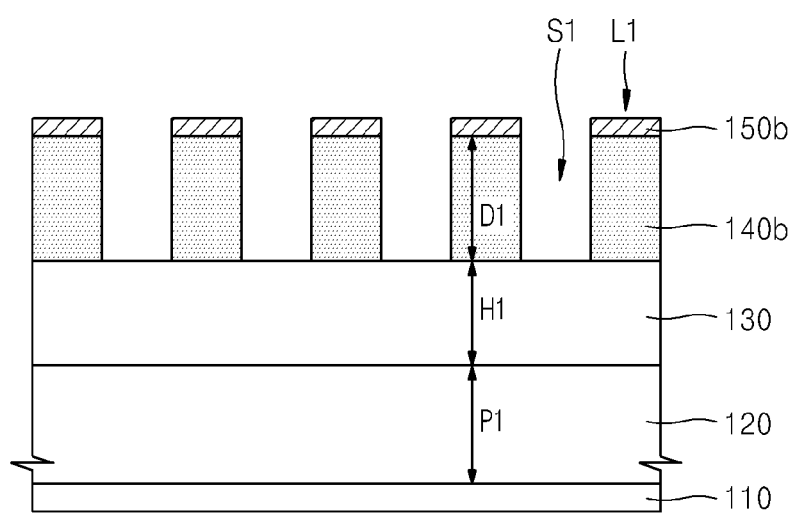

Since the mask pattern is formed in the portion corresponding to the second line pattern L2, the seventh material layer 170 and the sixth material layer 160 are completely removed in the portion corresponding to the second space pattern S2, and at the same time, the pattern 140a of the fourth material layer 140 exposed by the pattern 150a is removed, and thus the structure shown in FIG. 5C is formed from the structure shown in FIG. 4C.

Figure 5D:
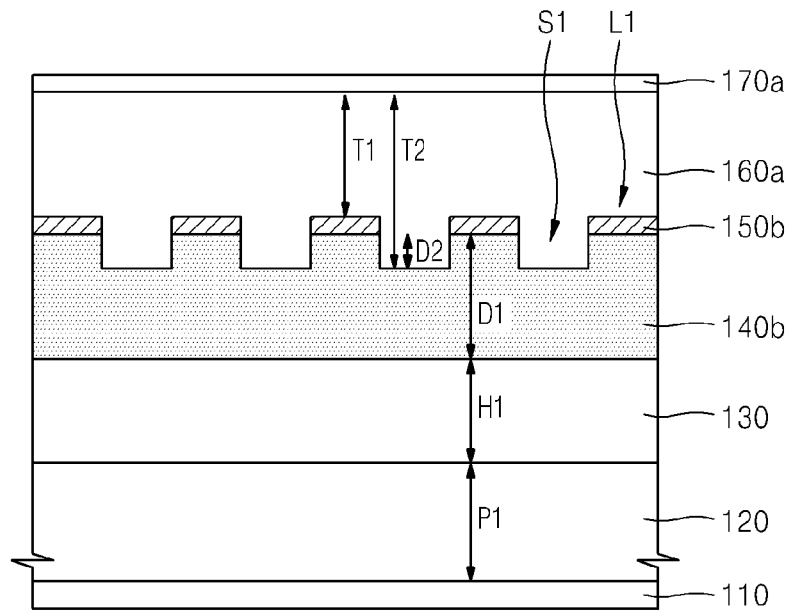
FIGS. 5D, 6D, 7D, 8D, 9D, 10D, 11D, 12D, 13D, 14D, and 15D are exemplary cross-sectional views taken along a line D-D' respectively of FIGS. 5, 6, 7, 8, 9, 10, 11, 12, 13, 14, and 15.

Also, since the mask pattern is formed in the portion corresponding to the second line pattern L2, the seventh material layer 170 and the sixth material layer 160 are not entirely removed using the mask pattern in the portion corresponding to the second line pattern L2, and at the same time, the pattern 140a exposed by the pattern 150a is also not removed, and thus the structure shown in FIG. 5D is formed from the structure shown in FIG. 4C.

Figure 5E:
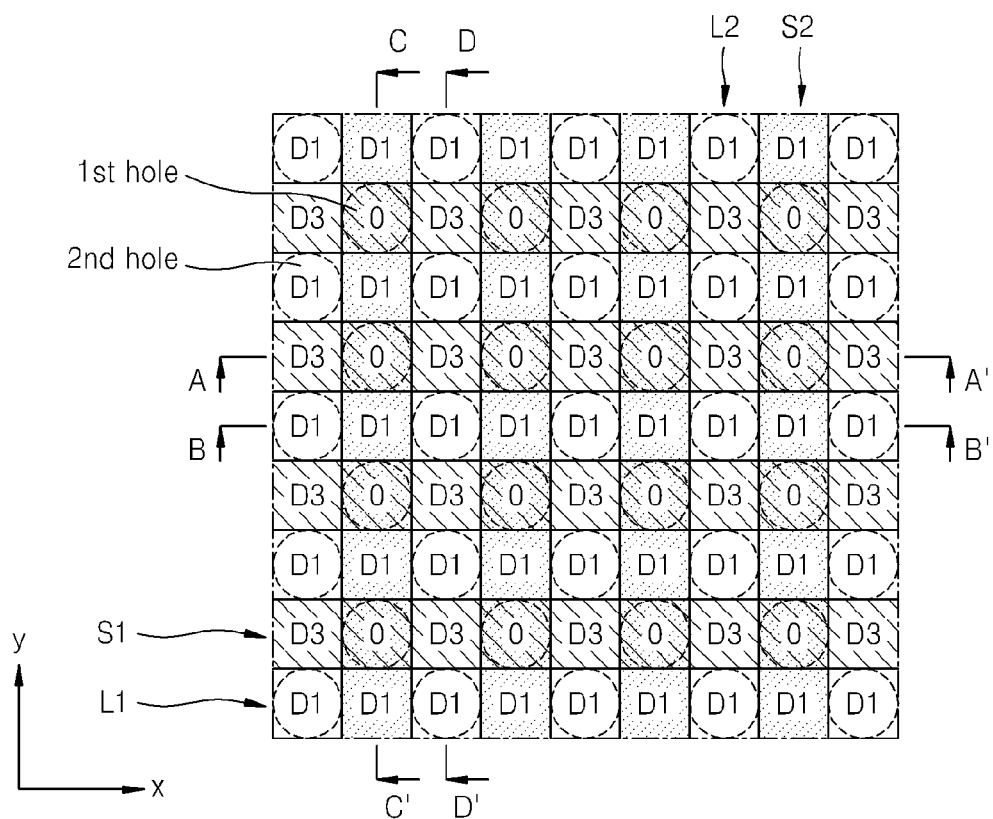
FIGS. 5E, 6E, 7E, 8E, and 9E are exemplary plan views respectively showing a fourth material layer in FIGS. 5, 6, 7, 8, and 9 with its thickness.

FIG. 5E is a plan view showing the fourth material layer 140 of in FIG. 5, in detail, the second pattern 140b of the fourth material layer 140 with a thickness. Dashed circles in FIG. 5E show locations of the first hole pattern $1^{ST}$ HOLE and second hole pattern $2^{ND}$ HOLE, which are to be formed on a semiconductor device that is finally formed according to the method of the current embodiment, for convenience.

Referring to FIG. 5E, a thickness of the second pattern 140b is 0 in the portion where the first space pattern S1 and the second space pattern S2 cross each other (portion where the first hole pattern $1^{ST}$ HOLE is formed via a following process), and is D1 in the portion where the first line pattern L1 and the second line pattern L2 cross each other (portion where the second hole pattern $2^{ND}$ HOLE is formed via a following process). Also, a thickness of the second pattern 140b is D3 in the portion where the first space pattern S1 and the second line pattern L2 cross each other, and is D1 in the portion where the second space pattern S2 and the first line pattern L1 cross each other. In one embodiment, D3 is a smaller thickness than D1.

Next, operation S300 is described.

Figure 1D:
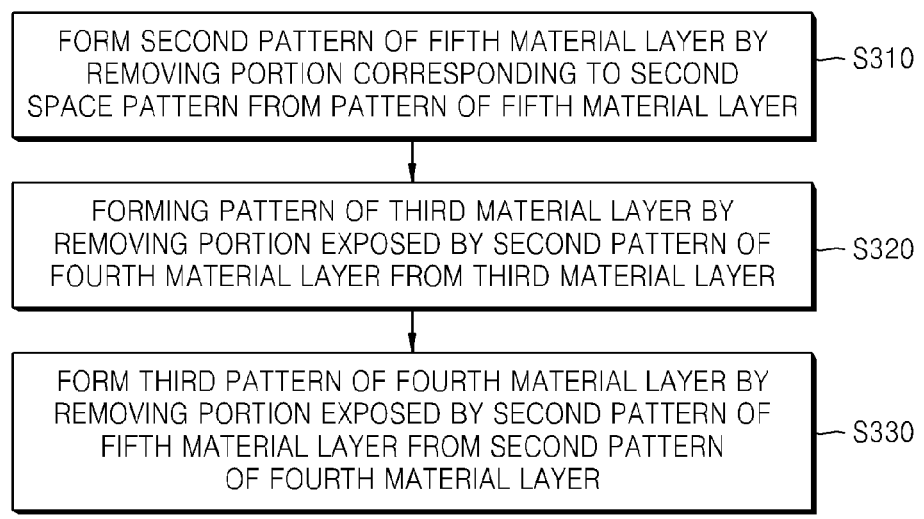
FIG. 1D is a flowchart illustrating exemplary processes of forming of a first hole pattern of the method of FIG. 1A.
Figure 6:
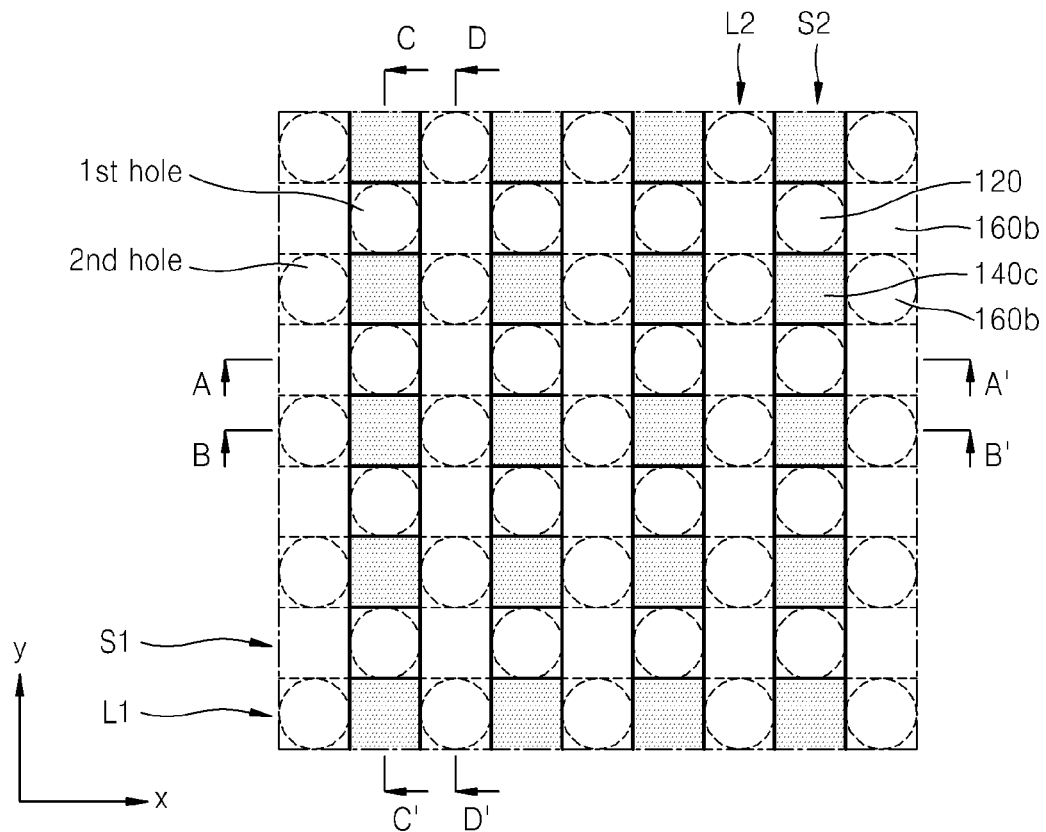
FIGS. 6 and 7 are plan views for describing forming of a first hole pattern, according to one exemplary embodiment.
Figure 6A:
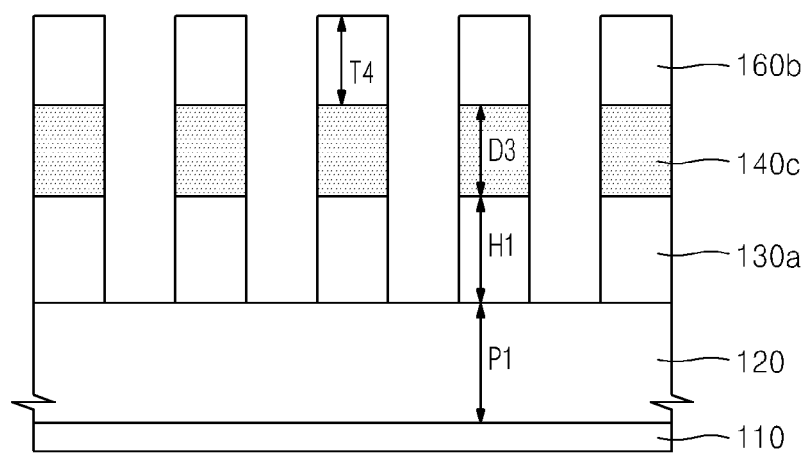
Figure 6B:
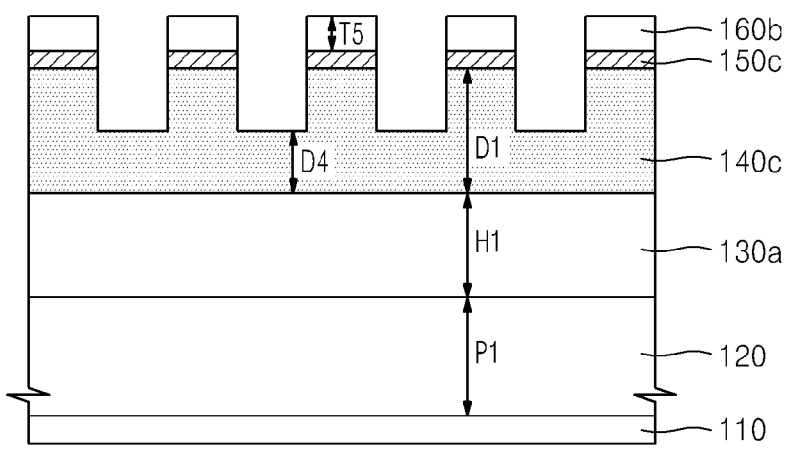
Figure 6C:
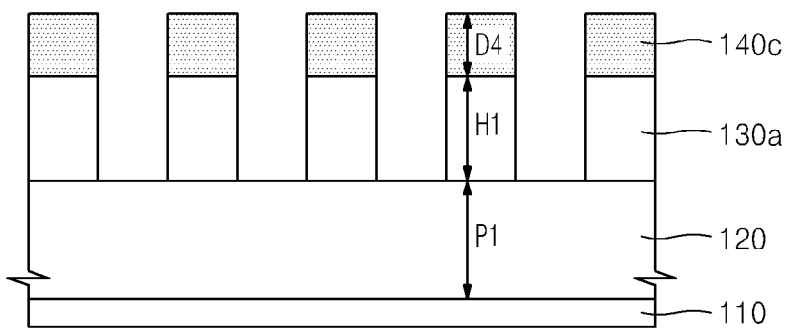
Figure 6D:
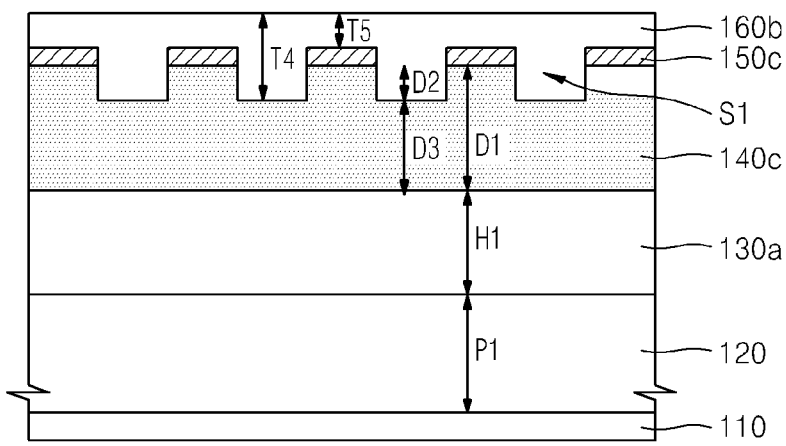
Figure 7:
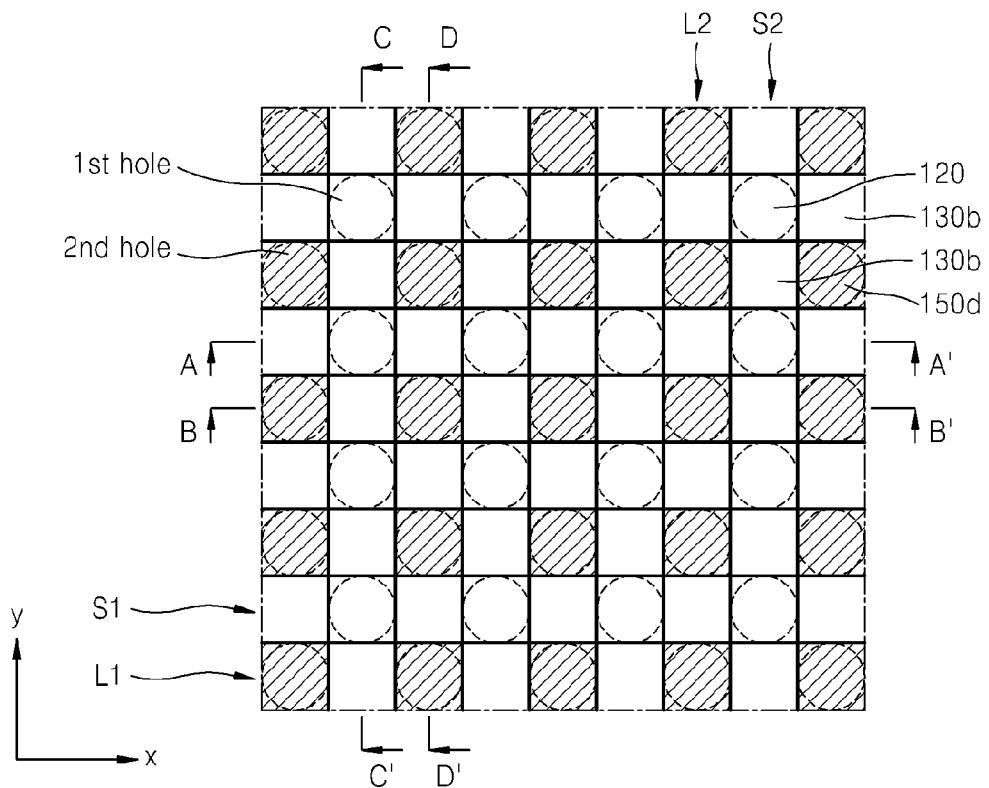
Figure 7A:
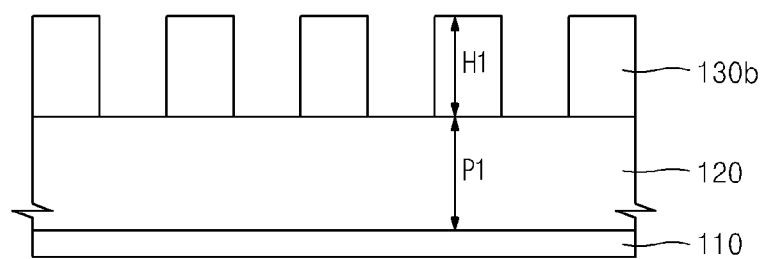

FIG. 1D is a flowchart illustrating processes of operation S300 of the method of FIG. 1A, and FIGS. 6 and 7 are plan views for describing operation S300. Also, FIGS. 6A through 6D are cross-sectional views respectively taken along lines A-A', B-B', C-C', and D-D' of FIG. 6, and FIGS. 7A through 7D are cross-sectional views respectively taken along lines A-A', B-B', C-C', and D-D' of FIG. 7.

Referring to FIG. 1D, 6, 7, 6A through 6D, and 7A through 7D, operation S300, involving the forming of the first hole pattern $1^{ST}$ HOLE where the first space pattern S1 and the second space pattern S2 cross each other, includes forming a second pattern 150c on the fifth material layer 150 by removing a portion corresponding to the second space pattern S2 from the pattern 150b (operation S310), forming a pattern 130a on the third material layer 130 by removing the third material layer 130 exposed by the second pattern 140b of the fourth material layer 140 (operation S320), and forming a third pattern 140d of the fourth material layer 140 by removing a second pattern 140c of the fourth material layer 140 exposed by the second pattern 150c (operation S330).

A structure shown in FIG. 6 is formed from the structure shown in FIG. 5, via operations S310 and S320.

The pattern 170a of the seventh material layer 170 is removed while etching the third material layer 130. Also, since a thickness of the sixth material layer 160 may decrease from T1 to T4 since the pattern 160a is partially removed while etching the third material layer 130, a pattern of the sixth material layer 160 is indicated with a reference numeral 160b in FIG. 6.

Also, the second pattern 150c is formed on the fifth material layer 150 as an exposed portion (portion corresponding to the second space pattern S2) of the pattern 150b is removed while etching the third material layer 130. Also, as occasion commands, a thickness of the fourth material layer 140 may be additionally decreased from D1 to D4 as the second pattern 140b is partially removed, and thus a second pattern of the fourth material layer 140 is indicated with a reference numeral 140c in FIG. 6.

Since the etching rates of the third material layer 130 and the fourth material layer 140 are different from each other, the second pattern 140c may operate as an etch mask while the pattern 130a is formed by etching the third material layer 130.

Figure 6E:
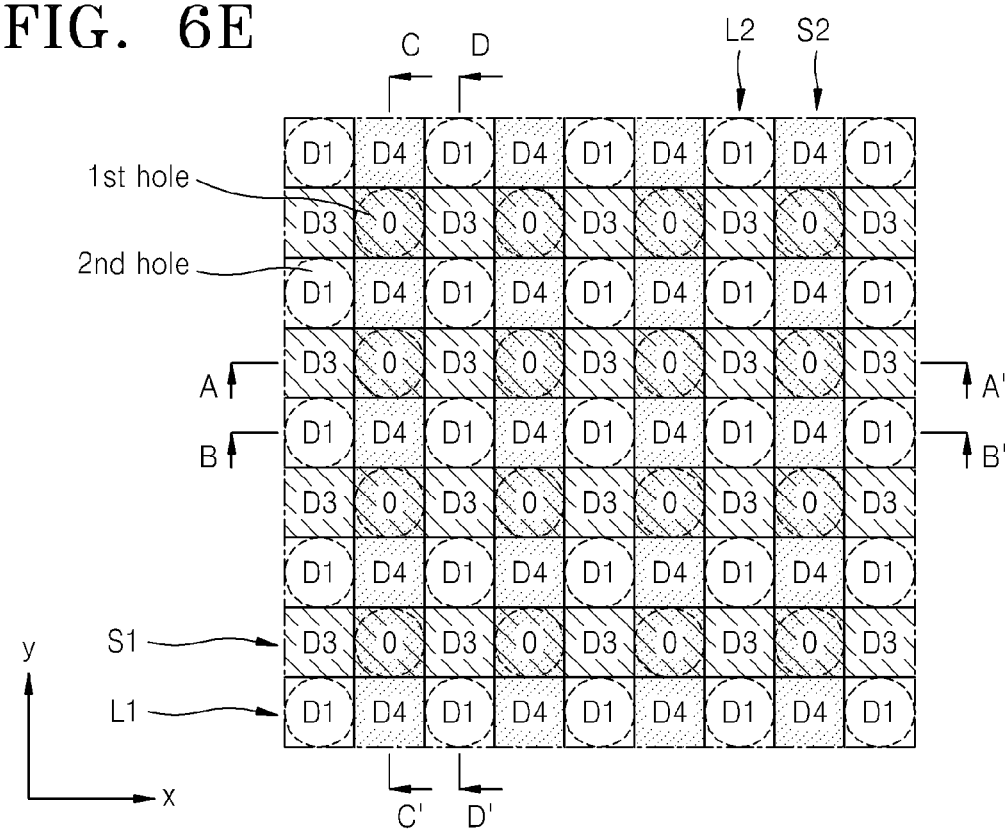

FIG. 6E is a plan view showing the fourth material layer 140, in detail, the second pattern 140c of the fourth material layer 140 in FIG. 6 with its thickness. Dashed circles in FIG. 6E show locations of the first hole pattern $1^{ST}$ HOLE and second hole pattern $2^{ND}$ HOLE, which are to be formed on a semiconductor device that is finally formed according to the method of the current embodiment, for convenience.

Referring to FIG. 6E, a thickness of the second pattern 140c is 0 in the portion where the first space pattern S1 and the second space pattern S2 cross each other (the portion where the first hole pattern $1^{ST}$ HOLE is formed via a following process), and is D1 in the portion where the first line pattern L1 and the second line pattern L2 cross each other (the portion where the second hole pattern $2^{ND}$ HOLE is formed via a following process). Also, a thickness of the second pattern 140c is D3 in the portion where the first space pattern S1 and the second line pattern L2 cross each other, and is D4 in the portion where the second space pattern S2 and the first line pattern L1 cross each other.

Accordingly in FIG. 6, the second pattern 140c is not only formed in a portion where the second hole pattern $2^{ND}$ HOLE is to be formed, but also has a predetermined thickness, such as D3 or D4 in other portions. According to one exemplary embodiment, a predetermined pattern of the fourth material layer 140 needs to be formed in the portion where the second hole pattern $2^{ND}$ HOLE is to be formed, and thus, following processes are performed.

Figure 6F:
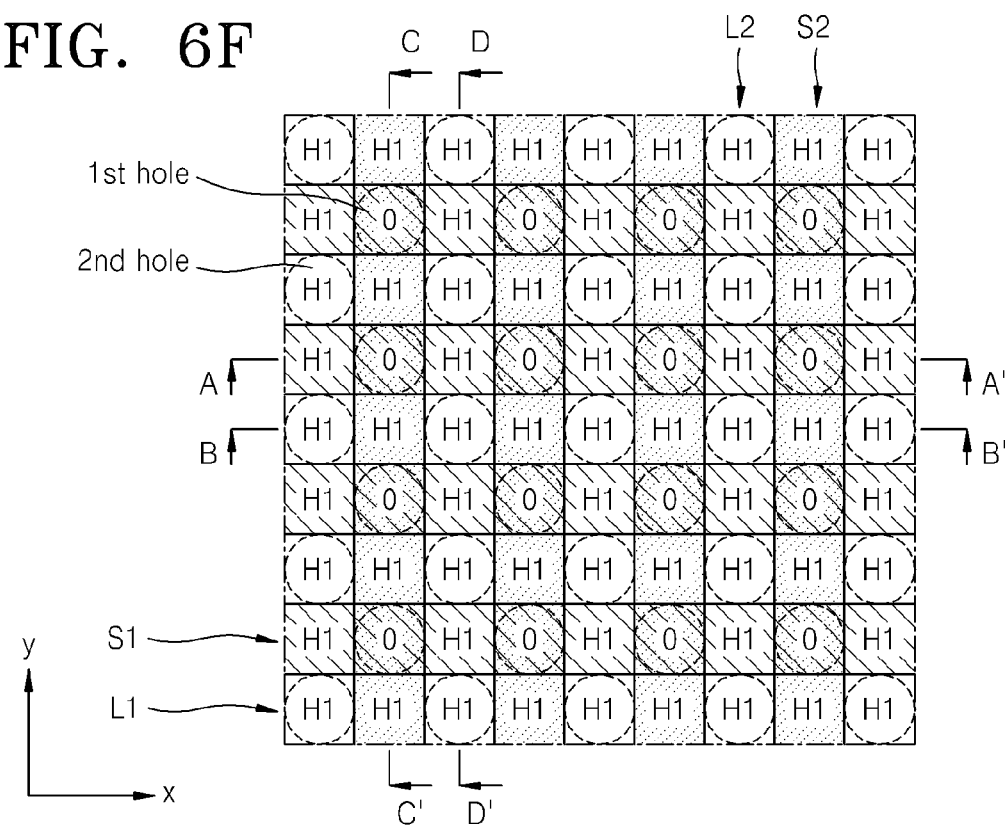
FIGS. 6F, 7F, 8F, 9F, 10E, 11E, 12E, 13E, 14E, and 15E are exemplary plan views respectively showing a third material layer in FIGS. 6, 7, 8, 9, 10, 11, 12, 13, 14, and 15 with its thickness.

FIG. 6F is a plan view showing the third material layer 130, in detail, the pattern 130a of the third material layer 130 in FIG. 6 with its thickness. Dashed circles in FIG. 6F show locations of the first hole pattern $1^{ST}$ HOLE and second hole pattern $2^{ND}$ HOLE, which are to be formed on a semiconductor device that is finally formed according to the method of the current embodiment, for convenience.

Referring to FIG. 6F, a thickness of the pattern 130a of the third material layer 130 is 0 in the portion where the first space pattern S1 and the second space pattern S2 cross each other (portion where the first hole pattern $1^{ST}$ HOLE is formed via a following process), and is H1 in the portion where the first line pattern L1 and the second line pattern L2 cross each other (portion where the second hole pattern $2^{ND}$ HOLE is formed via a following process). Also, the thickness of the pattern 130a is H1 in the portion where the first space pattern S1 and the second line pattern L2 cross each other, and is H1 in the portion where the second space pattern S2 and the first line pattern L1 cross each other.

Accordingly, the pattern 130a is opened in the portion where the first hole pattern $1^{ST}$ HOLE is formed, and has a uniform thickness H1 in other portions, in FIG. 6.

A structure shown in FIG. 7 is formed from the structure shown in FIG. 6, via operations S330.

Since the etching rates of the fourth material layer 140 and the fifth material layer 150 are different from each other, the second pattern 150c operates as an etch mask of the second pattern 140c while the third pattern 140d is formed by etching the second pattern 140c. Here, the pattern 160b may be pre-removed or removed while etching the second pattern 140c.

Also, since an upper surface of the pattern 130a may be partially removed when the second pattern 140c in the portion corresponding to the first space pattern S1 is removed, a pattern of the third material layer 130 is indicated with a reference numeral 130b in FIG. 7. Also, since an upper surface of the second pattern 150c may be partially removed while etching the second pattern 140c, a second pattern of the fifth material layer 150 is indicated with a reference numeral 150d in FIG. 7.

Figure 7B:
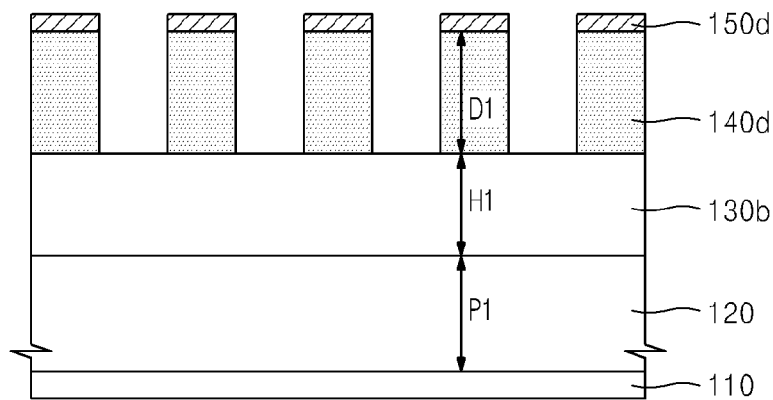
Figure 7C:
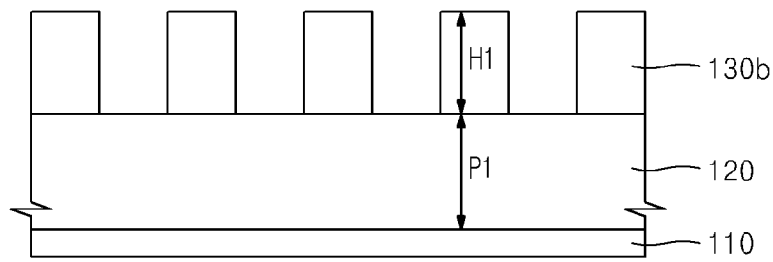
Figure 7D:
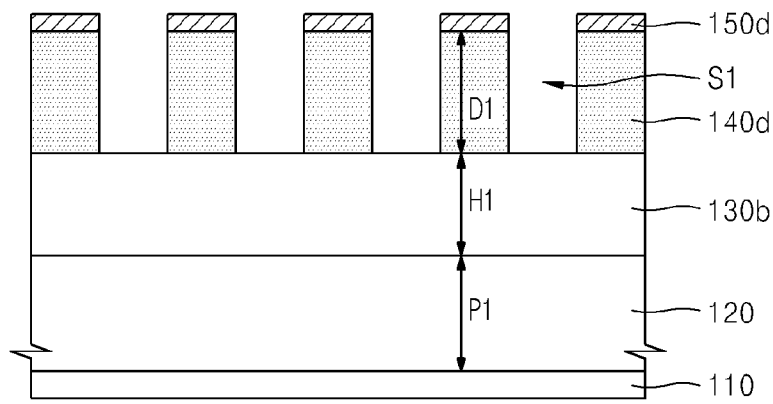
Figure 7E:
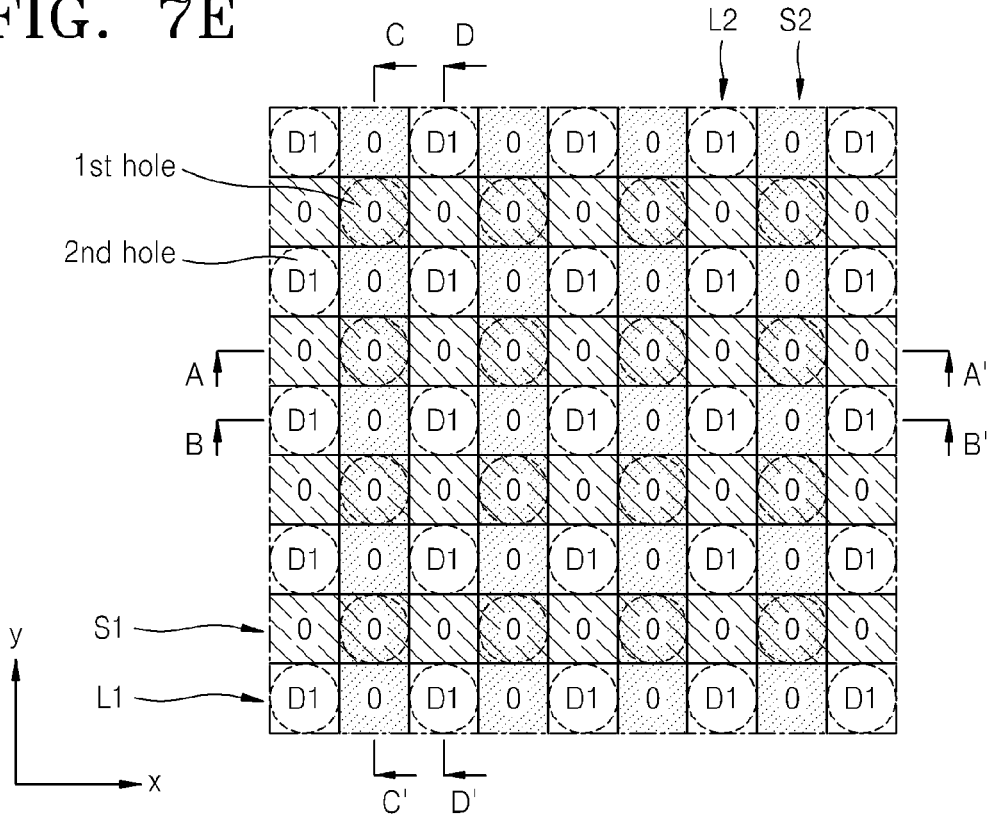

FIG. 7E is a plan view showing the fourth material layer 140, in detail, the third pattern 140d of the fourth material layer 140 in FIG. 7 with its thickness. Dashed circles in FIG. 7E show locations of the first hole pattern $1^{ST}$ HOLE and second hole pattern $2^{ND}$ HOLE, which are to be formed on a semiconductor device that is finally formed according to the method of the current embodiment.

Referring to FIG. 7E, a thickness of the third pattern 140d is 0 in the portion where the first space pattern S1 and the second space pattern S2 cross each other (the portion where the first hole pattern $1^{ST}$ HOLE is formed via a following process), and is D1 in the portion where the first line pattern L1 and the second line pattern L2 cross each other (the portion where the second hole pattern $2^{ND}$ HOLE is formed via a following process). Also, the thickness of the third pattern 140d is 0 in the portion where the first space pattern S1 and the second line pattern L2 cross each other, and is 0 in the portion where the second space pattern S2 and the first line pattern L1 cross each other.

Accordingly, the third pattern 140d is formed only in a portion where the second hole pattern $2^{ND}$ HOLE is to be formed in FIG. 7. In other words, a predetermined pattern of the fourth material layer 140 is formed in a cylinder shape only in a portion where the second hole pattern $2^{ND}$ HOLE is formed. According to one embodiment, since the predetermined pattern of the fourth material layer 140 is formed only in the portion where the second hole pattern $2^{ND}$ HOLE is to be formed in an intermediate process, the structure shown in FIG. 7 satisfies such a condition.

Figure 7F:
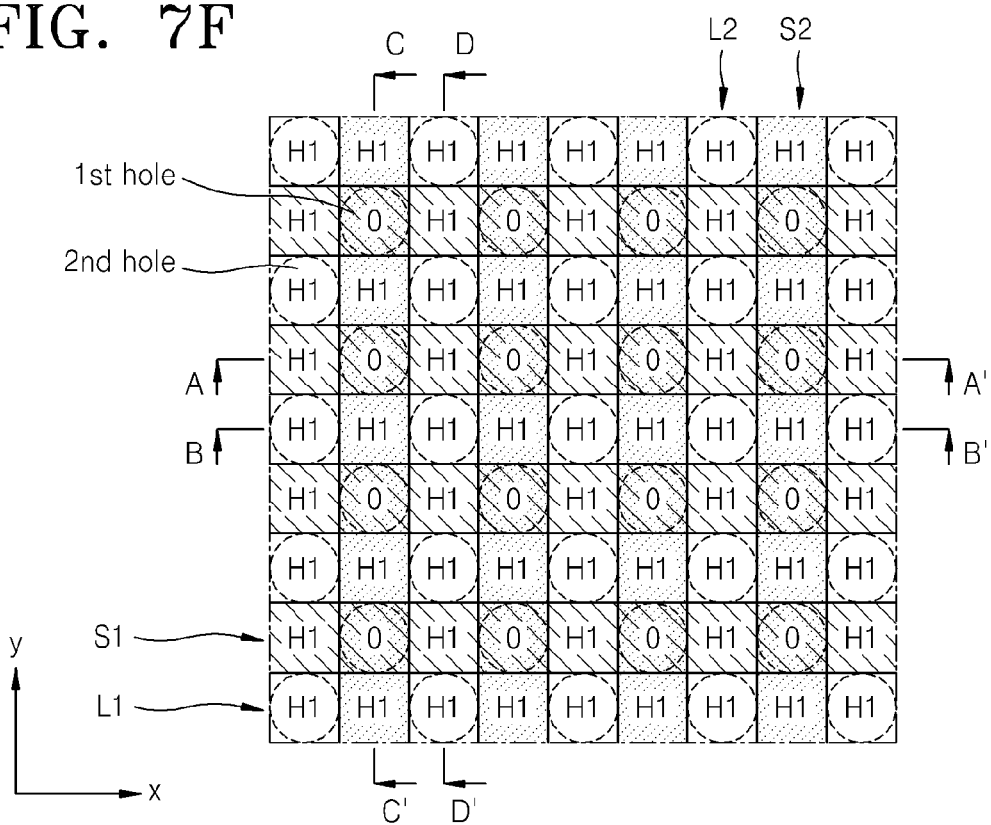

FIG. 7F is a plan view showing the third material layer 130, in detail, the pattern 130b of the third material layer 130 in FIG. 7 with its thickness. Dashed circles in FIG. 7F show locations of the first hole pattern $1^{ST}$ HOLE and second hole pattern $2^{ND}$ HOLE, which are to be formed on a semiconductor device that is finally formed according to the method of the current embodiment.

Referring to FIG. 7F, a thickness of the pattern 130b is 0 in the portion where the first space pattern S1 and the second space pattern S2 cross each other (the portion where the first hole pattern $1^{ST}$ HOLE is formed via a following process), and is H1 in the portion where the first line pattern L1 and the second line pattern L2 cross each other (the portion where the second hole pattern $2^{ND}$ HOLE is formed via a following process). Also, a thickness of the pattern 130b is H1 in the portion where the first space pattern S1 and the second line pattern L2 cross each other, and is H1 in the portion where the second space pattern S2 and the first line pattern L1 cross each other.

Accordingly, the pattern 130b is opened in the portion where the first hole pattern $1^{ST}$ HOLE is to be formed and has uniform thickness H1 in other portions in FIG. 7.

Next, operation S400 is described.

Figure 1E:
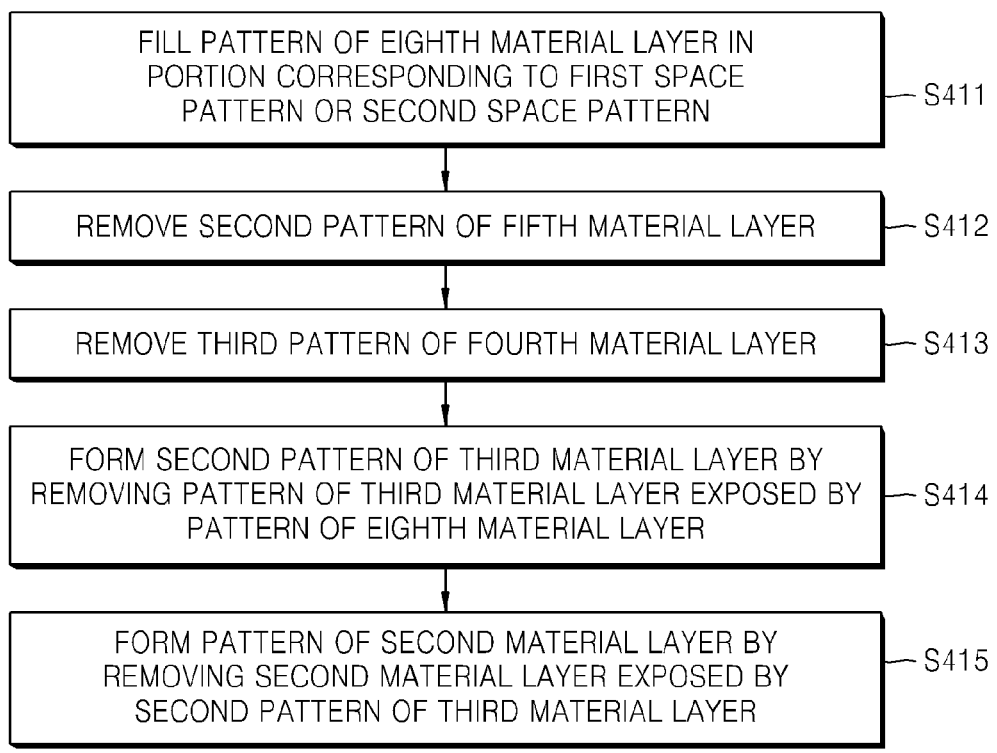
FIG. 1E is a flowchart illustrating processes of forming of a second hole pattern of the method of FIG. 1A, according to one exemplary embodiment.

FIG. 1E is a flowchart illustrating processes of operation S400 of the method of FIG. 1A, according to one exemplary embodiment, and FIGS. 8, 9, 10, and 11 are plan views for describing operation S400 according to the current embodiment. Also, FIGS. 8A through 8D are cross-sectional views respectively taken along lines A-A', B-B', C-C', and D-D' of FIG. 8, FIGS. 9A through 9D are cross-sectional views respectively taken along lines A-A', B-B', C-C', and D-D' of FIG. 9, and FIGS. 10A through 10D are cross-sectional views respectively taken along lines A-A', B-B', C-C', and D-D' of FIG. 10. Also, FIGS. 11A through 11D are cross-sectional views respectively taken along lines A-A', B-B', C-C' and D-D' of FIG. 11.

Referring to FIGS. 1E, 8 through 11, 8A through 8D, 9A through 9D, 10A through 10D, and 11A through 11D, operation S400, involving the forming of the second hole pattern $2^{ND}$ HOLE where the first line pattern L1 and the second line pattern L2 cross each other, includes filling a pattern 180 of an eighth material layer (not shown) in a portion corresponding to the first space pattern S1 or the second space pattern S2 (operation S411), removing the second pattern 150d (operation S412), removing the third pattern 140d (operation S413), forming a second pattern 130c on the third material layer 130 by removing the pattern 130b exposed by the pattern 180 (operation S414), and forming a pattern 120a on the second material layer 120 by removing the second material layer 120 exposed by the second pattern 130c (operation S415).

Figure 8:
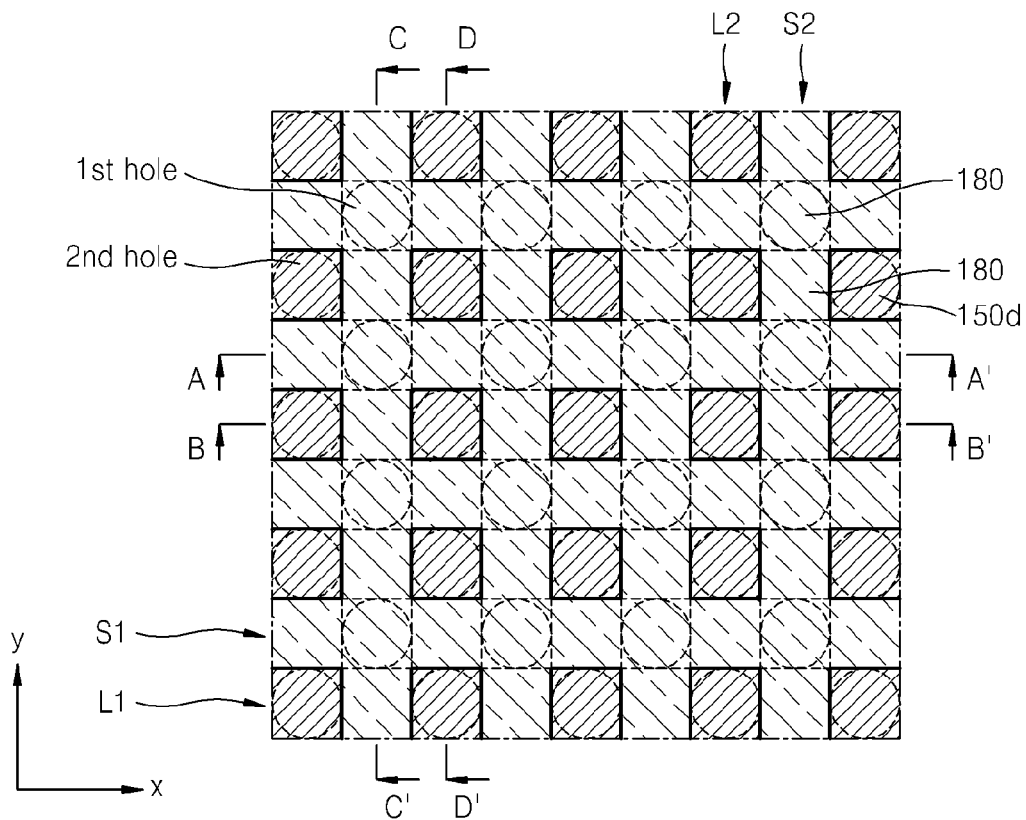
FIGS. 8 through 11 are plan views for describing forming of a second hole pattern, according to one exemplary embodiment.
Figure 8A:
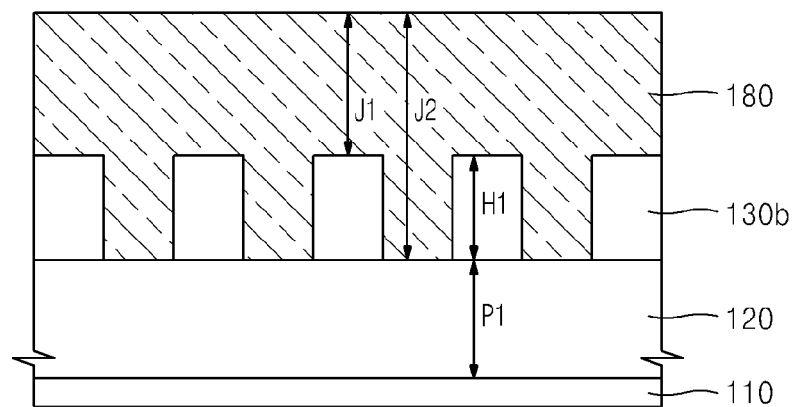
Figure 8B:
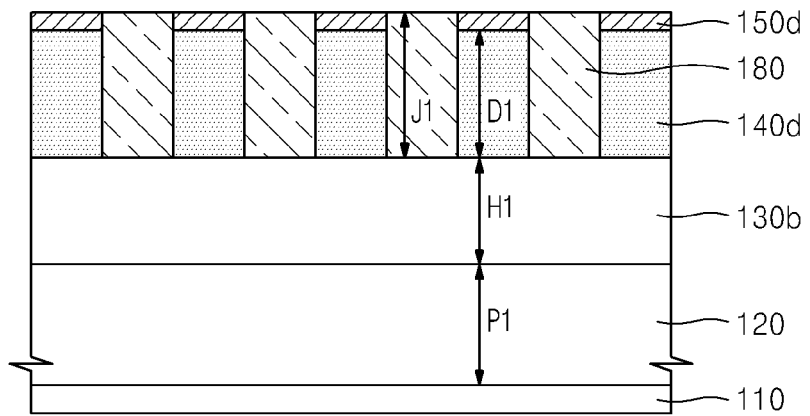
Figure 8C:
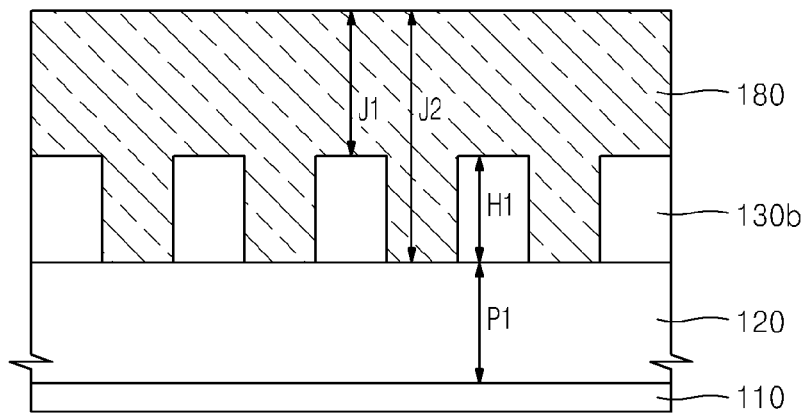
Figure 8D:
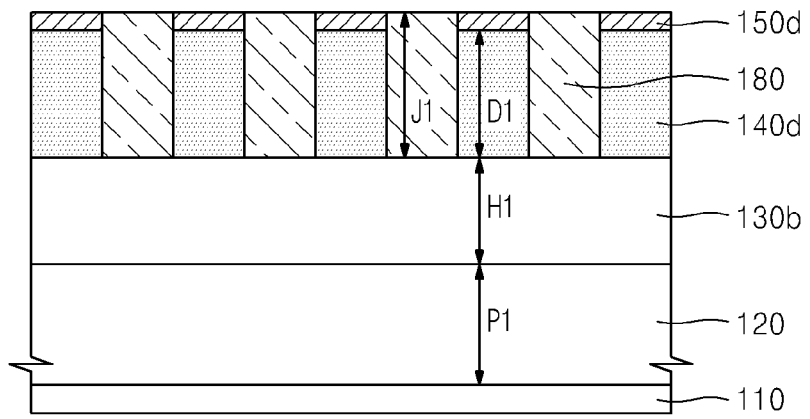

A structure shown in FIG. 8 is formed from the structure shown in FIG. 7, via operation S411.

The eighth material layer is formed on the entire surface of the structure of FIG. 7, and then is planarized until an upper surface of the second pattern 150d is exposed, thereby forming the pattern 180. Here, the pattern 180 is formed in portions corresponding to the first space pattern S1 and the second space pattern S2, and fills a space between the second patterns 150d, between the third patterns 140d, and between the patterns 130b.

A thickness of the pattern 180 contacting an upper surface of the pattern 130b may be J1, and a thickness of the pattern 180 contacting an upper surface of the second material layer 120 may be J2.

The eighth material layer may include, for example, polysilicon.

Figure 8E:
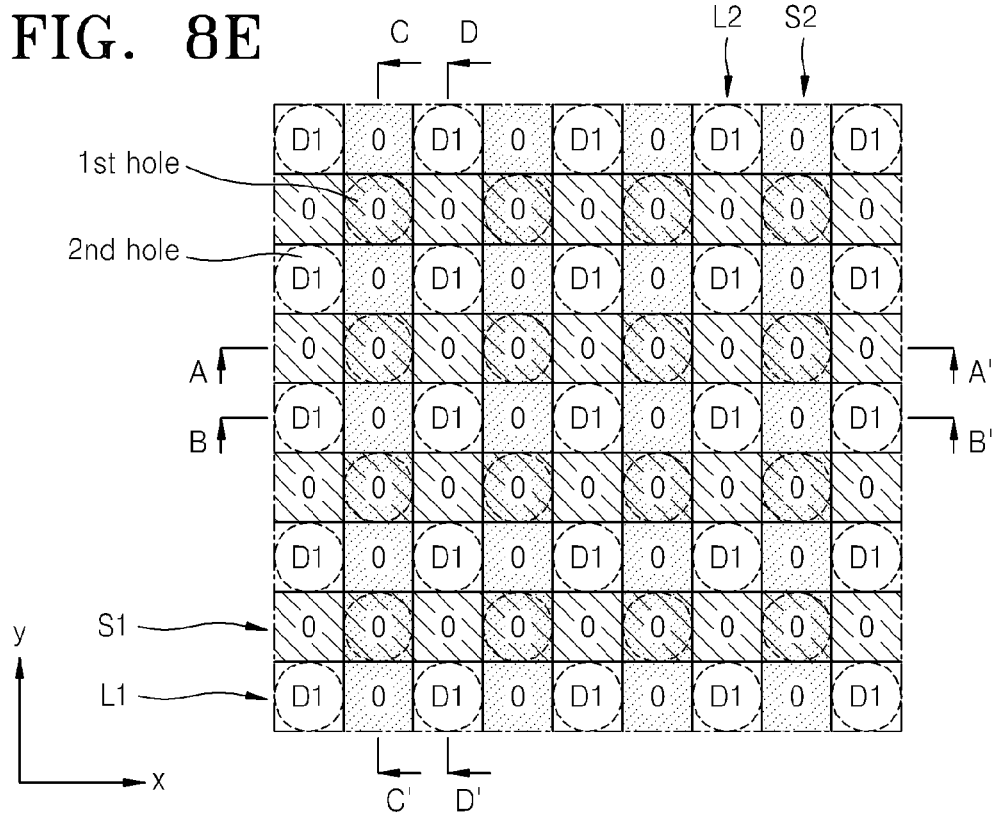

FIG. 8E is a plan view showing the fourth material layer 140, in detail, the third pattern 140d of the fourth material layer 140 in FIG. 8 with its thickness. Dashed circles in FIG. 8E show locations of the first hole pattern $1^{ST}$ HOLE and second hole pattern $2^{ND}$ HOLE, which are to be formed on a semiconductor device that is finally formed according to the method of the current embodiment.

Referring to FIG. 8E, a thickness of the third pattern 140d is 0 in the portion where the first space pattern S1 and the second space pattern S2 cross each other (the portion where the first hole pattern $1^{ST}$ HOLE is formed via a following process), and is D1 in the portion where the first line pattern L1 and the second line pattern L2 cross each other (the portion where the second hole pattern $2^{ND}$ HOLE is formed via a following process). Also, the thickness of the third pattern 140d is 0 in the portion where the first space pattern S1 and the second line pattern L2 cross each other, and is 0 in the portion where the second space pattern S2 and the first line pattern L1 cross each other.

Accordingly, a predetermined pattern of the fourth material layer 140 is formed only in the portion where the second hole pattern $2^{ND}$ HOLE is to be formed in FIG. 8, like FIG. 7.

Figure 8F:
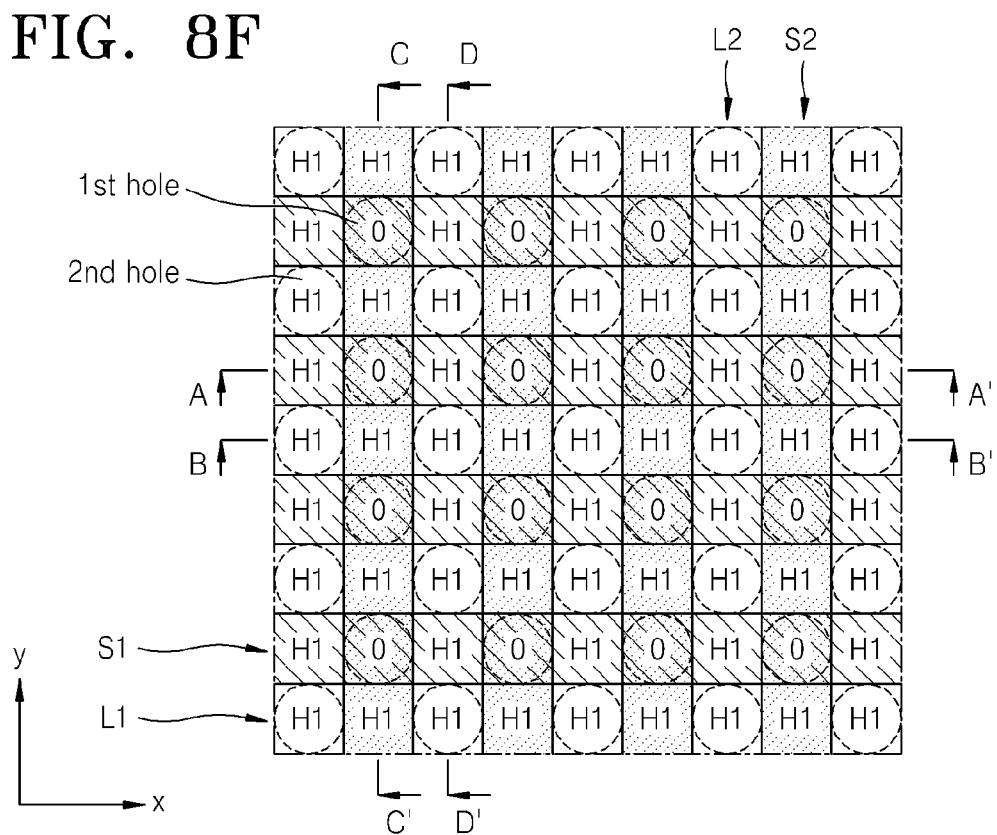

FIG. 8F is a plan view showing the third material layer 130, in detail, the pattern 130b of the third material layer 130 in FIG. 8 with its thickness. Dashed circles in FIG. 8F show locations of the first hole pattern $1^{ST}$ HOLE and second hole pattern $2^{ND}$ HOLE, which are to be formed on a semiconductor device that is finally formed according to the method of the current embodiment, for convenience.

Referring to FIG. 8F, a thickness of the pattern 130b is 0 in the portion where the first space pattern S1 and the second space pattern S2 cross each other (the portion where the first hole pattern $1^{ST}$ HOLE is formed via a following process), and is H1 in the portion where the first line pattern L1 and the second line pattern L2 cross each other (the portion where the second hole pattern $2^{ND}$ HOLE is formed via a following process). Also, the thickness of the pattern 130b is H1 in the portion where the first space pattern S1 and the second line pattern L2 cross each other, and is H1 in the portion where the second space pattern S2 and the first line pattern L1 cross each other.

Accordingly, the pattern 130b is opened in the portion where the first hole pattern $1^{ST}$ HOLE is formed and has a uniform thickness H1 in other portions in FIG. 8, like FIG. 7.

Figure 8G:
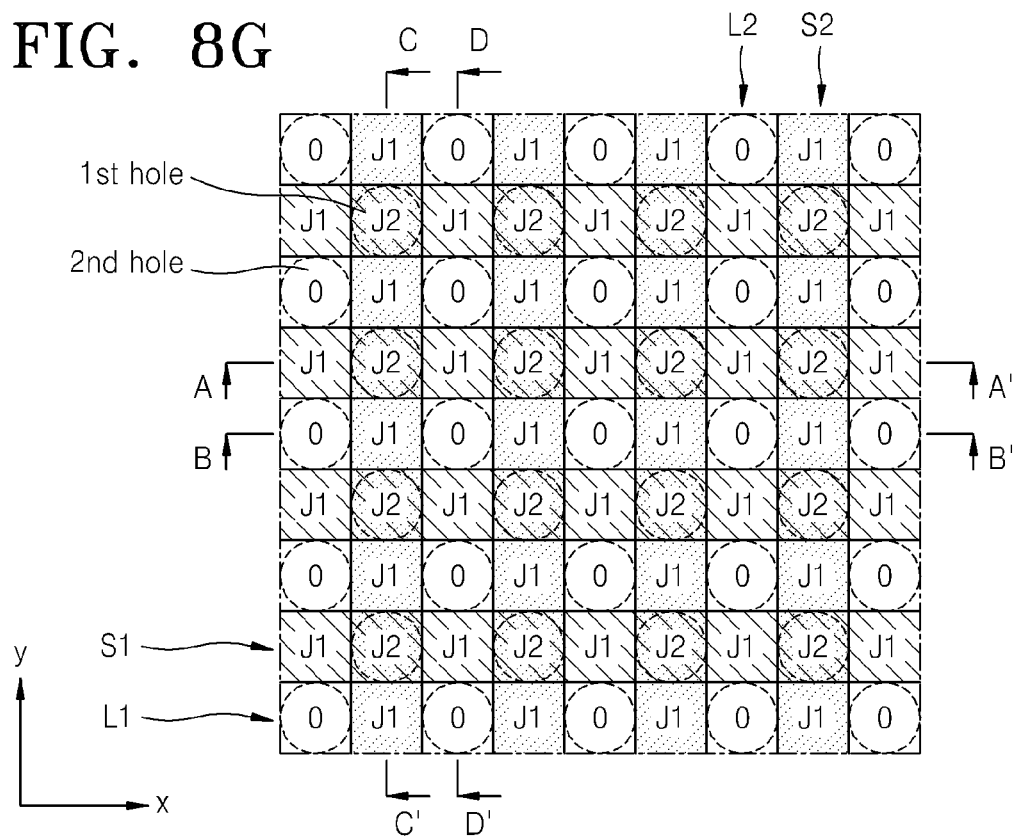
FIG. 8G is an exemplary plan view showing an eighth material layer in FIG. 8 with its thickness.

FIG. 8G is a plan view showing the eighth material layer, in detail, the pattern 180 of the eighth material layer in FIG. 8 with its thickness. Dashed circles in FIG. 8G show locations of the first hole pattern $1^{ST}$ HOLE and second hole pattern $2^{ND}$ HOLE, which are to be formed on a semiconductor device that is finally formed according to the method of the current embodiment, for convenience.

Referring to FIG. 8G, a thickness of the pattern 180 is J2 in the portion where the first space pattern S1 and the second space pattern S2 cross each other (the portion where the first hole pattern $1^{ST}$ HOLE is formed via a following process), and is 0 in the portion where the first line pattern L1 and the second line pattern L2 cross each other (the portion where the second hole pattern $2^{ND}$ HOLE is formed via a following process). Also, the thickness of the pattern 180 is J1 in the portion where the first space pattern S1 and the second line pattern L2 cross each other, and is J1 in the portion where the second space pattern S2 and the first line pattern L1 cross each other.

Accordingly, the thickness of the pattern 180 is J2 in the portion where the first hole pattern $1^{ST}$ HOLE is to be formed, is 0 in the portion where the second hole pattern $2^{ND}$ HOLE is to be formed, and is J1 in other portions in FIG. 8. Here, J2 has a larger value than J1.

Figure 9:
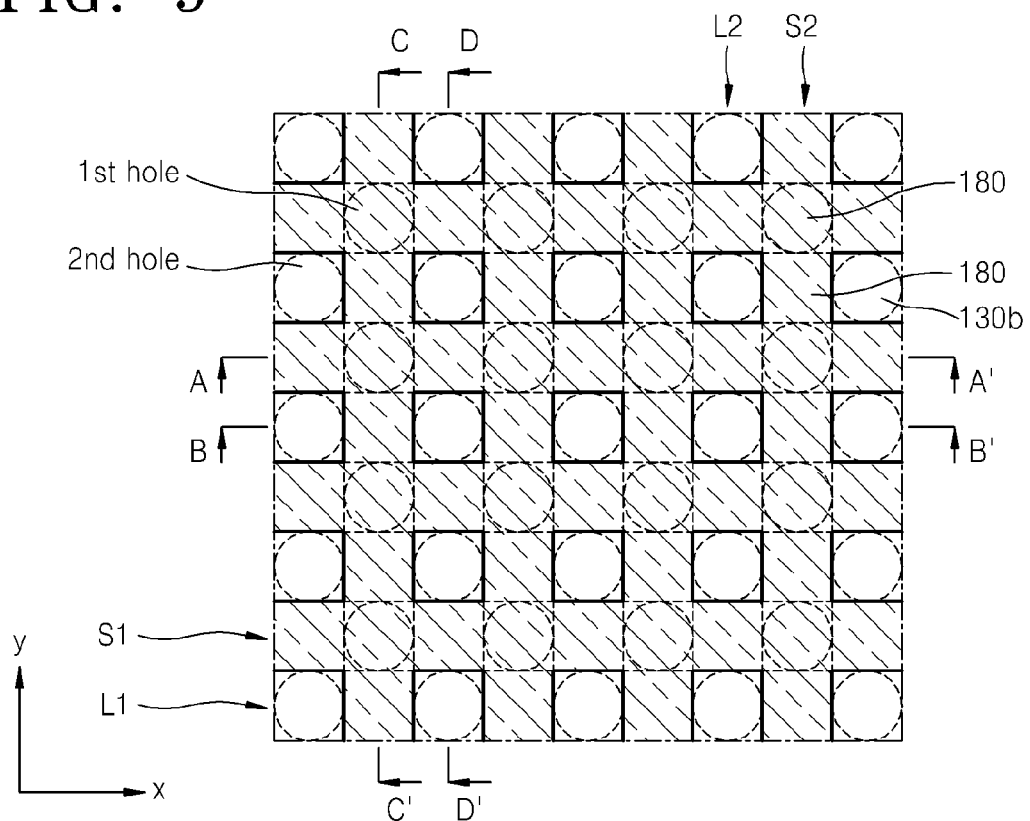
Figure 9A:
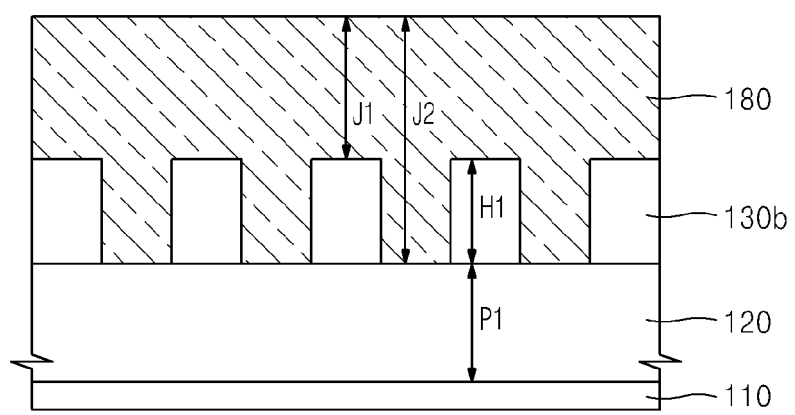
Figure 9B:
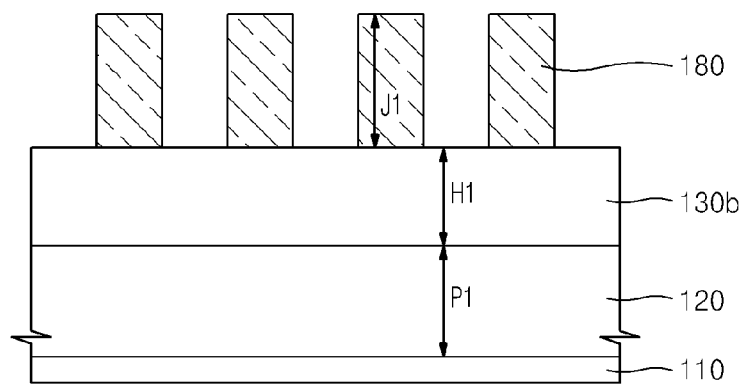
Figure 9C:
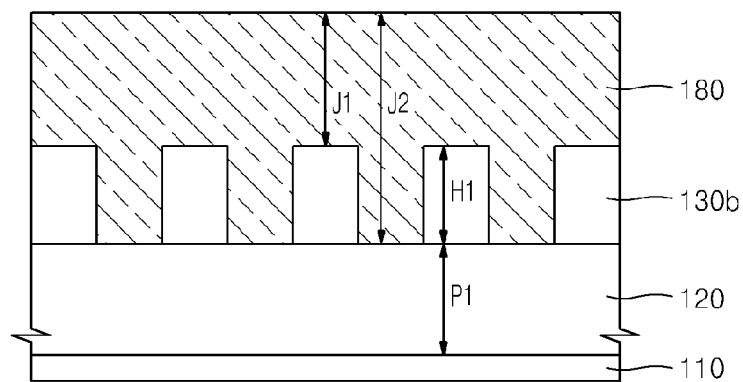
Figure 9D:
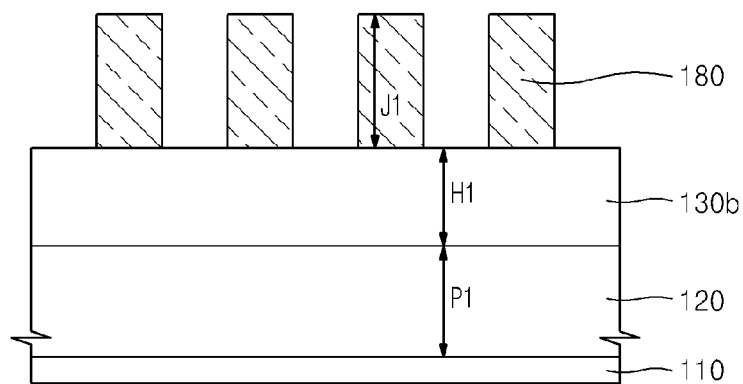

A structure shown in FIG. 9 is formed from the structure shown in FIG. 8, via operations S412 and S413.

First, the third pattern 140d is exposed when the second pattern 150d is removed. The exposed third pattern 140d is etched.

Figure 9E:
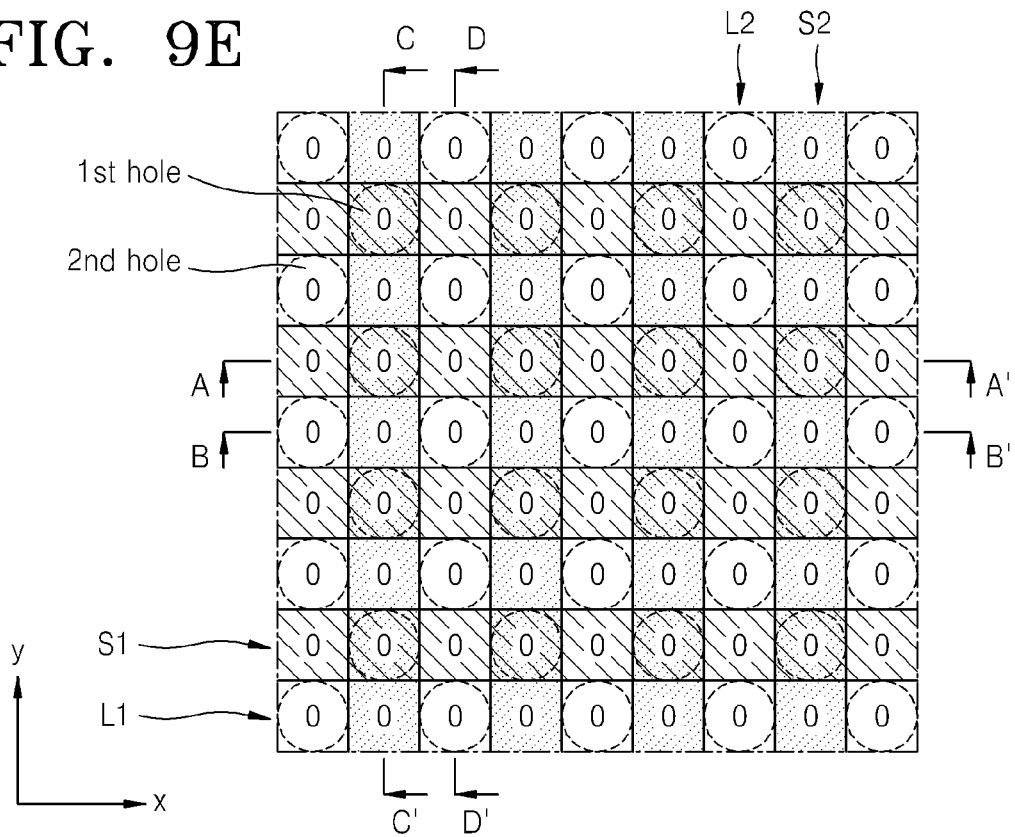

FIG. 9E is a plan view showing the fourth material layer 140, in detail, the third pattern 140d of the fourth material layer 140 in FIG. 9 with its thickness. Dashed circles in FIG. 9E show locations of the first hole pattern $1^{ST}$ HOLE and second hole pattern $2^{ND}$ HOLE, which are to be formed on a semiconductor device that is finally formed according to the method of the current embodiment, for convenience.

Referring to FIG. 9E, a thickness of the third pattern 140d is 0 in the portion where the first space pattern S1 and the second space pattern S2 cross each other (the portion where the first hole pattern $1^{ST}$ HOLE is formed via a following process), and is 0 in the portion where the first line pattern L1 and the second line pattern L2 cross each other (the portion where the second hole pattern $2^{ND}$ HOLE is formed via a following process). Also, the thickness of the third pattern 140d is 0 in the portion where the first space pattern S1 and the second line pattern L2 cross each other, and is 0 in the portion where the second space pattern S2 and the first line pattern L1 cross each other.

Accordingly, a predetermined pattern of the fourth material layer 140 is completely removed in FIG. 9. However, by removing the third pattern 140d of FIG. 8 that is disposed in the portion corresponding to the second hole pattern $2^{ND}$ HOLE, the portion that is exposed and opened by the pattern 180 becomes identical to the portion where the second hole pattern $2^{ND}$ HOLE is to be formed.

Figure 9F:
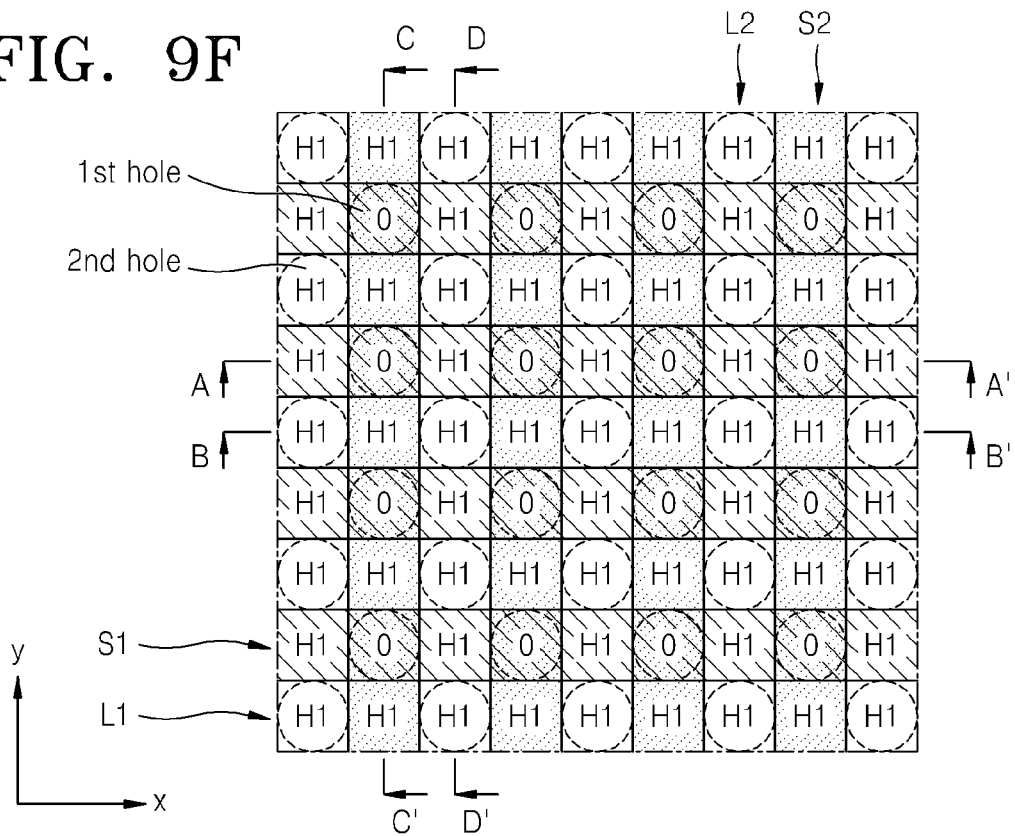

FIG. 9F is a plan view showing the third material layer 130, in detail, the pattern 130b of the third material layer 130 in FIG. 9 with its thickness. Dashed circles in FIG. 9F show locations of the first hole pattern $1^{ST}$ HOLE and second hole pattern $2^{ND}$ HOLE, which are to be formed on a semiconductor device that is finally formed according to the method of the current embodiment.

Referring to FIG. 9F, a thickness of the pattern 130b is 0 in the portion where the first space pattern S1 and the second space pattern S2 cross each other (the portion where the first hole pattern $1^{ST}$ HOLE is formed via a following process), and is H1 in the portion where the first line pattern L1 and the second line pattern L2 cross each other (the portion where the second hole pattern $2^{ND}$ HOLE is formed via a following process). The thickness of the pattern 130b is H1 in the portion where the first space pattern S1 and the second line pattern L2 cross each other, and is H1 in the portion where the second space pattern S2 and the first line pattern L1 cross each other.

Accordingly, the pattern 130b is opened in the portion where the first hole pattern $1^{ST}$ HOLE is formed, and has a uniform thickness H1 in other portions in FIG. 9.

Figure 10:
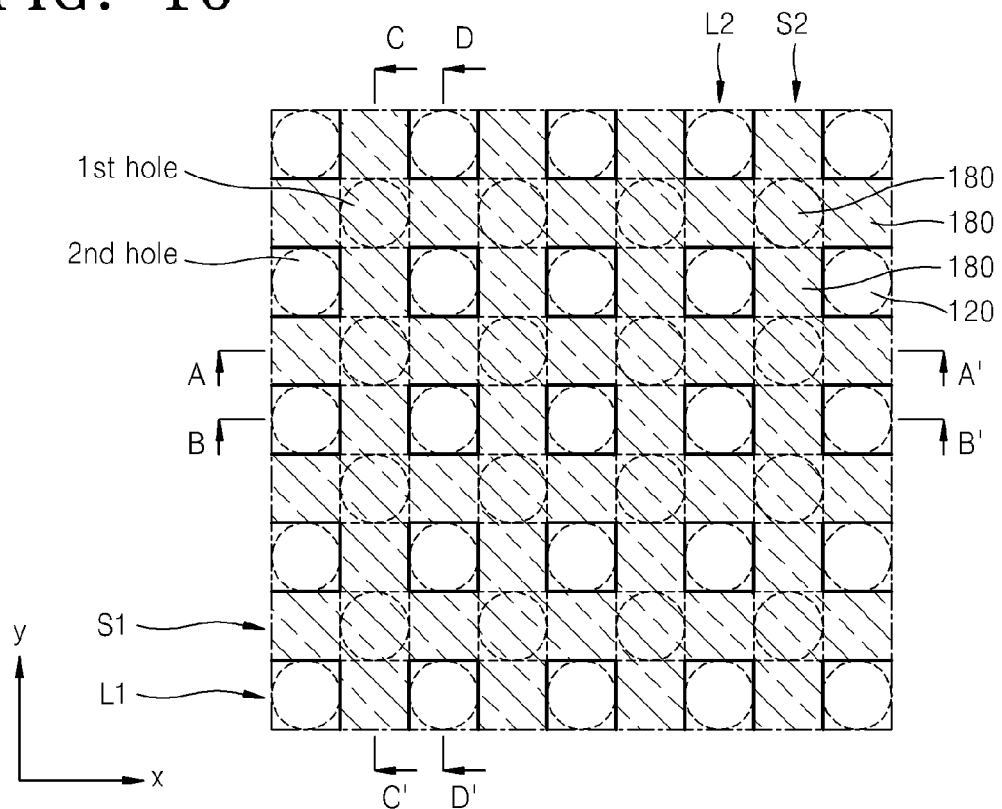
Figure 10A:
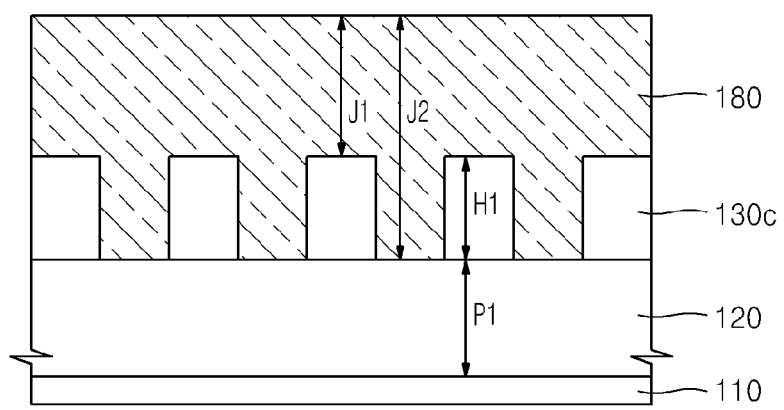
Figure 10B:
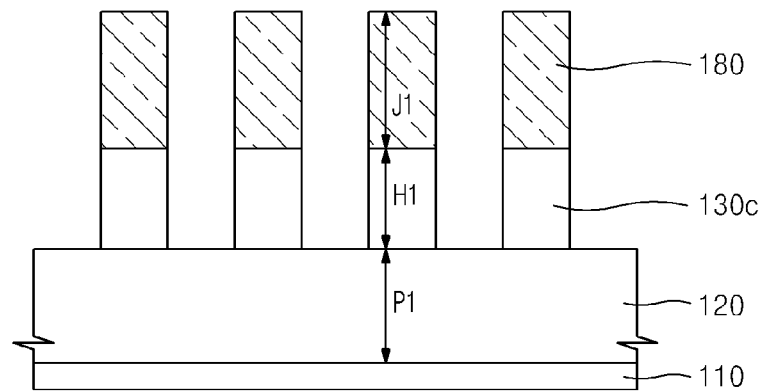
Figure 10C:
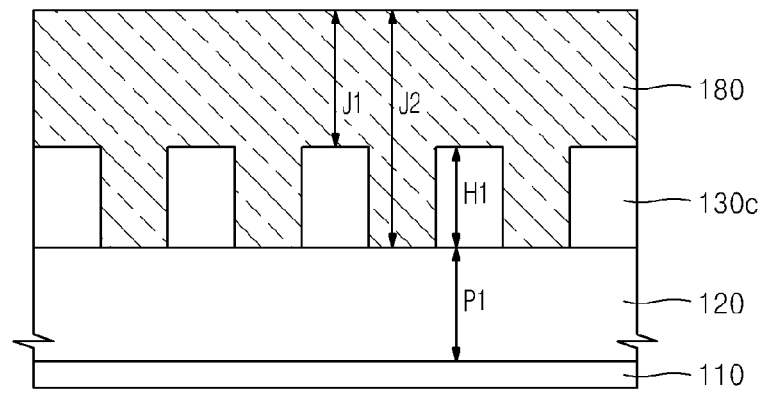
Figure 10D:
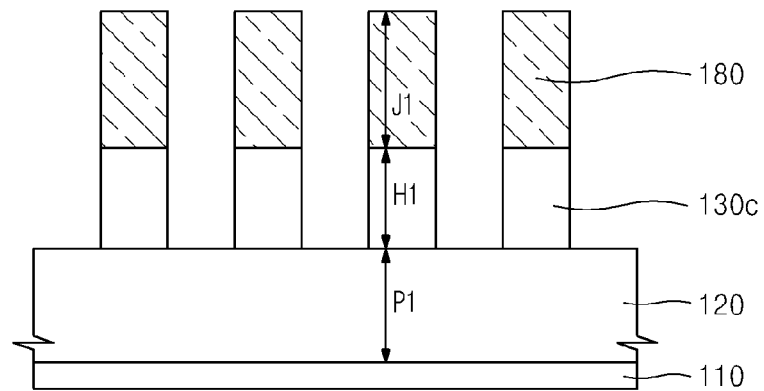

A structure shown in FIG. 10 is formed from the structure shown in FIG. 9, via operation S414.

The second pattern 130c is formed by removing the pattern 130b exposed by the pattern 180. Since the etching rates of the third material layer 130 and the eighth material layer are different from each other, for example, the etching rates may be significantly different such that an etching selectivity between silicon oxide and polysilicon is higher than 1, the pattern 180 of the eighth material layer may operate as an etch mask while etching the pattern 130b.

Figure 10E:
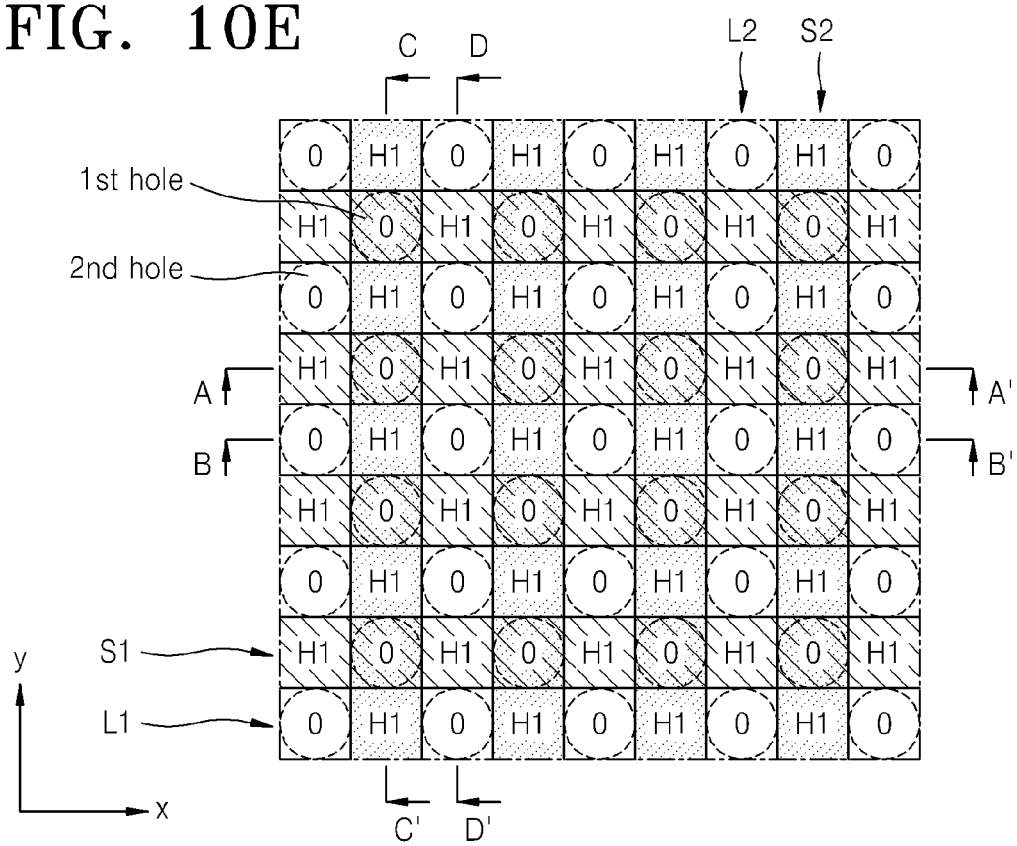

FIG. 10E is a plan view showing the third material layer 130, in detail, the second pattern 130c of the third material layer 130 in FIG. 10 with its thickness. Dashed circles in FIG. 10E show locations of the first hole pattern $1^{ST}$ HOLE and second hole pattern $2^{ND}$ HOLE, which are to be formed on a semiconductor device that is finally formed according to the method of the current embodiment.

Referring to FIG. 10E, a thickness of the second pattern 130c is 0 in the portion where the first space pattern S1 and the second space pattern S2 cross each other (the portion where the first hole pattern $1^{ST}$ HOLE is formed via a following process), and is 0 in the portion where the first line pattern L1 and the second line pattern L2 cross each other (the portion where the second hole pattern $2^{ND}$ HOLE is formed via a following process). Also, the thickness of the second pattern 130c is H1 in the portion where the first space pattern S1 and the second line pattern L2 cross each other, and is H1 in the portion where the second space pattern S2 and the first line pattern L1 cross each other.

The second pattern 130c is opened in both portions corresponding to the first hole pattern $1^{ST}$ HOLE and the second hole pattern $2^{ND}$ HOLE, and has a uniform thickness of H1 in the other portions. Accordingly, the first and second hole patterns $1^{ST}$ HOLE and $2^{ND}$ HOLE are formed in FIG. 10.

Figure 11:
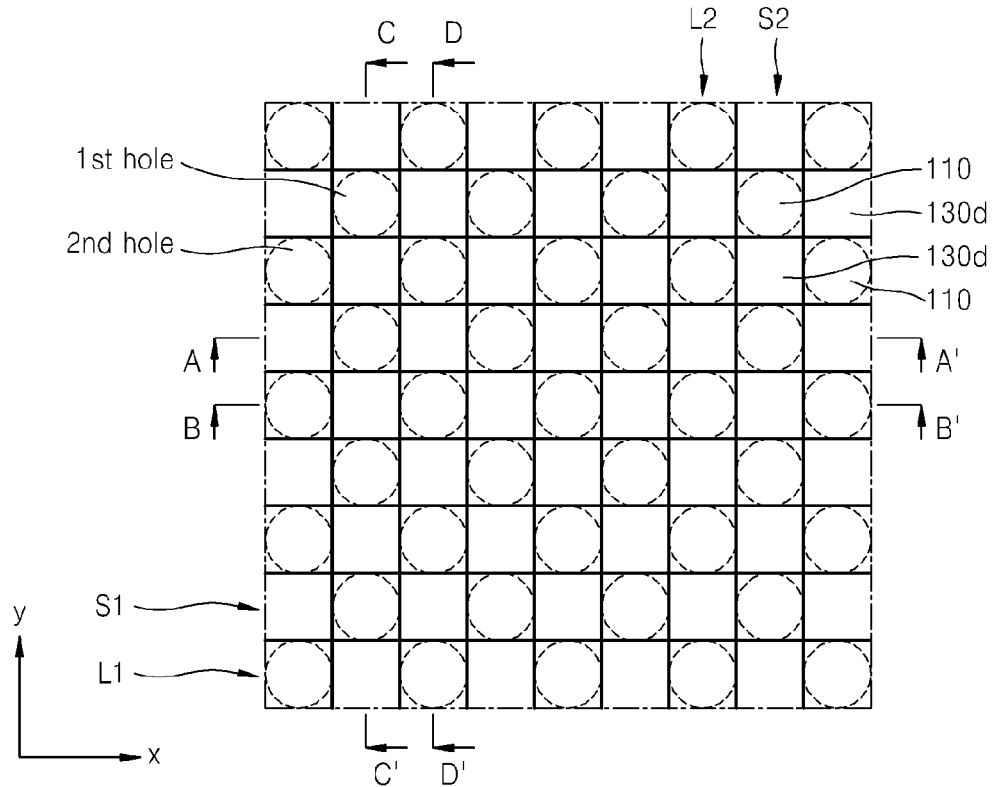
Figure 11A:
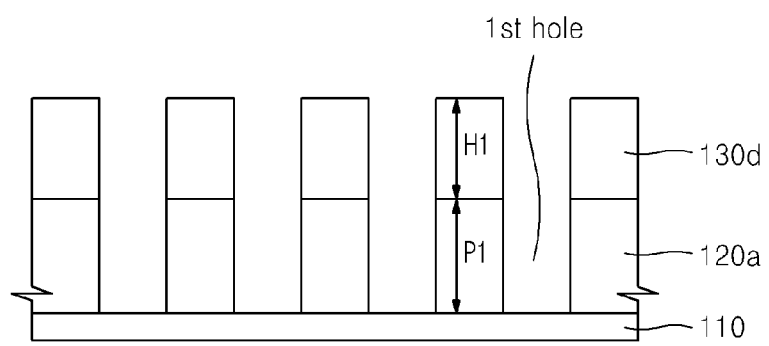
Figure 11B:
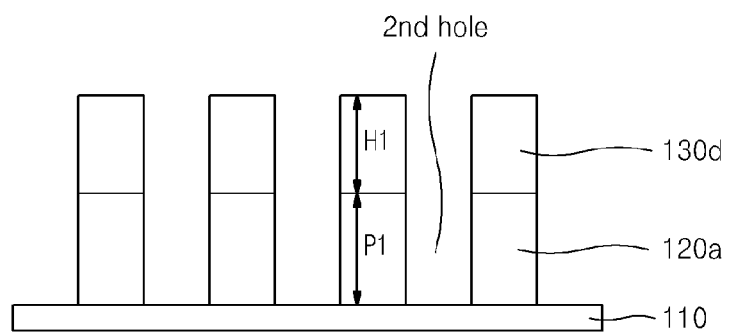
Figure 11C:
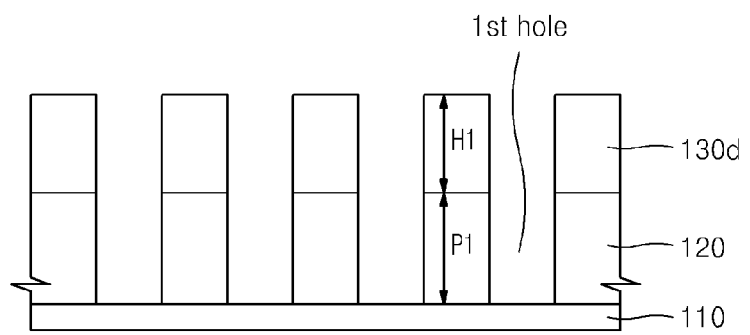
Figure 11D:
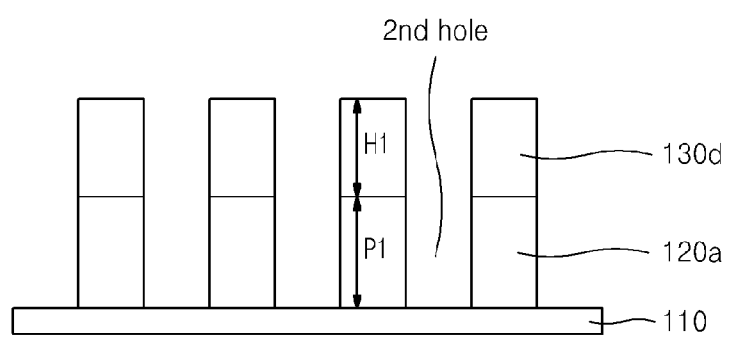

A structure shown in FIG. 11 is formed from the structure shown in FIG. 10, via operation S415.

The first and second hole patterns $1^{ST}$ HOLE and $2^{ND}$ HOLE are already formed on the second pattern 130c in FIG. 10. If the first and second hole patterns $1^{ST}$ HOLE and $2^{ND}$ HOLE are to be continuously formed on the second material layer 120 constituting a lower layer, the pattern 120a is formed by removing the second material layer 120 exposed by the second pattern 130c. Here, the pattern 120a also includes the first and second hole patterns $1^{ST}$ HOLE and $2^{ND}$ HOLE.

When a cover layer (not shown) formed of the same material as the eighth material layer is formed to cover the entire surface of the structure shown in FIG. 10 and an etch back process is performed on the cover layer, the cover layer and the pattern 180 are removed, and the second material layer 120 exposed by the second pattern 130c is continuously removed, thereby forming the pattern 120a.

An upper surface of the second pattern 130c may be partially removed while forming the pattern 120a, and thus, a second pattern of the third material layer 130 is indicated with a reference numeral 130d in FIG. 11.

Figure 11E:
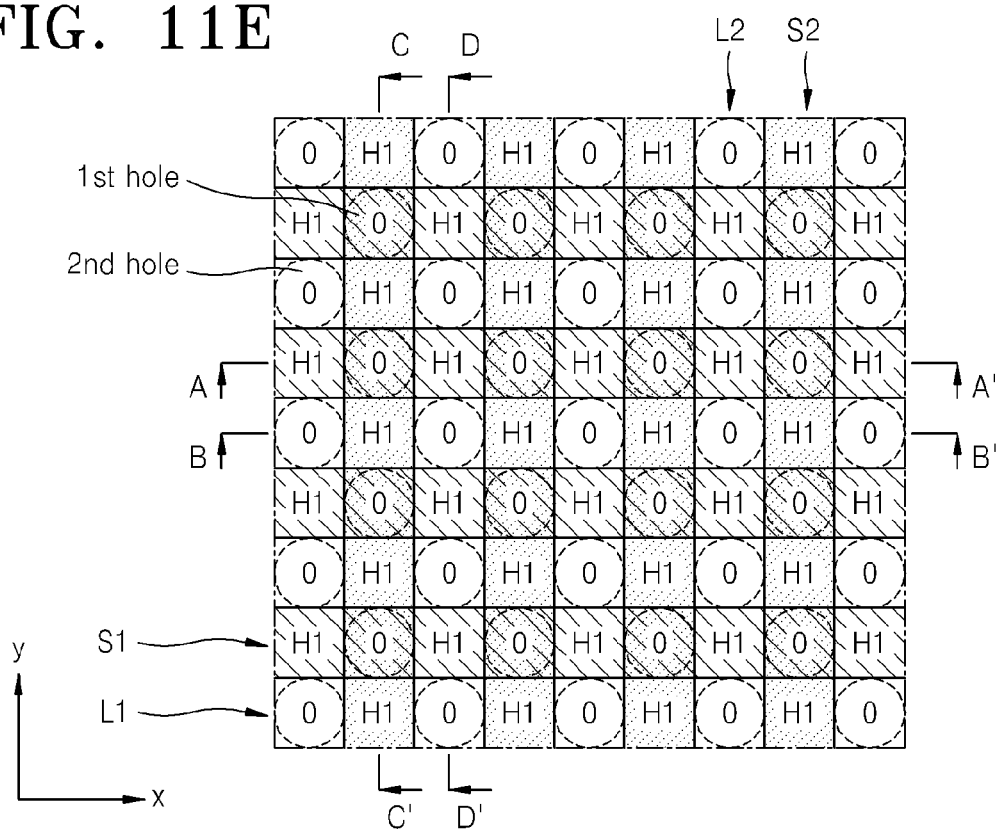
Figure 11F:
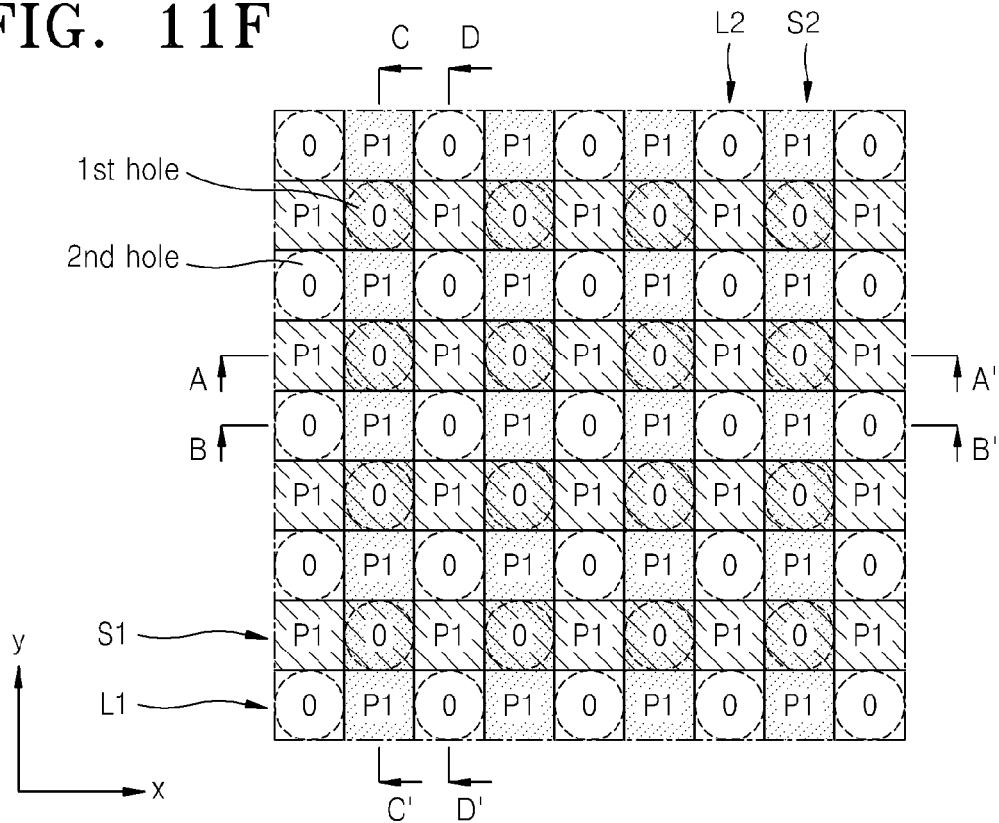
FIGS. 11F and 15F are exemplary plan views showing a second material layer respectively in FIGS. 11 and 15 with its thickness.

FIG. 11E is a plan view showing the third material layer 130, in detail, the second pattern 130d of the third material layer 130 in FIG. 11 with its thickness, and FIG. 11F is a plan view showing the second material layer 120, in detail, the pattern 120a of the second material layer 120 of FIG. 11 with its thickness.

Referring to FIGS. 11E and 11F, a predetermined pattern of the second material layer 120 and a predetermined pattern of the third material layer 130 exist in both portions where the first space pattern S1 and the second line pattern L2 cross each other and where the second space pattern S2 and the first line pattern L1 cross each other, are opened in the portion where the first space pattern S1 and the second space pattern S2 cross each other to form the first hole pattern $1^{ST}$ HOLE, and are opened in the portion where the first line pattern L1 and the second line pattern L2 cross each other to form the second hole pattern $2^{ND}$ HOLE.

Next, operation S400 according to another embodiment is described.

Figure 1F:
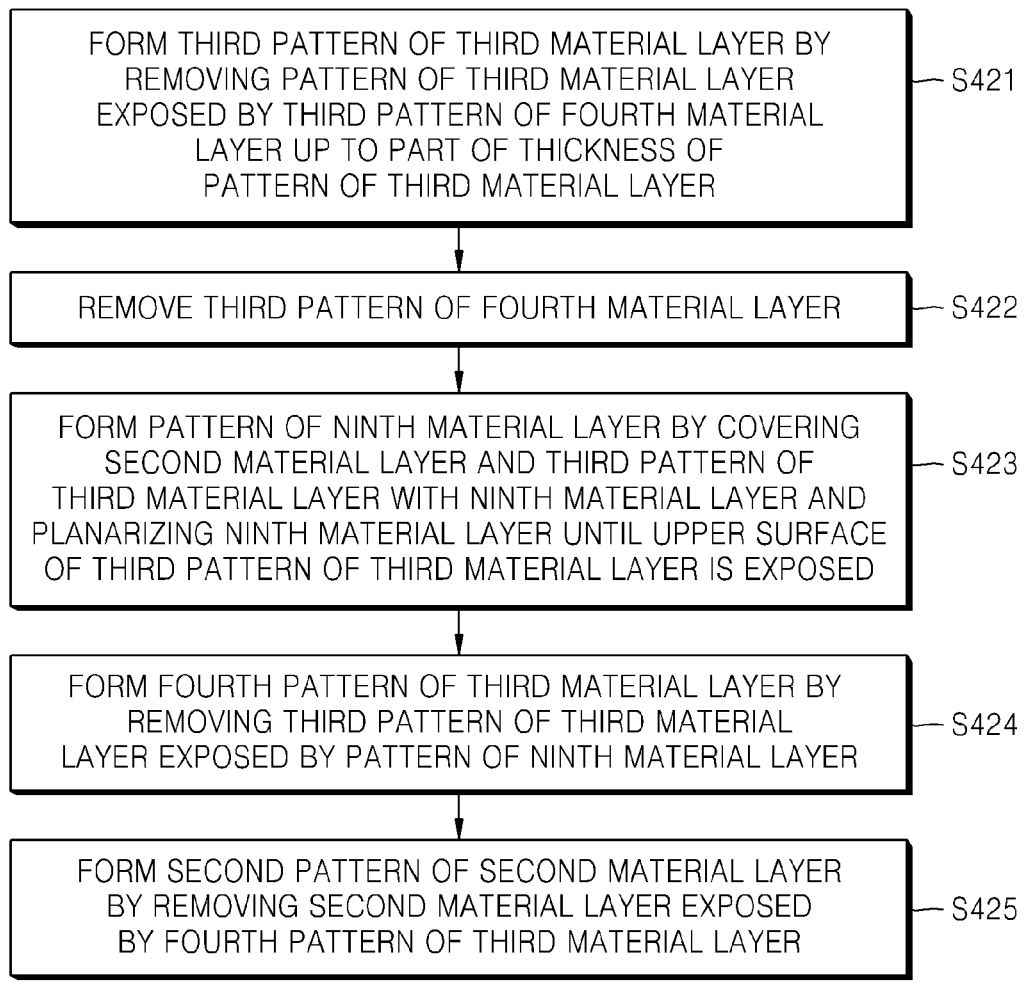
FIG. 1F is a flowchart illustrating processes of the forming of a second hole pattern of the method of FIG. 1A, according to another exemplary embodiment.

FIG. 1F is a flowchart illustrating processes of operation S400 of the method of FIG. 1A, according to another exemplary embodiment, and FIGS. 12 through 15 are plan views for describing the processes of operation S400. Also, FIGS. 12A through 12D are cross-sectional views respectively taken along lines A-A', B-B', C-C', and D-D' of FIG. 12, FIGS. 13A through 13D are cross-sectional views respectively taken along lines A-A', B-B', C-C', and D-D' of FIG. 13, FIGS. 14A through 14D are cross-sectional views respectively taken along lines A-A', B-B', C-C', and D-D' of FIG. 14, and FIGS. 15A through 15D are cross-sectional views respectively taken along lines A-A', B-B', C-C', and D-D' of FIG. 15.

Referring to FIGS. 1F, 12 through 15, 12A through 12D, 13A through 13D, 14A through 14D, and 15A through 15D, operation S400, involving forming of the second hole pattern $2^{ND}$ HOLE where the first line pattern L1 and the second line pattern L2 cross each other, includes forming a third pattern 130e by removing the pattern 130b exposed by the third pattern 140d up to a part H3 of thickness of the pattern 130b (operation S421), removing a third pattern 140e of the fourth material layer 140 (operation S422), forming a pattern 190 of a ninth material layer (not shown) by covering a second material layer 120e and the third pattern 130e with the ninth material layer and planarizing the ninth material layer until an upper surface of the third pattern 130e is exposed (operation S423), forming a fourth pattern 130f of the third material layer 130 by removing the third pattern 130e exposed by the pattern 190 (operation S424), and forming a second pattern 120g of the second material layer 120 by removing the second material layer 120 exposed by the fourth pattern 130f (operation S425).

Figure 12:
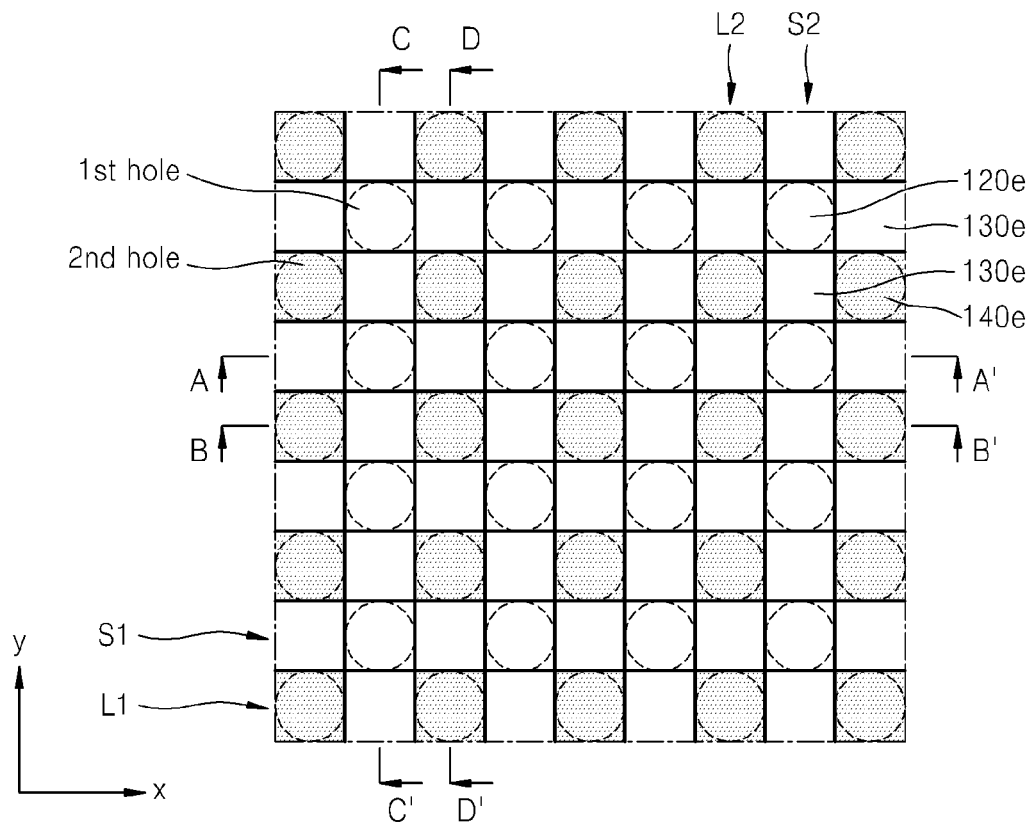
FIGS. 12 through 15 are plan views for describing forming of a second hole pattern, according to another exemplary embodiment.
Figure 12A:
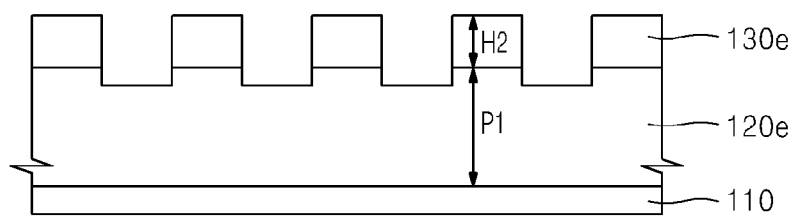

A structure shown in FIG. 12 is formed from the structure shown in FIG. 7, via operation S421.

The third pattern 130e is formed by removing the pattern 130b exposed by the third pattern 140d only up to the part H3 of the thickness H1 of the pattern 130b. Also, since the upper surface of the second material layer 120 exposed in the portion corresponding to the second space pattern S2 may be partially removed while forming the third pattern 130e, the second material layer 120 is indicated as the second material layer 120e in FIG. 12.

Figure 12B:
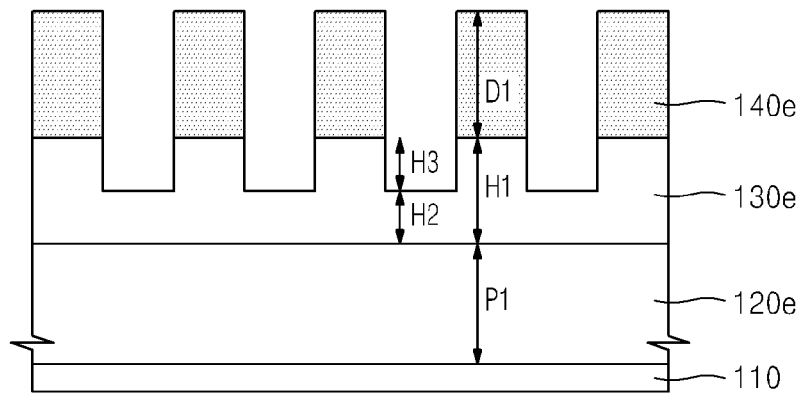
Figure 12C:
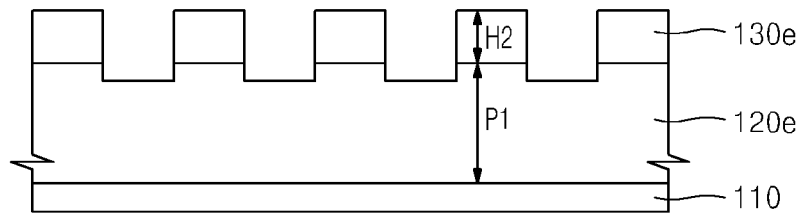
Figure 12D:
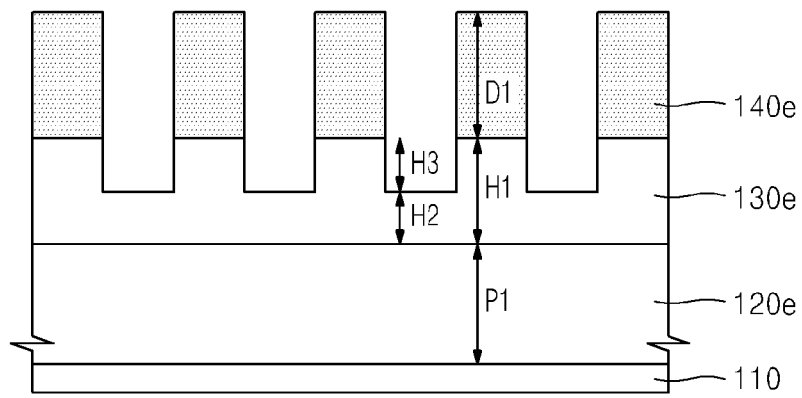
Figure 12E:
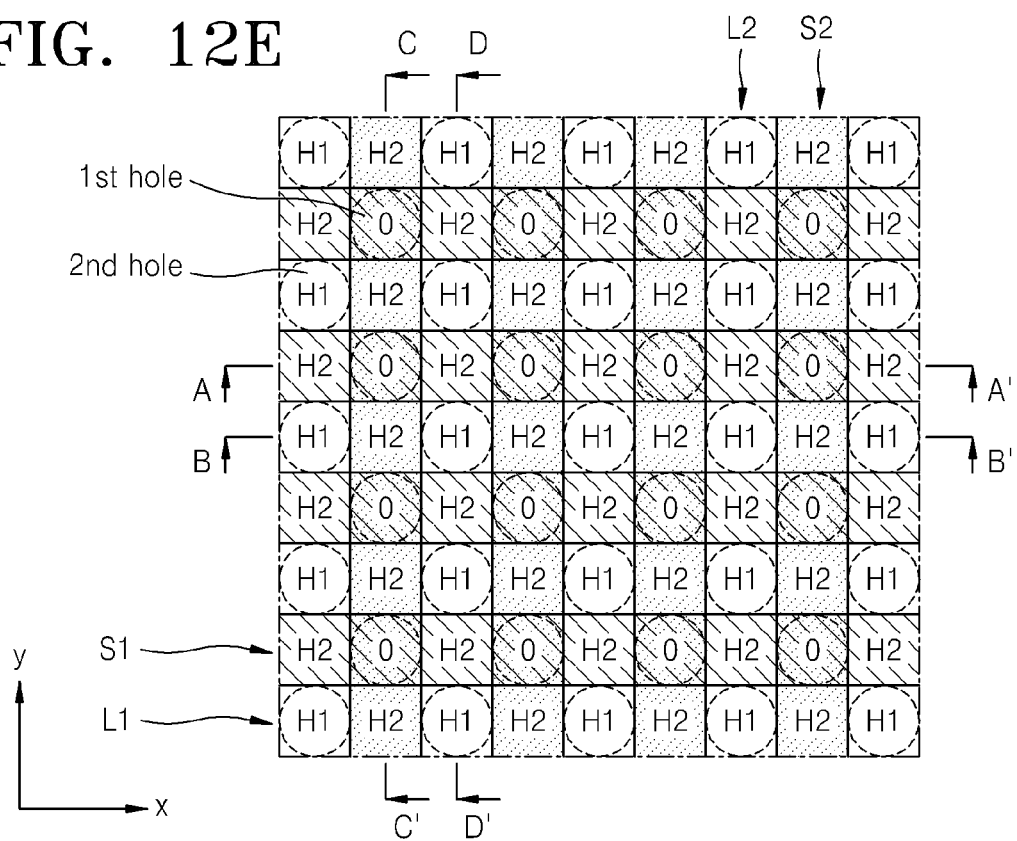

FIG. 12E is a plan view showing the third material layer 130 of in FIG. 12, in detail, the third pattern 130e of the third material layer 130 with its thickness. Dashed circles in FIG. 12E show locations of the first hole pattern $1^{ST}$ HOLE and second hole pattern $2^{ND}$ HOLE, which are to be formed on a semiconductor device that is finally formed according to the method of the current embodiment.

Referring to FIG. 12E, a thickness of the third pattern 130e is 0 in the portion where the first space pattern S1 and the second space pattern S2 cross each other (the portion where the first hole pattern $1^{ST}$ HOLE is formed via a following process), and is H1 in the portion where the first line pattern L1 and the second line pattern L2 cross each other (the portion where the second hole pattern $2^{ND}$ HOLE is formed via a following process). Also, the thickness of the third pattern 130e is H2 in the portion where the first space pattern S1 and the second line pattern L2 cross each other, and is H2 in the portion where the second space pattern S2 and the first line pattern L1 cross each other.

Accordingly, the third pattern 130e is opened only in the portion corresponding to the first hole pattern $1^{ST}$ HOLE, and has a predetermined thickness H1 or H2 in other portions in FIG. 12. Specifically, the third pattern 130e has the thickness H1 that is higher than the thickness H2 so that the portion corresponding to the second hole pattern $2^{ND}$ HOLE is higher than other portions.

Figure 13:
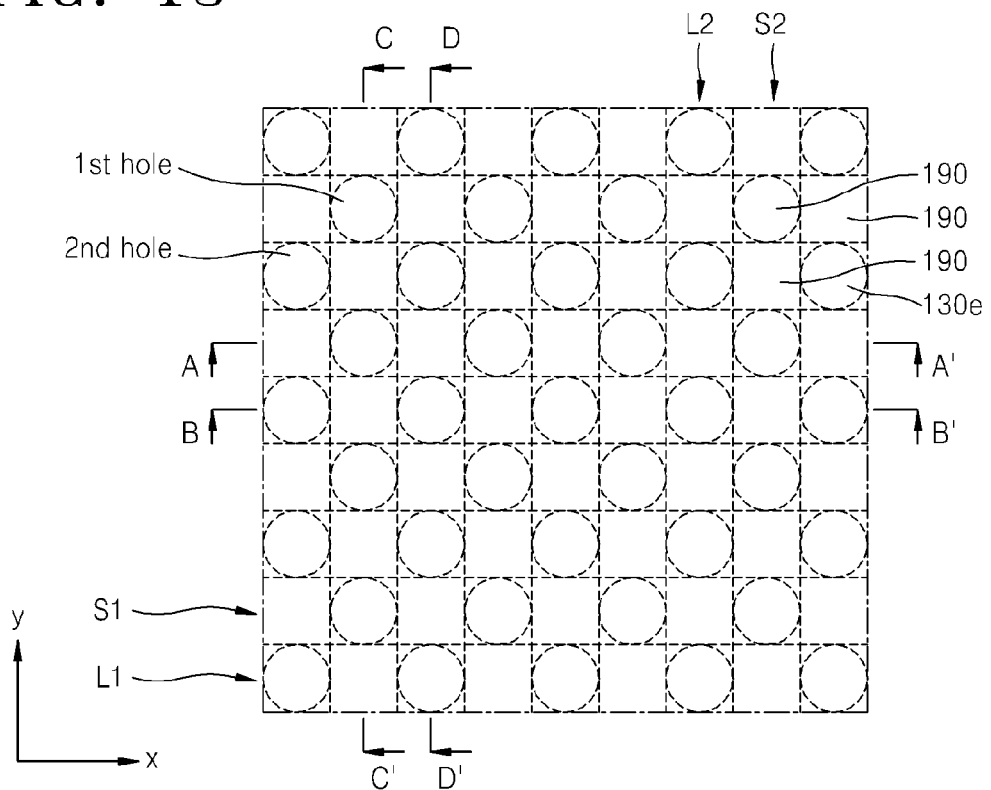
Figure 13A:
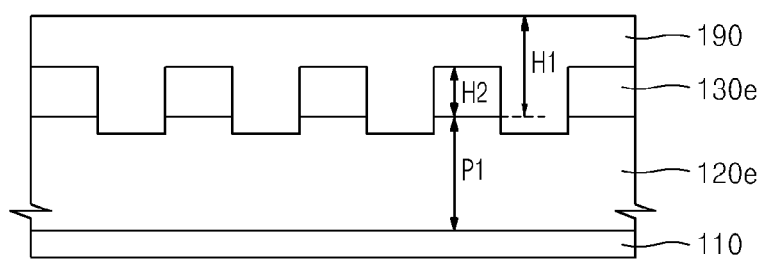
Figure 13B:
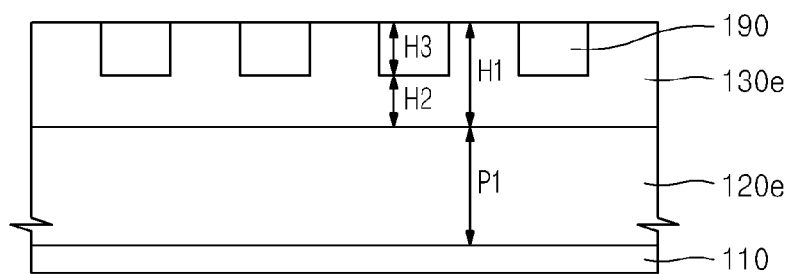
Figure 13C:
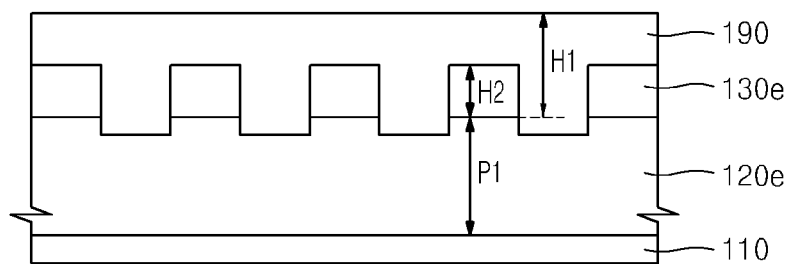
Figure 13D:
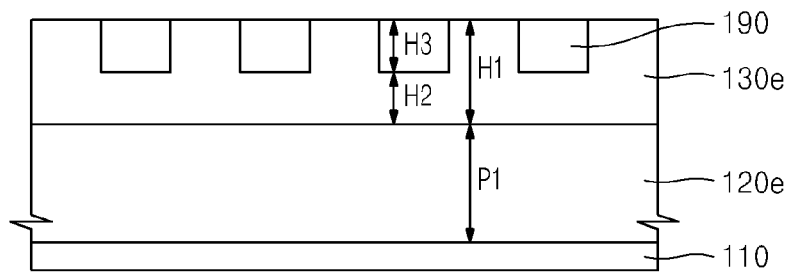

A structure shown in FIG. 13 is formed from the structure shown in FIG. 12, via operations S422 and S423.

The third pattern 140e is entirely removed. In FIG. 12, the third pattern 140e only exists in the portion corresponding to the second hole pattern $2^{ND}$ HOLE.

Next, the second material layer 120e and the third pattern 130e are covered by the ninth material layer, and the ninth material layer is planarized until the upper surface of the third pattern 130e is exposed, thereby forming the pattern 190. Since the upper surface of the third pattern 130e is higher in the portion corresponding to the second space pattern S2 than the portion corresponding to the first space pattern S1 (H1>H2), the upper surface of the pattern 190 in the portion corresponding to the first space pattern S1 is higher than the upper surface of the third pattern 130e, and the upper surface of the pattern 190 in the portion corresponding to the first line pattern L1 has the same height as the upper surface of the third pattern 130e.

Figure 13E:
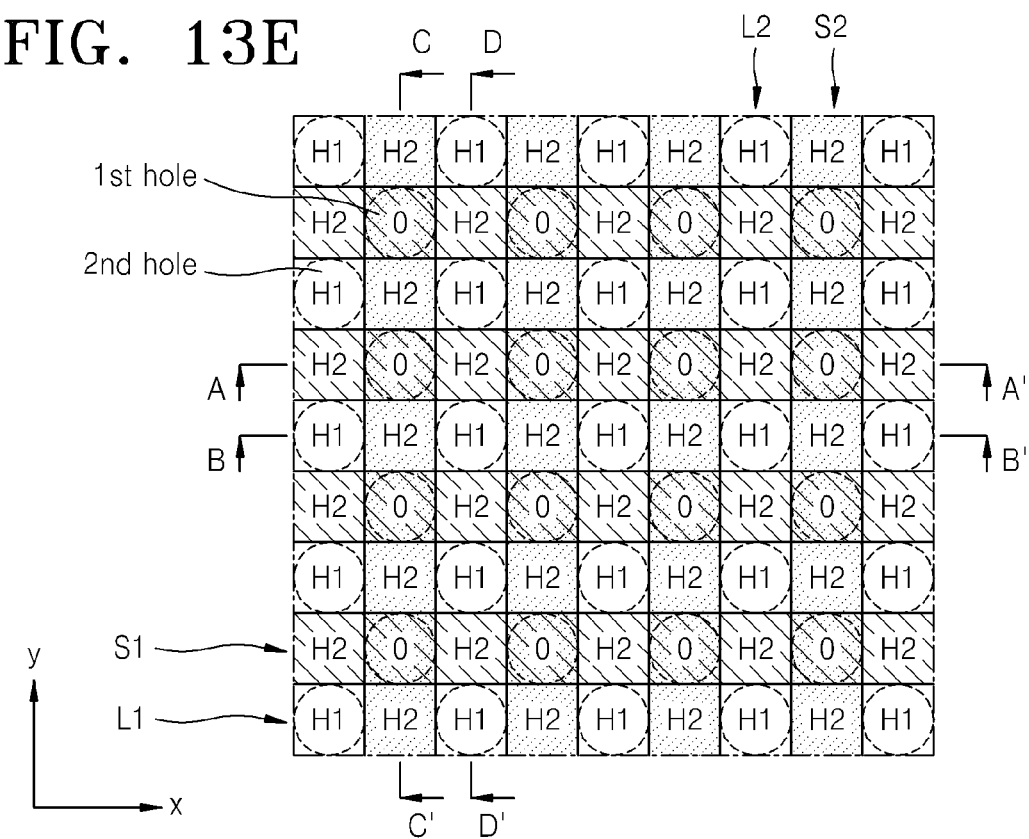

FIG. 13E is a plan view showing the third material layer 130 of FIG. 13, in detail, the third pattern 130e of the third material layer 130 with its thickness. Dashed circles in FIG. 13E show locations of the first hole pattern $1^{ST}$ HOLE and second hole pattern $2^{ND}$ HOLE, which are to be formed on a semiconductor device that is finally formed according to the method of the current embodiment.

Referring to FIG. 13E, a thickness of the third pattern 130e is 0 in the portion where the first space pattern S1 and the second space pattern S2 cross each other (the portion where the first hole pattern $1^{ST}$ HOLE is formed via a following process), and is H1 in the portion where the first line pattern L1 and the second line pattern L2 cross each other (the portion where the second hole pattern $2^{ND}$ HOLE is formed via a following process). Also, the thickness of the third pattern 130e is H2 in the portion where the first space pattern S1 and the second line pattern L2 cross each other, and is H2 in the portion where the second space pattern S2 and the first line pattern L1 cross each other.

Accordingly, the third pattern 130e is opened only in the portion corresponding to the first hole pattern $1^{ST}$ HOLE, and has a predetermined thickness H1 or H2 in other portions in FIG. 13. Specifically, the pattern 130e has the thickness H1 that is higher than the thickness H2 so that the portion corresponding to the second hole pattern $2^{ND}$ HOLE is higher than other portions.

Figure 14:
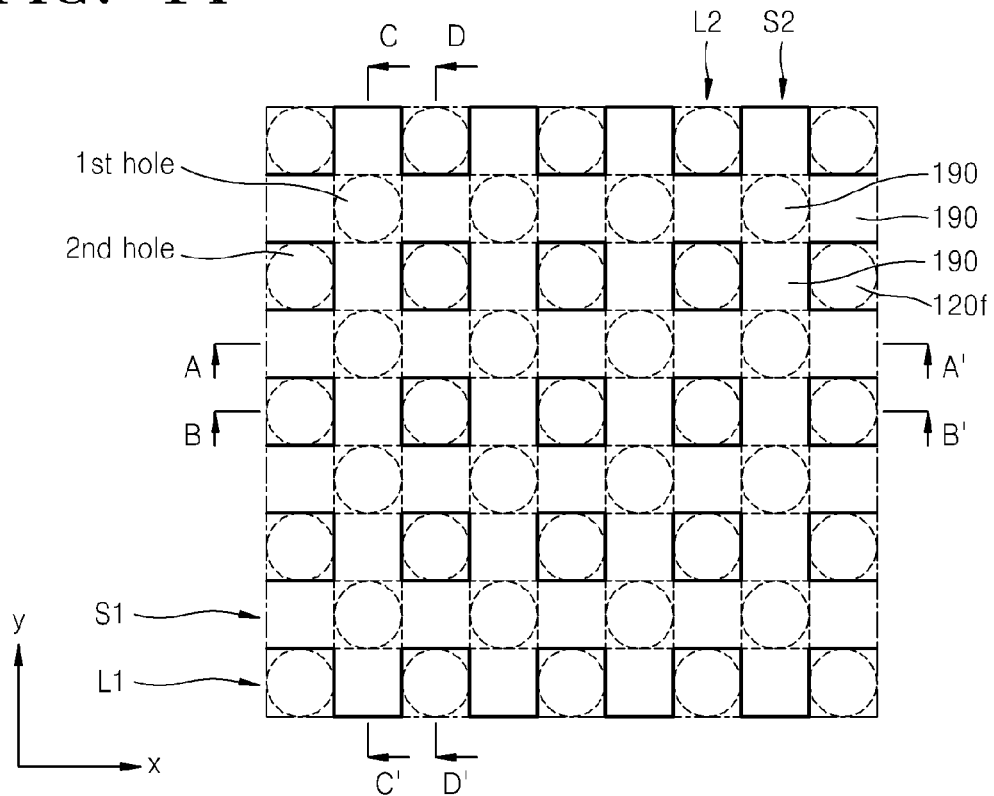
Figure 14A:
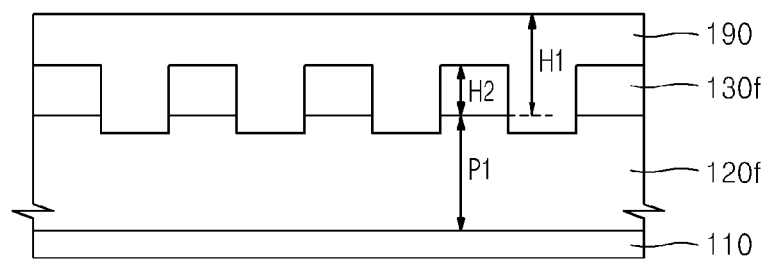
Figure 14B:
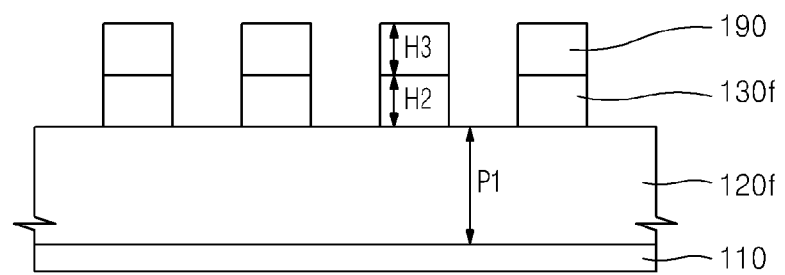
Figure 14C:
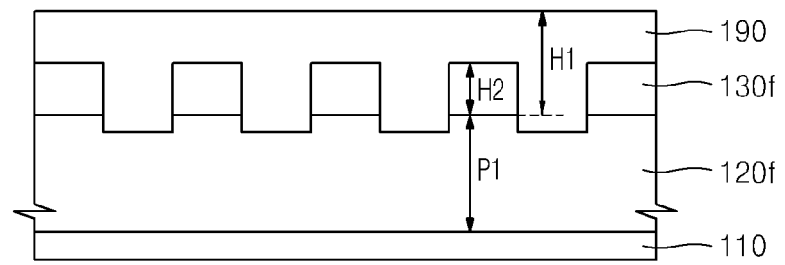
Figure 14D:
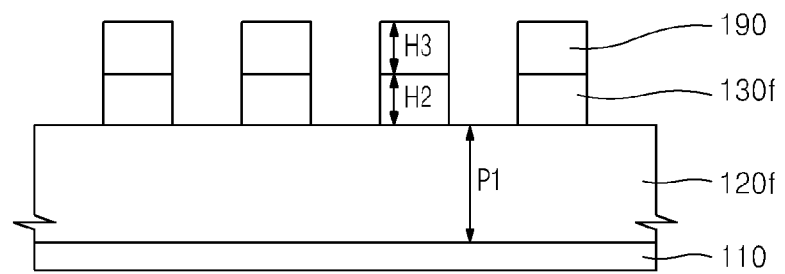

A structure shown in FIG. 14 is formed from the structure shown in FIG. 13, via operation SS424.

The third pattern 130e exposed by the pattern 190 is disposed in the portion corresponding to the second hole pattern $2^{ND}$ HOLE. Accordingly, the fourth pattern 130f includes a structure in which the second hole pattern $2^{ND}$ HOLE is opened.

Since an upper surface of the second material layer 120e exposed in the portion corresponding to the first line pattern L1 may be partially removed while forming the fourth pattern 130f, the second material layer 120e is indicated as a second material layer 120f in FIG. 14.

Figure 14E:
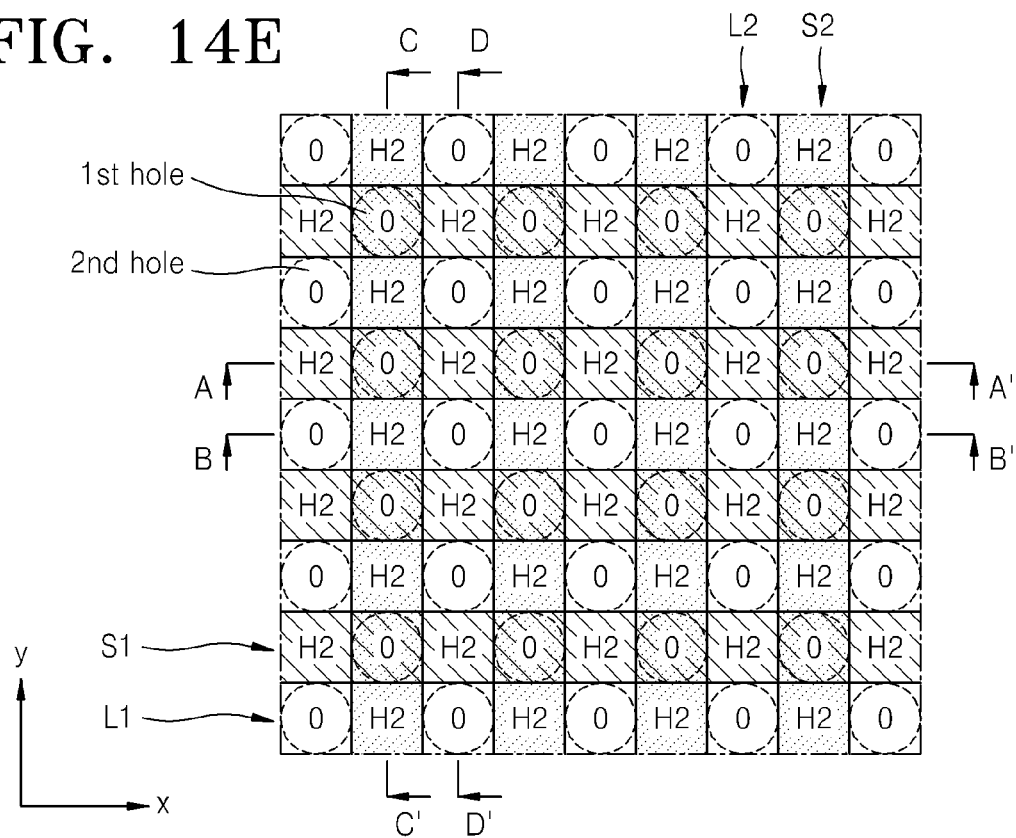

FIG. 14E is a plan view showing the third material layer 130, in detail, the fourth pattern 130f of the third material layer 130 in FIG. 14E with its thickness. Dashed circles in FIG. 14E show locations of the first hole pattern $1^{ST}$ HOLE and second hole pattern $2^{ND}$ HOLE, which are to be formed on a semiconductor device that is finally formed according to the method of the current embodiment.

Referring to FIG. 14E, a thickness of the fourth pattern 130f is 0 in the portion where the first space pattern S1 and the second space pattern S2 cross each other (the portion where the first hole pattern $1^{ST}$ HOLE is formed via a following process), and is 0 in the portion where the first line pattern L1 and the second line pattern L2 cross each other (the portion where the second hole pattern $2^{ND}$ HOLE is formed via a following process). Also, the thickness of the fourth pattern 130f is H2 in the portion where the first space pattern S1 and the second line pattern L2 cross each other, and is H2 in the portion where the second space pattern S2 and the first line pattern L2 cross each other.

Accordingly, the fourth pattern 130f is opened in both portions corresponding to the first and second hole patterns $1^{ST}$ HOLE and $2^{ND}$ HOLE, and has a uniform thickness H2 in other portions in FIG. 14. Thus, the first and second hole patterns $1^{ST}$ HOLE and $2^{ND}$ HOLE are formed in FIG. 14.

Figure 15:
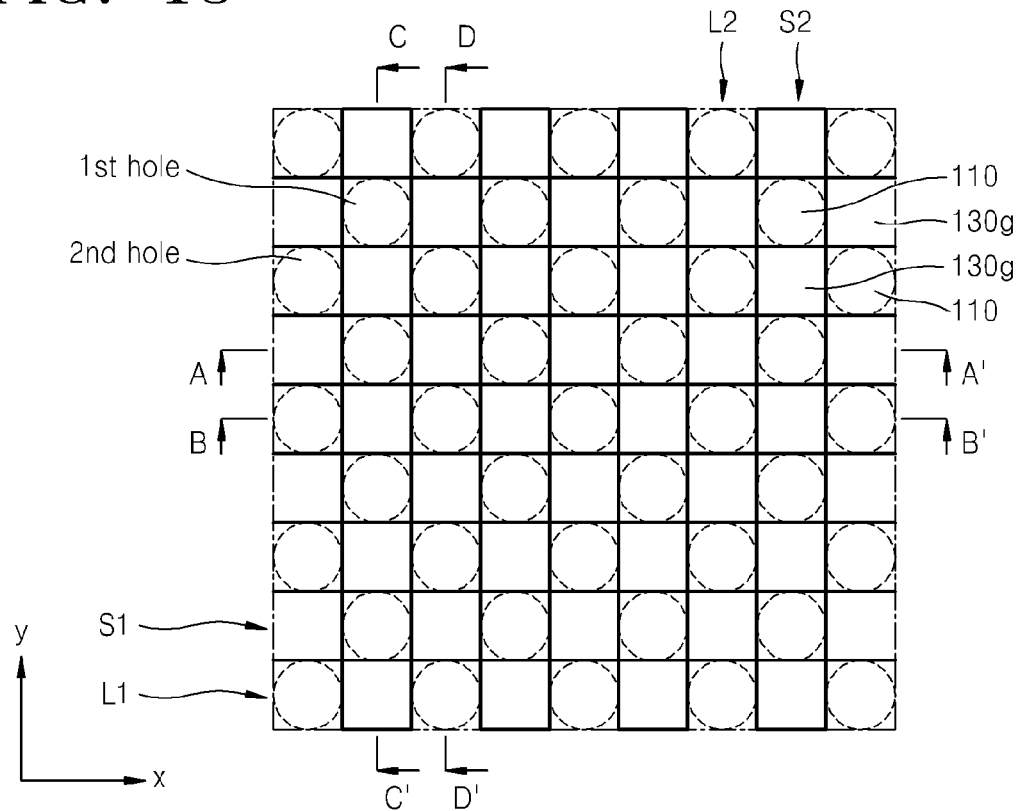
Figure 15A:
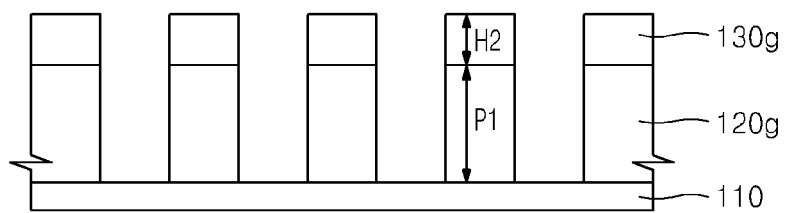
Figure 15B:
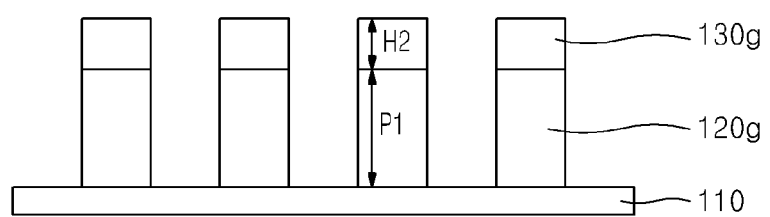
Figure 15C:
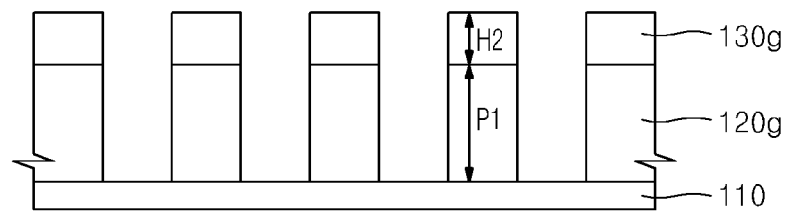
Figure 15D:
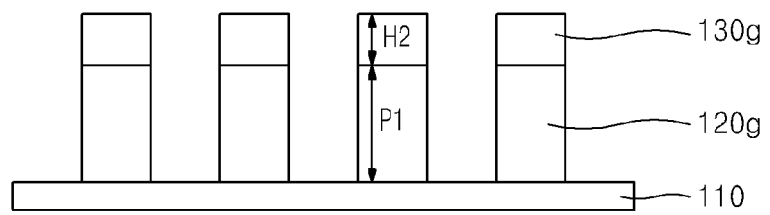

A structure shown in FIG. 15 is formed from the structure shown in FIG. 14, via operation S425.

The first and second hole patterns $1^{ST}$ HOLE and $2^{ND}$ HOLE are already formed in the fourth pattern 130f in FIG. 14. If the first and second hole patterns $1^{ST}$ HOLE and $2^{ND}$ HOLE are to be continuously formed on the second material layer 120f constituting a lower layer, the second pattern 120g is formed by removing the second material layer 120f exposed by the fourth pattern 130f. Here, the first and second hole patterns $1^{ST}$ HOLE and $2^{ND}$ HOLE are also formed in the second pattern 120g.

Since an upper surface of the fourth pattern 130f may be partially removed while forming the second pattern 120g, a fourth pattern of the third material layer 130 is indicated as a fourth pattern 130g in FIG. 15.

Figure 15E:
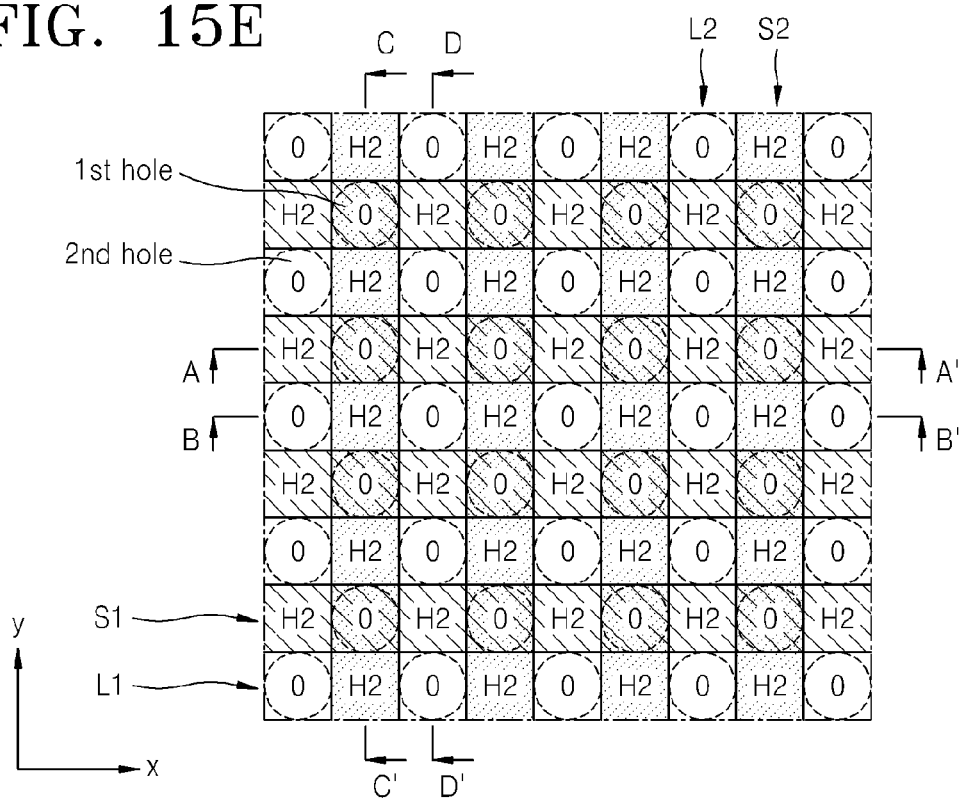
Figure 15F:
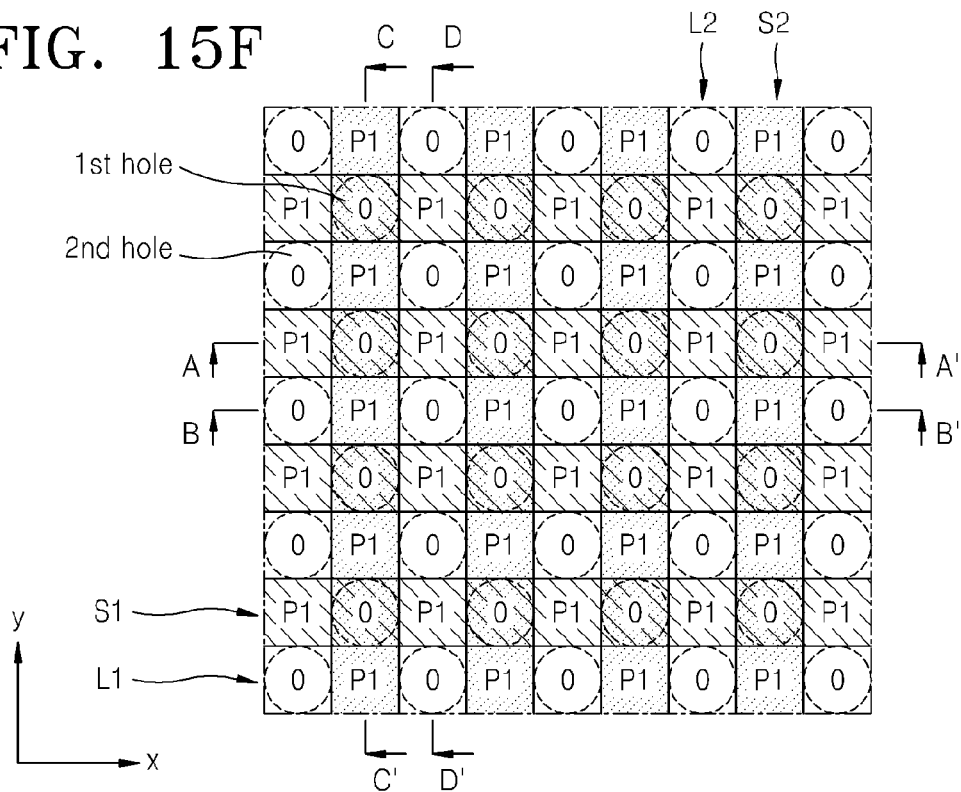

FIG. 15E is a plan view showing the third material layer 130, in detail, the fourth pattern 130g of the third material layer 130 in FIG. 15 with its thickness. FIG. 15F is a plan view showing the second material layer 120, in detail, the second pattern 120g of the second material layer 120 in FIG. 15 with its thickness.

Referring to FIGS. 15E and 15F, a predetermined pattern of the second material layer 120 and a predetermined pattern of the third material layer 130 exist in both portions where the first space pattern S1 and the second line pattern L2 cross each other and where the second space pattern S2 and the first line pattern L1 cross each other, are opened in the portion where the first space pattern S1 and the second space pattern S2 cross each other to form the first hole pattern $1^{ST}$ HOLE, and are opened in the portion where the first line pattern L1 and the second line pattern L2 cross each to form the second hole pattern $2^{ND}$ HOLE. As such, an array of holes including holes extending in two directions (when viewed from a plan view) and having a tightly compact configuration are created in two layers disposed on a substrate, by using two mask etching processes that occur at different times—e.g., a first etch mask process that uses a line pattern in a first direction, and a second etch mask process that uses a line pattern in a second direction. As a result, in one embodiment, groups of 4 adjacent holes are formed in a diamond shaped pattern with respect to the first direction and the second direction.

The embodiments of one exemplary method have been described above. Hereinafter, the embodiments will be described in a different perspective.

Figure 1G:
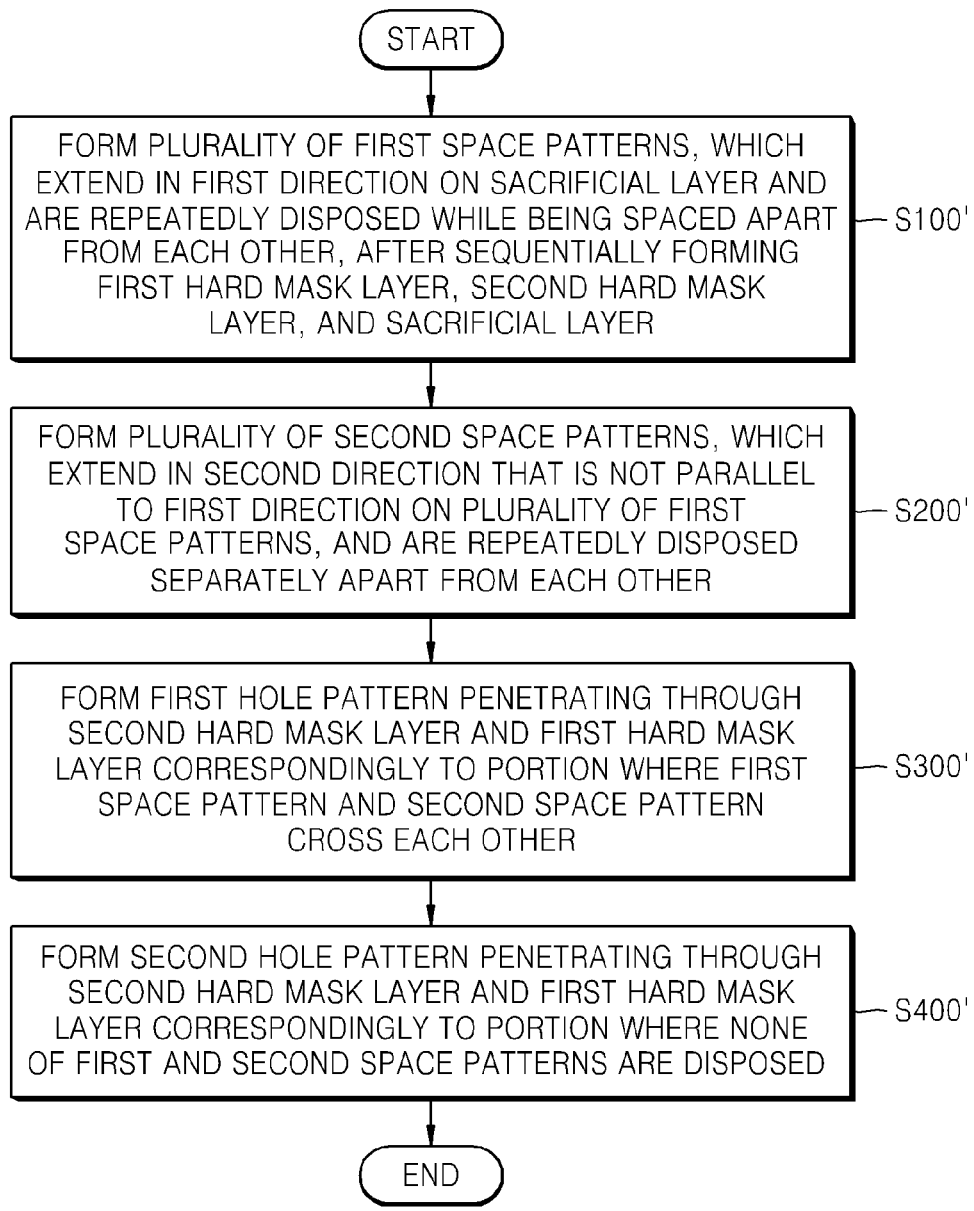
FIG. 1G is a flowchart illustrating a method of manufacturing a semiconductor device, according to another exemplary embodiment.
Figure 1H:
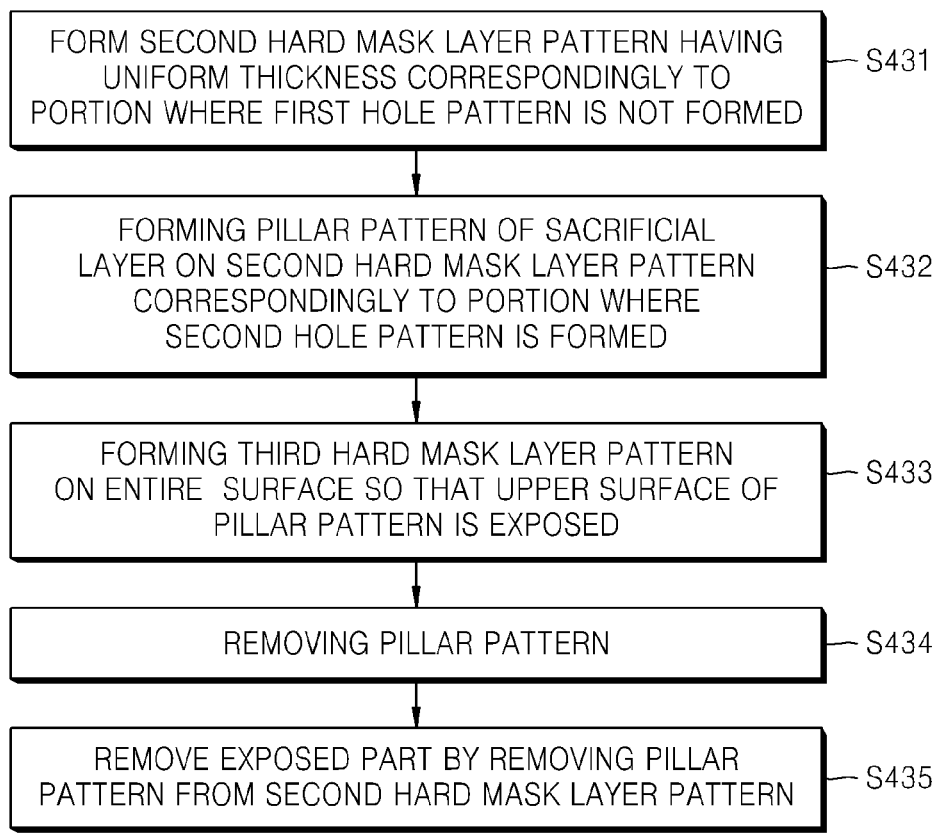
FIG. 1H is a flowchart illustrating processes of forming of a second hole pattern of the method of FIG. 1G, according to one exemplary embodiment.
Figure 1I:
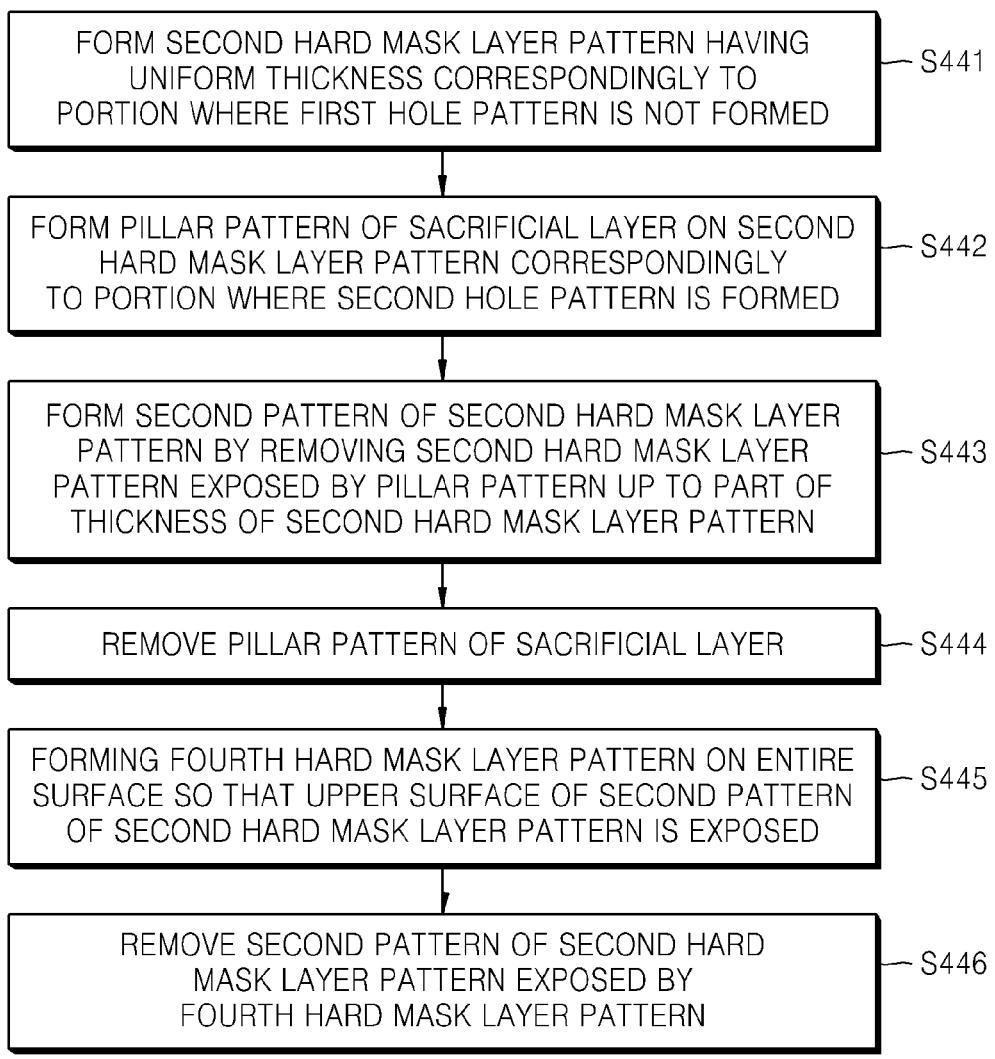
FIG. 1I is a flowchart illustrating processes of the forming of a second hole pattern of the method of FIG. 1G, according to another exemplary embodiment.

FIG. 1G is a flowchart illustrating a method of manufacturing a semiconductor device, according to another exemplary embodiment, FIG. 1H is a flowchart illustrating processes of operation S400' of the method of FIG. 1G, according to an embodiment of the present invention, and FIG. 1I is a flowchart illustrating processes of operation S400' of the method of FIG. 1G, according to another embodiment of the present invention.

Referring to FIGS. 1G, 1H, and 1I, the method includes forming the plurality of first space patterns S1 of FIG. 3, which extend in the first direction on the sacrificial layer 140 of FIG. 2B and are repeatedly disposed separately apart from each other, for example, in a parallel line arrangement, after sequentially forming the first hard mask layer 120 of FIG. 2B, the second hard mask layer 130 of FIG. 2B, and the sacrificial layer 140 of FIG. 2B (operation S100'), forming the plurality of second space patterns S2 of FIG. 5, which extend in the second direction that is not parallel to the first direction on the plurality of first space patterns S1 and are repeatedly disposed separately apart from each other (operation S200'), for example, in a parallel line arrangement, forming the first hole pattern $1^{ST}$ HOLE of FIGS. 6 and 7 that penetrates the second hard mask layer 130 and the first hard mask layer 120 correspondingly to the portion where the first space pattern S1 and the second space pattern S2 cross each other (operation S300'), and forming the second hole pattern $2^{ND}$ HOLE of FIGS. 10 and 11 that penetrates the second hard mask layer 130 and the first hard mask layer 120 correspondingly to portions where none of the first and second space patterns S1 and S2 are disposed (operation S400').

Operations S100' through S400' of FIG. 1G respectively have the same structures as operations S100 through S400 of FIG. 1A. However, the second material layer 120, the third material layer 130, and the fourth material layer 140 of FIG. 1A may be respectively a first hard mask layer 120, the second hard mask layer 130, and the sacrificial layer 140. Accordingly, descriptions about each operation of the method of FIG. 1G may be replaced by those of FIG. 1A, since technical aspects of the methods of FIGS. 1A and 1G are the same.

Referring to FIG. 1H, operation S400' according to an embodiment may include forming the second hard mask layer pattern 130a of FIG. 6 having a uniform thickness H1 of FIG. 6F correspondingly to the portion where the first hole pattern is not formed (operation S431), forming the pillar pattern 140d of FIGS. 7B and 7D of the sacrificial layer 140 on the second hard mask layer pattern 130a correspondingly to the portion where the second hole pattern is formed (operation S432), forming the third hard mask layer pattern 180 of FIG. 8 on the entire surface so that the upper surface of the pillar pattern 140d is exposed (operation S433), removing the pillar pattern 140d (operation S434), and removing an exposed part of the second hard mask layer pattern 130a by removing the pillar pattern 140d from the second hard mask layer pattern 130a (operation S435).

The structure shown in FIG. 6 is formed from the structure shown in FIG. 5, via operation S431.

The structure shown in FIG. 7 is formed from the structure shown in FIG. 6, via operation S432.

The structure shown in FIG. 8 is formed from the structure shown in FIG. 7, via operation S433.

The structure shown in FIG. 9 is formed from the structure shown in FIG. 8, via operation S434.

Also, the structure shown in FIG. 10 is formed from the structure shown in FIG. 9, via operation S435.

Descriptions about each operation are identical to those that have been described above with reference to the same diagrams, and thus, will not be repeated herein.

Referring to FIG. 11, operation S400' according to another embodiment may include forming the second hard mask layer pattern 130a of FIG. 6 having the uniform thickness H1 of FIG. 6F correspondingly to the portion where the first hole pattern is not formed (operation S441), forming the pillar pattern 140d of FIGS. 7B and 7D of the sacrificial layer 140 on the second hard mask layer pattern 130a correspondingly to the portion where the second hole pattern is formed (operation S442), forming the second pattern 130e of FIG. 12 of the second hard mask layer 130a by removing the second hard mask layer pattern 130a exposed by the pillar pattern 140d only up to the part H3 of FIGS. 12B and 12D of the thickness of the second hard mask layer pattern 130a (operation S443), removing the pillar pattern 140e of FIG. 12 (operation S444), forming the fourth hard mask layer pattern 190 of FIG. 13 on the entire surface so that the upper surface of the second pattern 130e of the second hard mask layer pattern 130a is exposed (operation S445), and removing the second pattern 130e exposed by the fourth hard mask layer pattern 190 from the second pattern 130e (operation S446).

The structure shown in FIG. 6 is formed from the structure shown in FIG. 5, via operation S441.

The structure shown in FIG. 7 is formed from the structure shown in FIG. 6, via operation S442.

The structure shown in FIG. 12 is formed from the structure shown in FIG. 7, via operation S443.

The structure shown in FIG. 13 is formed from the structure shown in FIG. 12, via operations S444 and S445.

The structure shown in FIG. 14 is formed from the structure shown in FIG. 13, via operation S446.

Descriptions about each operation are identical to those that have been described above with reference to the same diagrams, and thus, will not be repeated herein.

A method of forming a hole pattern by using a layout including a line pattern and a space pattern has been described above. The hole pattern may be used variously in a semiconductor device. For example, the hole pattern may be used as a contact pattern of a semiconductor device by filling the hole pattern with a conductive material. The contact pattern may electrically connect an upper structure above the hole pattern and a lower structure below the hole pattern. In the semiconductor device, the upper structure and the lower structure may each be at least one of an active region of a semiconductor substrate, a conductive pad, a transistor structure (e.g., a source, drain, or gate of a transistor, such as a MOSFET), a word line, a bit line, a lower electrode of a capacitor, an upper electrode of a capacitor, an interlayer wiring layer, and a rewiring pattern (e.g., to connect, in one embodiment, chip pads of a first chip to package substrate terminals of a package). In other embodiments, the holes may be filled with different materials to form part of a PRAM, 3-d NAND flash memory, RRAM, or other types of semiconductor memory devices.

Figure 16A:
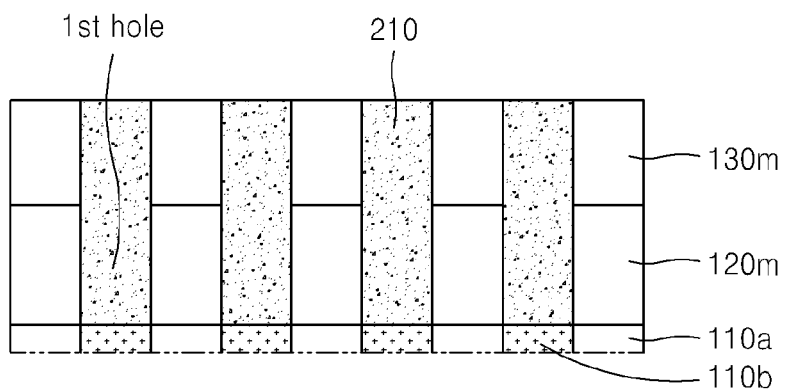
FIGS. 16A and 16B are cross-sectional views of a contact pattern formed by filling a hole pattern with a conductive material, which is formed according to a method of manufacturing a semiconductor device, according to one exemplary embodiment.
Figure 16B:
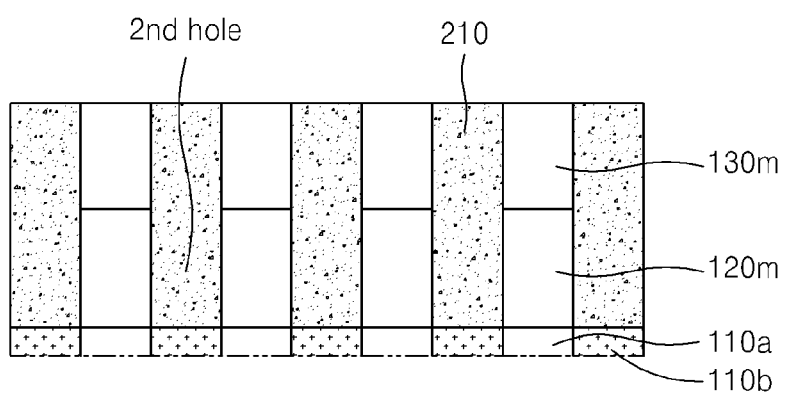

FIGS. 16A and 16B are cross-sectional views of a contact pattern formed by filling a hole pattern with a conductive material, which is formed according to a method of manufacturing a semiconductor device, according to one exemplary embodiment.

FIG. 16A is a cross-sectional view taken along a line A-A' of FIG. 2A that illustrates a semiconductor device manufactured by using the method according to one exemplary embodiment, and FIG. 16B is a cross-sectional view taken along a line B-B' of FIG. 2A.

Referring to FIGS. 16A and 16B, a hole pattern including a first hole pattern and a second hole pattern is defined as a predetermined pattern 120m of a second material layer and a predetermined pattern 130m of a third material layer.

The predetermined patterns 120m and 130m may respectively be the pattern 120a and the second pattern 130d shown in FIGS. 11A through 11D.

Alternatively, the predetermined patterns 120m and 130m may respectively be the second pattern 120g and the fourth pattern 130g shown in FIGS. 15A through 15D.

The hole pattern (the first and second hole patterns) defined as the predetermined patterns 120m and 130m are filled with a conductive material, and thus, a contact pattern 210 is formed.

Also, first material layers 110a and 110b formed below the hole pattern may be at least one of an active region of a semiconductor substrate, a conductive pad, a transistor structure, a word line, a bit line, a lower electrode of a capacitor, an upper electrode of a capacitor, an interlayer wiring layer, an insulation layer pattern, and a rewiring pattern. The first material layer 110 is not limited to a single layer, and may include various structures therein or thereon. For example, the first material layer 110b may be a conductive structure as it contacts the contact pattern 210, and the first material layer 110a may be an insulation structure separating the conductive structures.

Figure 17A:
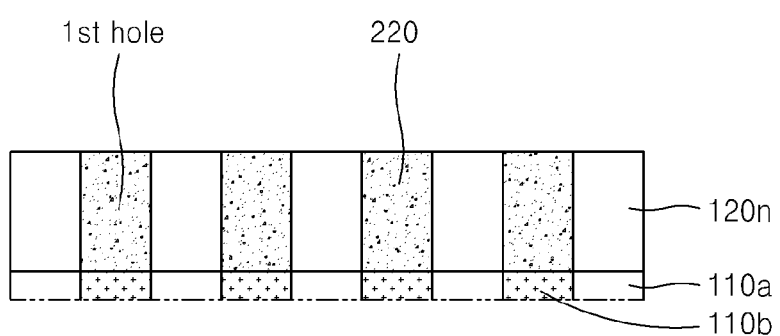
FIGS. 17A and 17B are cross-sectional views of a contact pattern formed by filling a hole pattern with a conductive material, which is formed according to a method of manufacturing a semiconductor device, according to another exemplary embodiment.
Figure 17B:
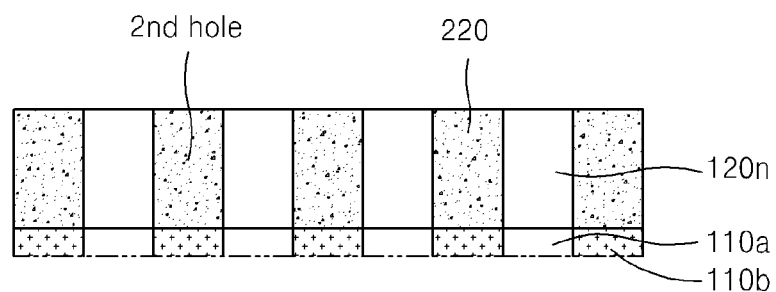

FIGS. 17A and 17B are cross-sectional views of a contact pattern formed by filling a hole pattern with a conductive material, which is formed according to a method of manufacturing a semiconductor device, according to another exemplary embodiment.

FIG. 17A is a cross-sectional view taken along a line A-A' of FIG. 2A that illustrates a semiconductor device manufactured by using the method according to another exemplary embodiment, and FIG. 17B is a cross-sectional view taken along a line B-B' of FIG. 2A.

Referring to FIGS. 17A and 17B, the hole pattern including a first hole pattern and a second hole pattern is defined as a predetermined pattern 120n of a second material layer.

The predetermined pattern 120n may be the pattern 120a from which the second pattern 130d shown in FIGS. 11A through 11D is removed.

Alternatively, the predetermined pattern 120n may be the second pattern 120g from which the fourth pattern 130g shown in FIGS. 15A through 15D is removed.

The hole pattern (the first and second hole patterns) defined as the predetermined pattern 120n is filled with a conductive material, thereby forming a contact pattern 220.

Also, the first material layers 110a and 110b formed below the hole pattern may be at least one of an active region of a semiconductor substrate, a conductive pad, a transistor structure, a word line, a bit line, a lower electrode of a capacitor, an upper electrode of a capacitor, an interlayer wiring layer, an insulation layer pattern, and a rewiring pattern. Also, the first material layer 110 is not limited to a single layer, and may include various structures therein or thereon. For example, the first material layer 110b may be a conductive structure as it contacts the contact pattern 220, and the first material layer 110a may be an insulation structure separating the conductive structures.

Figure 18A:
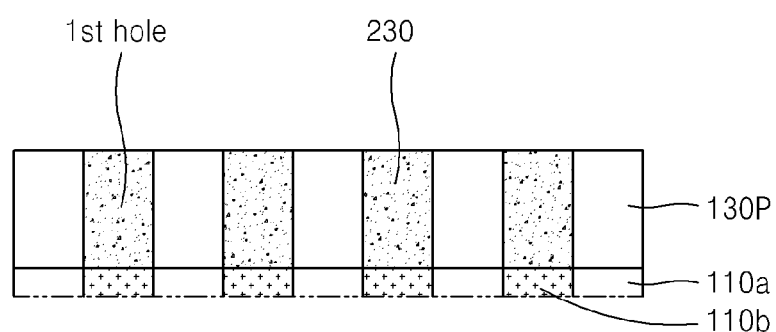
FIGS. 18A and 18B are cross-sectional views of a contact pattern formed by filling a hole pattern with a conductive material, which is formed according to a method of manufacturing a semiconductor device, according to another exemplary embodiment.
Figure 18B:
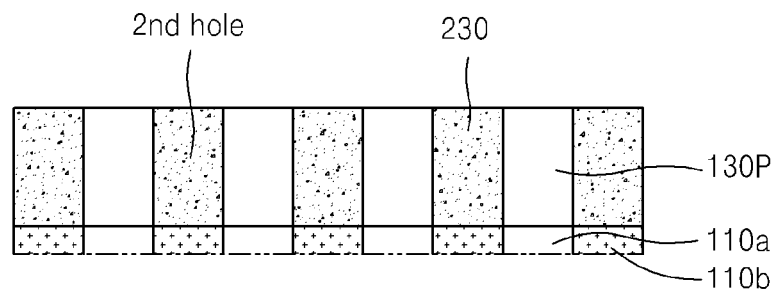

FIGS. 18A and 18B are cross-sectional views of a contact pattern formed by filling a hole pattern with a conductive material, which is formed according to a method of manufacturing a semiconductor device, according to another exemplary embodiment.

FIG. 18A is a cross-sectional view taken along a line A-A' of FIG. 2A that illustrates a semiconductor device manufactured by using the method according to another exemplary embodiment, and FIG. 18B is a cross-sectional view taken along a line B-B' of FIG. 2A.

Referring to FIGS. 18A and 18B, the hole pattern including first and second hole patterns is defined as a predetermined pattern 130p of a third material layer.

A structure shown in FIGS. 18A and 18B is formed from the initial stacked structure 100 of FIG. 2B, wherein the first, third, fourth, and fifth material layers 110, 130, 140, and 150 are sequentially stacked in the initial stacked structure 100, but the second material layer 120 is not stacked. Operations afterward are identical to those described with reference to FIGS. 3 through 15, except the description about the second material layer 120, and thus, descriptions about the operations afterward will not be repeated.

The predetermined pattern 130p may be the second pattern 130d of the third material layer 130 shown in FIGS. 11A through 11D.

Alternatively, the predetermined pattern 130p may be the fourth pattern 130g of the third material layer shown in FIGS. 15A through 15D.

A contact pattern 230 is formed by filling the hole pattern (the first and second hole patterns) defined as the predetermined pattern 130p with a conductive material.

Also, the first material layers 110a and 110b formed below the hole pattern may be at least one of an active region of a semiconductor substrate, a conductive pad, a transistor structure, a word line, a bit line, a lower electrode of a capacitor, an upper electrode of a capacitor, an interlayer wiring layer, an insulation layer pattern, and a rewiring pattern. Also, the first material layer 110 is not limited to a single layer, and may include various structures therein or thereon. For example, the first material layer 110b may be a conductive structure as it contacts the contact pattern 230, and the first material layer 110a may be an insulation structure separating the conductive structures.

As described above, a hole pattern is formed by using a layout including a line pattern and a space pattern. In other words, a photomask is manufactured by using the layout including the line pattern and the space pattern, and a plurality of hole patterns may be formed on a semiconductor substrate by performing a developing process and an etching process. A photomask that specifically uses an arrangement including the hole layout to be formed need not be used.

Referring to FIG. 2A, the first line patterns L1 extending in the first direction, the first space patterns S1 extending in the first direction, the second line patterns L2 extending in the second direction, and the second space patterns S2 extending in the second direction may each be spaced apart from each other by a first distance, such as 2F. However, the first and second hole patterns $1^{ST}$ HOLE and $2^{ND}$ HOLE formed accordingly are spaced apart from each other by a second distance, such as 1F, which may is smaller than 2F (e.g., in one embodiment, half of 2F). Accordingly, a minute, tightly compact hole pattern may be formed while obtaining an acceptable process margin.

Figure 19:
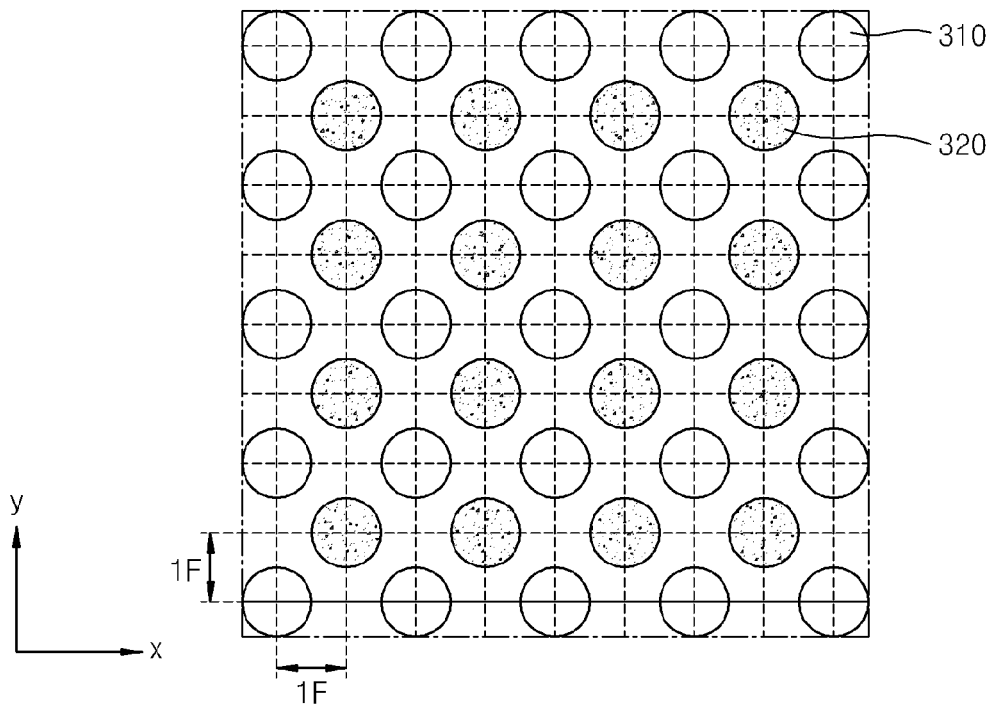
FIG. 19 is a plan view for describing forming a hole pattern on a semiconductor substrate by using a layout including a hole pattern, according to one exemplary embodiment.

In FIG. 19, it is assumed that a plurality of the hole patterns are formed by manufacturing a photomask by using a layout including the hole pattern and performing a developing process and an etching process.

FIG. 19 is a plan view for describing forming a hole pattern on a semiconductor substrate by using a layout including a hole pattern, according to one exemplary embodiment.

Referring to FIG. 19, when a hole pattern is formed by using a layout on which a pattern 320 corresponding to a first hole pattern and a pattern 310 corresponding to a second hole pattern are simultaneously disposed, a distance between the plurality of hole patterns is 1F. Accordingly, it is not convenient to form a hole pattern as a process margin is small.

Figure 20A:
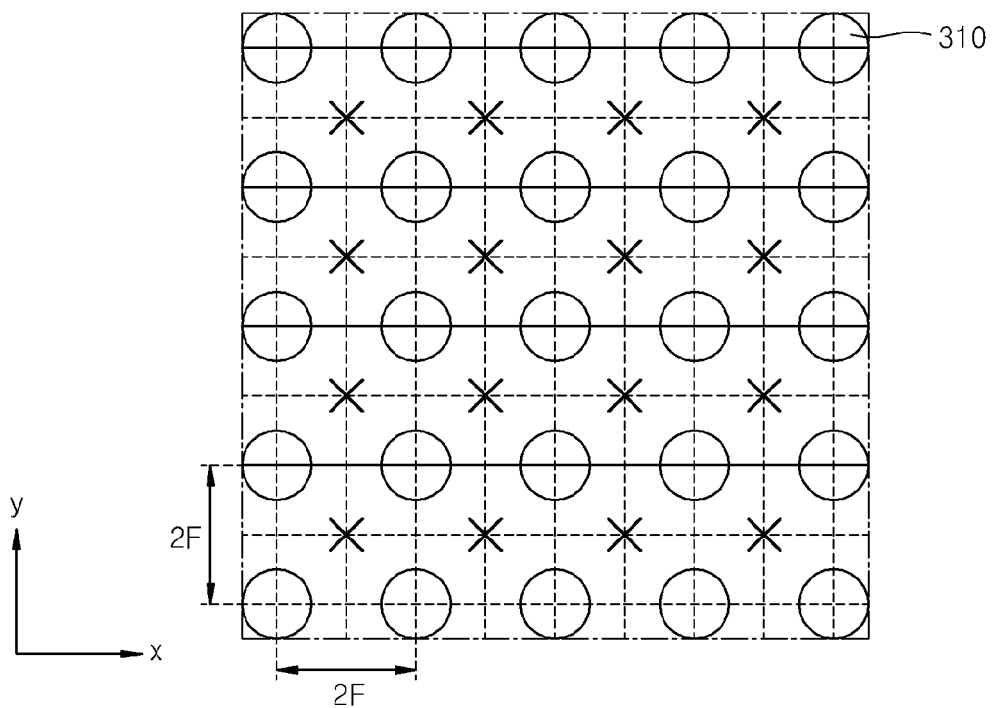
FIGS. 20A and 20B are plan views for describing forming a hole pattern on a semiconductor substrate by using a layout including a hole pattern, according to another exemplary embodiment.
Figure 20B:
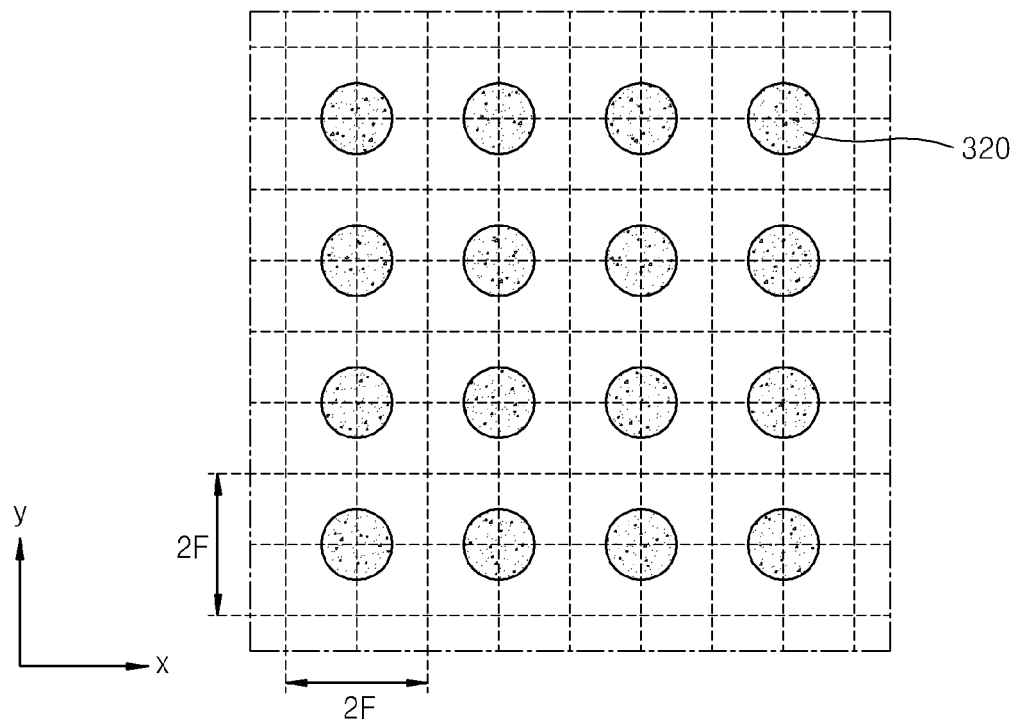

FIGS. 20A and 20B are plan views for describing forming a hole pattern on a semiconductor substrate by using a layout including a hole pattern, according to another exemplary embodiment.

In FIG. 20A, a hole pattern is formed on a semiconductor substrate by using a layout including the pattern 310 corresponding to the second hole pattern, and in FIG. 20B, a hole pattern is formed on a semiconductor substrate by using a layout including the pattern 320 corresponding to the first hole pattern.

First, when the hole pattern is formed by using the layout shown in FIG. 20A, the pattern 310 forms the second hole pattern according to the semiconductor substrate. Subsequently, when the hole pattern is formed by using the layout shown in FIG. 20B, the pattern 320 forms the first hole pattern according to the semiconductor substrate.

Here, patterns corresponding to the hole patterns that are spaced apart from each other in each layout are spaced apart from each other by 2F, but the hole patterns formed on the semiconductor substrate are spaced apart from each other by 1F, and thus, a process margin is improved.

However, since the pattern 320 of FIG. 20B needs to be accurately placed on a certain part indicated by x on the layout of FIG. 20A, an accurate alignment is required, which may be difficult to obtain.

Consequently, referring to FIGS. 19, 20A, and 20B, a more stable and improved process margin may be obtained when a plurality of hole patterns are formed by using a layout including a line pattern and a space pattern, for example, according to the above-described exemplary embodiment, compared to when a plurality of hole patterns are formed by manufacturing a photomask by using a layout including a hole pattern and performing a developing process and an etching process. Therefore, according to one embodiment, a plurality of hole patterns having a minute pitch may be formed by using a layout including line and space patterns having a relatively large pitch, without having to use a layout of hole patterns having a minute pitch.

Figure 21:
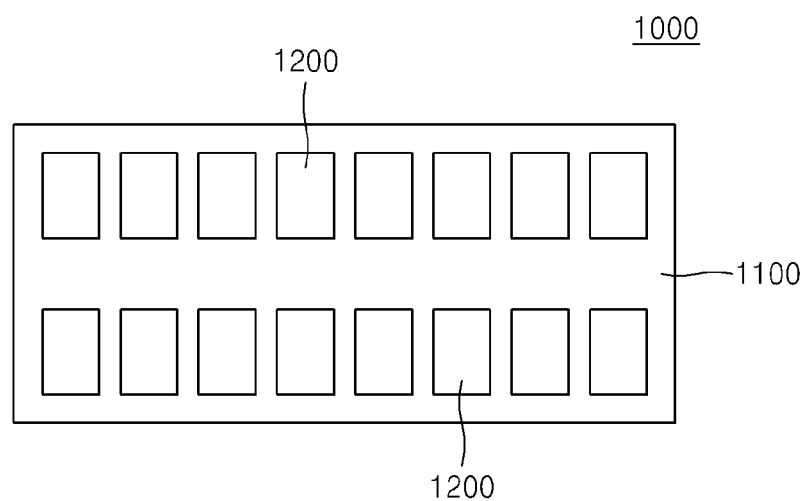
FIG. 21 is a schematic plan view of a memory module including a semiconductor device manufactured according to one exemplary embodiment.

FIG. 21 is a schematic plan view of a memory module 1000 including a semiconductor device manufactured according to one exemplary embodiment.

The memory module 1000 may include a printed circuit board 1100 and a plurality of semiconductor packages 1200.

The semiconductor packages 1200 may include a semiconductor device manufactured by using the method according to one of the above embodiments.

The memory module 1000 may be, for example, a single in-lined memory module (SIMM) on which the semiconductor packages 1200 are installed only on one surface of the printed circuit board 1100, or a dual in-lined memory module DIMM on which the semiconductor packages 1200 are installed on both surfaces of the printed circuit board 1100. In one embodiment, one or more chips or stacks of chips that are part of the semiconductor package 1200 may comprise a semiconductor device formed using the methods described herein. Alternatively, the memory module 1000 may be a fully buffered DIMM (FBDIMM) including an advanced memory buffer (AMB) that provides external signals respectively to the semiconductor packages 1200.

Figure 22:
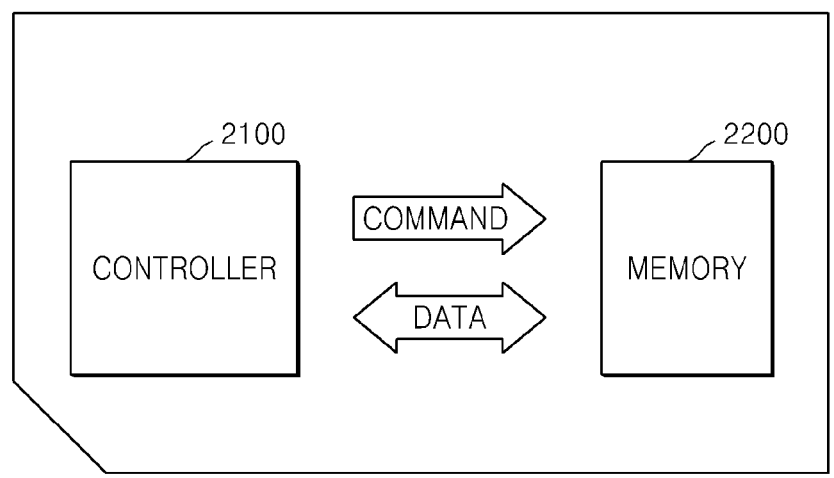
FIG. 22 is a schematic view of a memory card including a semiconductor device manufactured according to one exemplary embodiment.

FIG. 22 is a schematic view of a memory card 2000 including a semiconductor device manufactured according to one exemplary embodiment.

The memory card 2000 may include a controller 2100 and a memory 2200, which exchange electric signals. For example, when the controller 2100 transmits a command, the memory 2200 transmits data.

The memory 2200 may include the semiconductor device manufactured by using the method according to one of the above embodiments.

The memory card 2000 may be one of various memory cards, such as a memory stick card, a smart media (SM) card, a secure digital (SD) card, a mini SD card, and a multimedia card (MMC).

Figure 23:
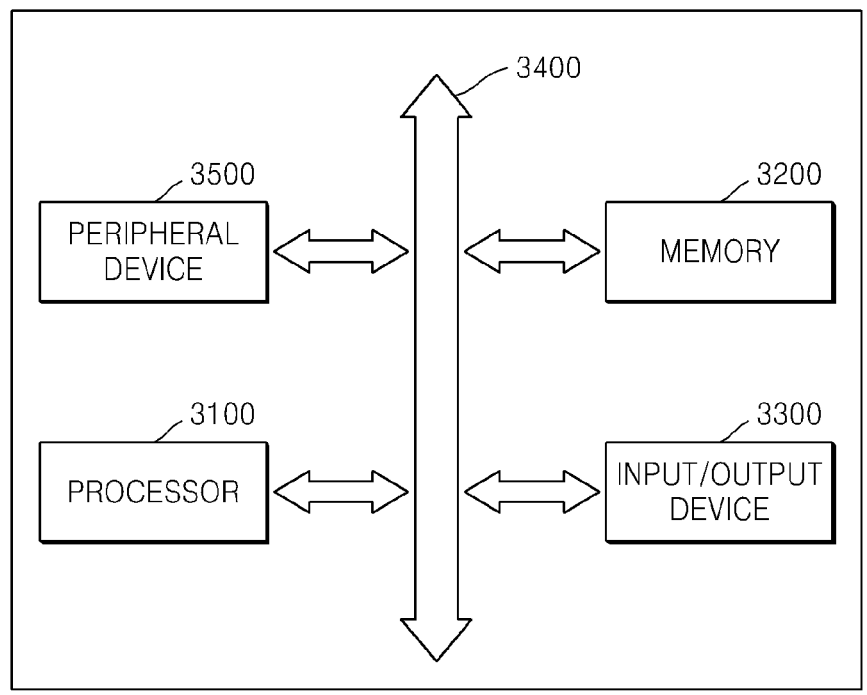
FIG. 23 is a schematic view of a system including a semiconductor device manufactured according to one exemplary embodiment.

FIG. 23 is a schematic view of a system 3000 including a semiconductor device manufactured according to one exemplary embodiment.

In the system 3000, a processor 3100, a memory 3200, and an input/output device 3300 may transmit and receive data via a bus 3400.

The memory 3200 of the system 3000 may include a random access memory (RAM) or a read only memory (ROM). Also, the system 3000 may include a peripheral device 3500, such as a floppy disk drive and a compact disk (CD) ROM drive.

The memory 3200 may include the semiconductor device manufactured by using the method of any one of the above embodiments.

The memory 3200 may store codes and data for operating the processor 3100.

The system 3000 may be used for a mobile phone, an MP3 player, a navigation device, a portable multimedia player (PMP), a solid state disk (SSD), or household appliances.

While the present disclosure has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
   forming a plurality of first line patterns and a plurality of first space patterns extending in a first direction;
   forming a plurality of second line patterns and a plurality of second space patterns extending in a second direction, on the plurality of first line patterns and the plurality of first space patterns;
   forming a plurality of first hole patterns where the plurality of first space patterns and the plurality of second space patterns cross each other; and
   forming a plurality of second hole patterns where the plurality of first line patterns and the plurality of second line patterns cross each other.

2. The method of claim 1, wherein the first and second directions are not parallel to each other.

3. The method of claim 1, wherein the first and second directions are perpendicular to each other.

4. The method of claim 1, wherein the plurality of first line patterns and the plurality of first space patterns are alternately disposed and each line pattern of the plurality of first line patterns is immediately adjacent to a space pattern of the plurality of first space patterns, and
   the plurality of first line patterns and the plurality of first space patterns are connected as continuous steps, wherein the plurality of first line patterns are higher than the plurality of first space patterns.

5. The method of claim 1, wherein the plurality of second line patterns and the plurality of second space patterns are alternately disposed and each line pattern of the plurality of second line patterns is immediately adjacent to a space pattern of the plurality of second space patterns, and
   the plurality of second line patterns and the plurality of second space patterns are connected as continuous steps, wherein the plurality of second line patterns are higher than the plurality of second space patterns.

6. The method of claim 1, wherein the forming of the plurality of first line patterns and the plurality of first space patterns comprises:

sequentially stacking a first material layer, a second material layer having a different etching rate from the first material layer, a third material layer having a different etching rate from the second material layer, a fourth material layer having a different etching rate from the third material layer, and a fifth material layer having a different etching rate from the fourth material layer;

forming a pattern of the fifth material layer by removing portions corresponding to the plurality of first space patterns from the fifth material layer; and forming a pattern of the fourth material layer by removing part of thickness of the fourth material layer that is exposed by the pattern of the fifth material layer.

7. The method of claim 6, wherein the forming of the plurality of second line patterns and the plurality of second space patterns comprises:

forming a sixth material layer that fills all of the plurality of first space patterns, covers all of the plurality of first line patterns, and has a different etching rate from the fifth material layer;

forming a seventh material layer having a different etching rate from the sixth material layer on the sixth material layer;

forming a pattern of the seventh material layer by removing portions corresponding to the plurality of second space patterns from the seventh material layer; and forming a pattern of the sixth material layer by removing the sixth material layer that is exposed by the pattern of the seventh material layer.

8. The method of claim 7, wherein the forming of the pattern of the sixth material layer comprises forming a second pattern of the fourth material layer by removing portions exposed by the pattern of the fifth material layer from the pattern of the fourth material layer.

9. The method of claim 8, wherein the forming of the plurality of first hole patterns comprises:

forming a second pattern of the fifth material layer by removing portions corresponding to the plurality of second space patterns from the pattern of the fifth material layer;

forming a pattern of the third material layer by removing the third material layer that is exposed by the second pattern of the fourth material layer; and forming a third pattern of the fourth material layer by removing the second pattern of the fourth material layer exposed by the second pattern of the fifth material layer.

10. The method of claim 9, wherein the forming of the plurality of second hole patterns comprises:

filling a pattern of an eighth material layer in portions corresponding to the plurality of first and second space patterns;

removing the second pattern of the fifth material layer;

removing the third pattern of the fourth material layer; and forming a second pattern of the third material layer by removing the pattern of the third material layer exposed by the pattern of the eighth material layer.

11. The method of claim 10, further comprising forming a pattern of the second material layer by removing the second material layer exposed by the second pattern of the third material layer.

12. The method of claim 9, wherein the forming of the plurality of second hole patterns comprises:

forming a third pattern of the third material layer by removing part of a thickness of the pattern of the third material layer exposed by the third pattern of the fourth material layer;

removing the third pattern of the fourth material layer;

covering the second material layer and the third pattern of the third material layer with a ninth material layer, and forming a pattern of the ninth material layer by planarizing the ninth material layer until an upper surface of the third pattern of the third material layer is exposed; and forming a fourth pattern of the third material layer by removing the third pattern of the third material layer exposed by the pattern of the ninth material layer.

13. The method of claim 12, further comprising forming a second pattern of the second material layer by removing the second material layer exposed by the fourth pattern of the third material layer.

14. The method of claim 6, wherein the second material layer comprises polysilicon, a third material layer comprises silicon oxide (SiO2), the fourth material layer comprises an amorphous carbon layer (ACL), and the fifth material layer comprises silicon oxynitride (SiON).

15. The method of claim 1, wherein:

each first line pattern of the plurality of first line patterns is spaced a distance of D from the next adjacent first line pattern;

each second line pattern of the plurality of second line patterns is spaced a distance of D from the next adjacent second line pattern; and a center of each hole is spaced a distance less than D away from a center of the closest adjacent hole.

16. A method of manufacturing a semiconductor device, the method comprising:

sequentially forming a first hard mask layer, a second hard mask layer, and a sacrificial layer;

forming a plurality of first space patterns that extend in a first direction on the sacrificial layer, and are repeatedly disposed separately spaced apart from each other;

forming a plurality of second space patterns that extend in a second direction on the plurality of first space patterns, and are repeatedly disposed separately spaced apart from each other, wherein the second direction is not parallel to the first direction;

forming a plurality of first hole patterns penetrating through the second hard mask layer and the first hard mask layer, corresponding to portions where the plurality of first space patterns and the plurality of second space patterns cross each other; and forming a plurality of second hole patterns penetrating through the second hard mask layer and the first hard mask layer, corresponding to portions where none of the plurality of first space patterns and the plurality of second space patterns are disposed.

17. A method of manufacturing a semiconductor device, the method comprising:

forming a plurality of material layers;

forming a first space pattern in a first layer of the material layers, the first space pattern including a plurality of consecutive spaces, each space extending in first direction;

forming a second space pattern in a second layer of the material layers, the second space pattern including a plurality of consecutive spaces, each space extending in second direction different from the first direction;

forming a first plurality of holes in at least a third layer of the plurality of material layers at locations where spaces of the first space pattern cross spaces of the second space pattern; and forming a second plurality of holes in at least the third layer at locations where areas between spaces of the first space pattern cross areas between spaces of the second space pattern.

18. The method of claim 17, further comprising:

using a first mask pattern to form the first space pattern and to form a first line pattern, wherein lines of the first line pattern occupy areas between spaces of the first space pattern; and using a second mask pattern to form the second space pattern and to form a second line pattern, wherein lines of the second line pattern occupy areas between spaces of the second space pattern.

19. The method of claim 17, further comprising:

filling the first plurality of holes and second plurality of holes with a conductive material.

20. The method of claim 17, wherein:

each hole of the first plurality of holes is in closer proximity to a nearest hole of the second plurality of holes than it is to a next space adjacent to the space to which its location coincides.

* * * * *